(12) United States Patent
Kurokawa

(10) Patent No.: US 9,761,730 B2
(45) Date of Patent: Sep. 12, 2017

(54) IMAGING DEVICE AND ELECTRONIC DEVICE

(71) Applicant: Semiconductor Energy Laboratory Co., Ltd., Kanagawa-ken (JP)

(72) Inventor: Yoshiyuki Kurokawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/925,399

(22) Filed: Oct. 28, 2015

(65) Prior Publication Data

US 2016/0126275 A1    May 5, 2016

(30) Foreign Application Priority Data

Oct. 29, 2014 (JP) ................. 2014-219832

(51) Int. Cl.
*H01L 29/10* (2006.01)
*H01L 29/786* (2006.01)
*H01L 27/146* (2006.01)

(52) U.S. Cl.
CPC .... *H01L 29/78654* (2013.01); *H01L 27/1464* (2013.01); *H01L 27/14625* (2013.01); *H01L 27/14632* (2013.01); *H01L 27/14641* (2013.01); *H01L 27/14643* (2013.01); *H01L 27/14669* (2013.01); *H01L 29/7869* (2013.01); *H01L 29/78666* (2013.01); *H01L 29/78675* (2013.01)

(58) Field of Classification Search
CPC ........... H01L 27/1464; H01L 27/14641; H01L 27/14632; H01L 27/14669

USPC ......................................... 257/43
See application file for complete search history.

(56) References Cited

U.S. PATENT DOCUMENTS

| | | | |
|---|---|---|---|
| 7,038,184 B2 * | 5/2006 | Chang | H01L 27/14621 250/208.1 |
| 7,674,650 B2 | 3/2010 | Akimoto et al. | |
| 7,732,819 B2 | 6/2010 | Akimoto et al. | |
| 8,378,391 B2 | 2/2013 | Koyama et al. | |
| 8,586,905 B2 | 11/2013 | Kurokawa | |
| 8,872,120 B2 | 10/2014 | Kurokawa et al. | |
| 9,110,240 B2 | 8/2015 | Gill et al. | |
| 9,236,408 B2 | 1/2016 | Yamazaki | |
| 9,473,714 B2 | 10/2016 | Aoki et al. | |
| 9,575,381 B2 | 2/2017 | Kurokawa et al. | |
| 2010/0118172 A1 | 5/2010 | McCarten et al. | |
| 2011/0085051 A1 | 4/2011 | Chi et al. | |
| 2013/0113964 A1* | 5/2013 | Sasaki | H01L 27/14629 348/276 |
| 2013/0285046 A1 | 10/2013 | Yamazaki | |
| 2014/0253781 A1 | 9/2014 | Gill et al. | |

FOREIGN PATENT DOCUMENTS

| | | |
|---|---|---|
| JP | 2007-96055 | 4/2007 |
| JP | 2007-123861 A | 5/2007 |
| JP | 2011-119711 A | 6/2011 |

(Continued)

*Primary Examiner* — Anthony Ho
(74) *Attorney, Agent, or Firm* — Husch Blackwell LLP

(57) ABSTRACT

An imaging device that does not need a lens is provided. The imaging device includes a first layer, a second layer, and a third layer. The second layer is positioned between the first layer and the third layer. The first layer includes a diffraction grating. The second layer includes a photoelectric conversion element. The third layer includes a transistor including an oxide semiconductor in an active layer.

23 Claims, 49 Drawing Sheets

(56) References Cited

FOREIGN PATENT DOCUMENTS

| JP | 2013-243355 A | 12/2013 |
|----|---------------|---------|
| WO | WO 2016/012911 A1 | 1/2016 |

* cited by examiner

FIG. 20A1
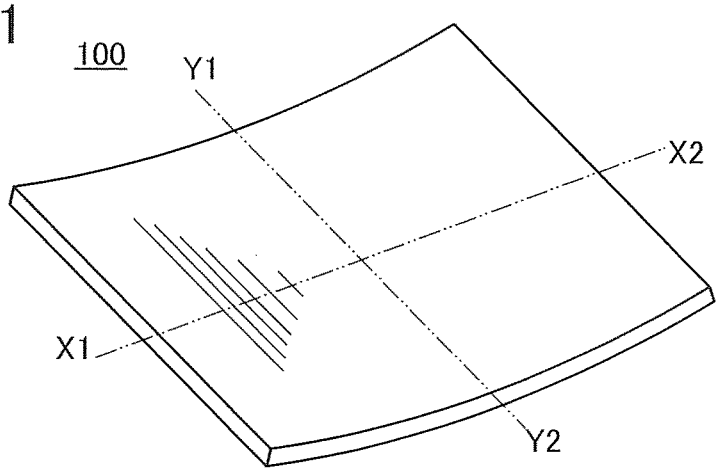
FIG. 20A2
FIG. 20A3
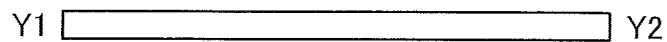
FIG. 20B1
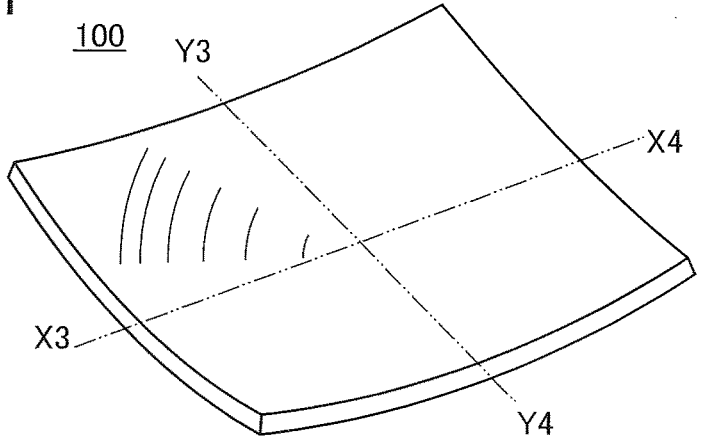
FIG. 20B2
FIG. 20B3
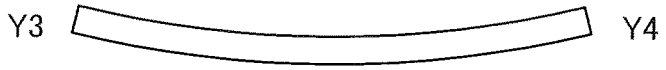

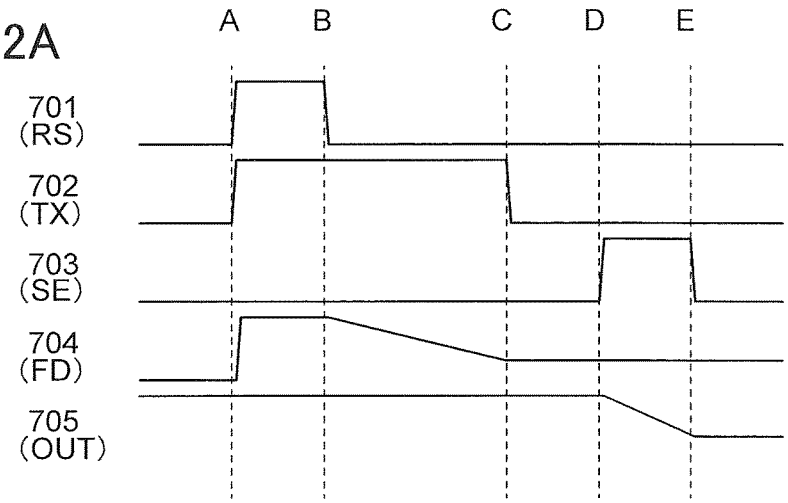
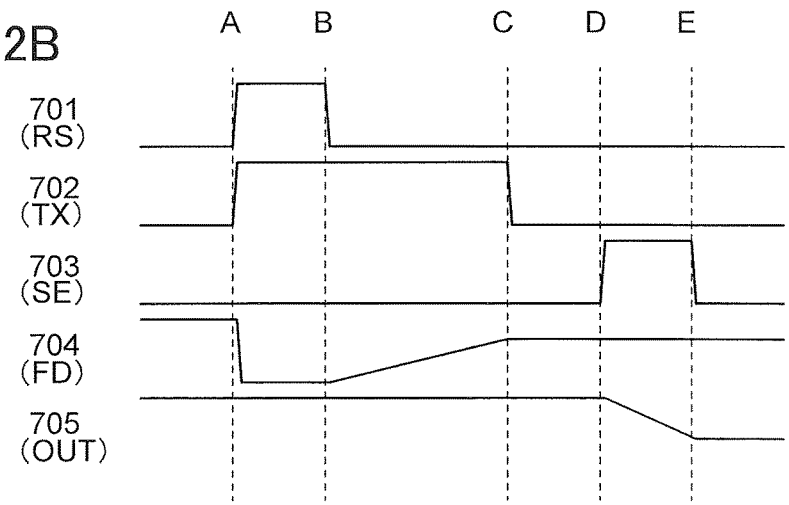
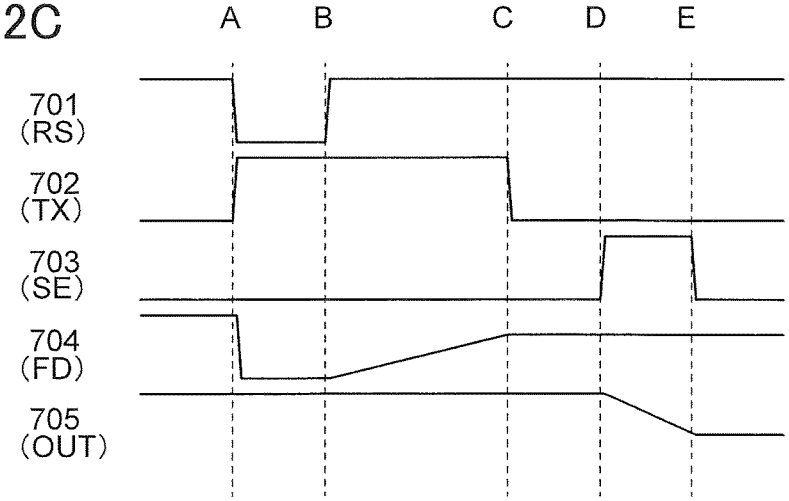

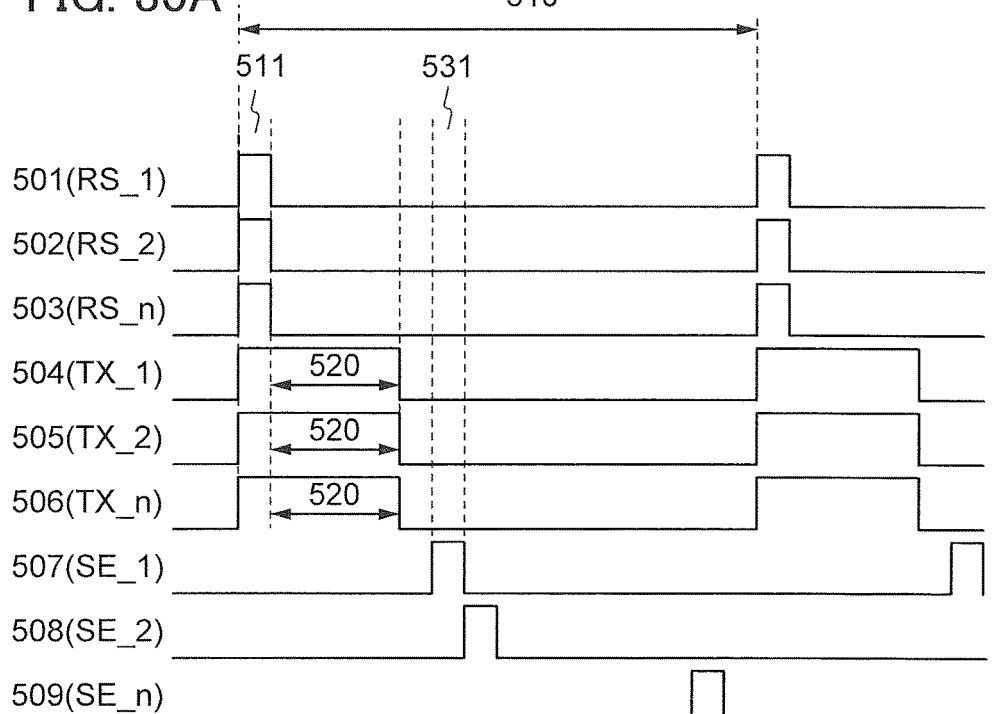
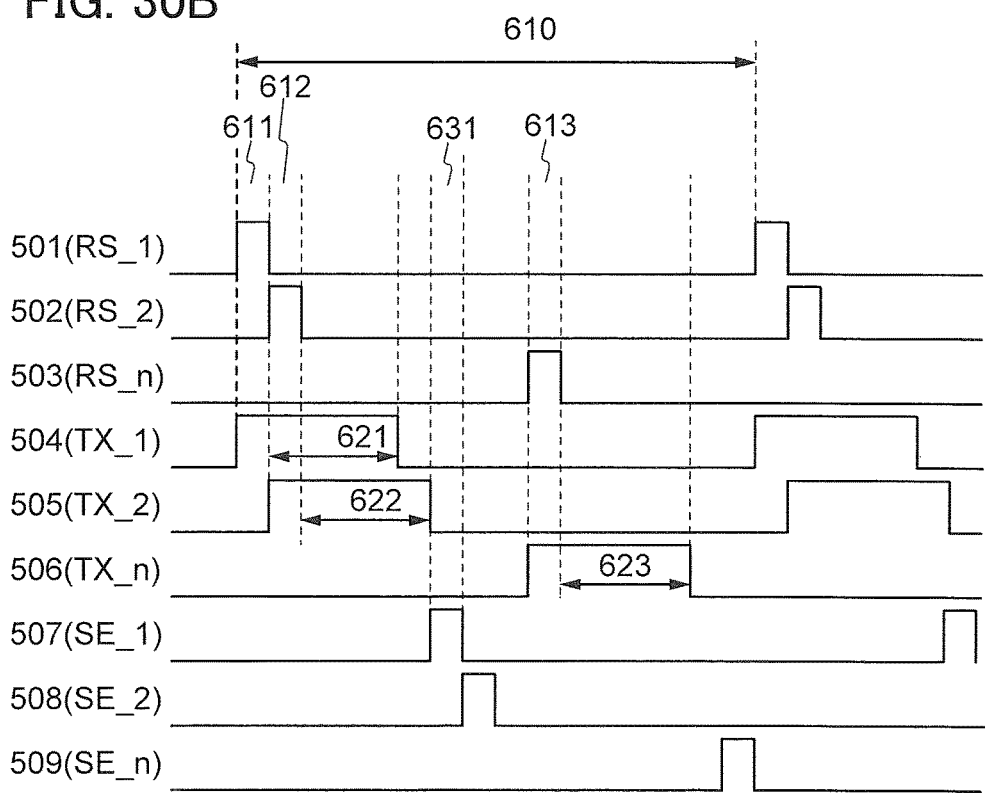

B1 — B2
120  173  101

C1 — C2
120  173  102

D1 — D2
120  173  103

E1 — E2
120  173  104

F1 — F2
120  173  105

G1 — G2
120  173  106

IMAGING DEVICE AND ELECTRONIC DEVICE

BACKGROUND OF THE INVENTION

1. Field of the Invention

One embodiment of the present invention relates to an imaging device including an oxide semiconductor.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, an imaging device, or an electronic device includes a semiconductor device.

2. Description of the Related Art

A technique by which transistors are formed using semiconductor thin films formed over a substrate having an insulating surface has attracted attention. The transistor is used in a wide range of electronic devices such as an integrated circuit (IC) and a display device. A silicon-based semiconductor is widely known as a semiconductor material applicable to the transistor. As another material, an oxide semiconductor has attracted attention.

For example, a technique for forming a transistor using zinc oxide or an In—Ga—Zn—based oxide semiconductor as an oxide semiconductor is disclosed (see Patent Documents 1 and 2).

Patent Document 3 discloses an imaging device in which a transistor including an oxide semiconductor and having extremely low off-state current is used in part of a pixel circuit and a transistor including silicon with which a complementary metal oxide semiconductor (CMOS) circuit can be formed is used in a peripheral circuit.

Patent Document 4 discloses an imaging device in which a transistor including silicon, a transistor including an oxide semiconductor, and a photodiode including a crystalline silicon layer are stacked.

Patent Document 5 discloses an imaging device in which a diffraction grating is used instead of a lens.

REFERENCE

Patent Document 1: Japanese Published Patent Application No. 2007-123861
Patent Document 2: Japanese Published Patent Application No. 2007-096055
Patent Document 3: Japanese Published Patent Application No. 2011-119711
Patent Document 4: Japanese Published Patent Application No. 2013-243355
Patent Document 5: United States Published Patent Application No. 2014/0253781

SUMMARY OF THE INVENTION

An imaging device obtains image data when light enters a chip with integrated pixels and the light is converted into a signal. Here, the light generally enters the chip through a lens. The lens is a telephoto lens, a wide-angle lens, a zoom lens, or a bright lens with a small F-number (focal length/effective aperture), depending on the specification of an electronic device (e.g., a camera).

Lens components make up a significant proportion of manufacturing costs of electronic devices, camera modules, and the like. Removal of lenses from electronic devices or camera modules leads to manufacture of these devices at lower costs. For example, technology disclosed in Patent Document 5 is one aspect of a lensless imaging device.

An object of one embodiment of the present invention is to provide an imaging device that does not need a lens outside a chip. Another object of one embodiment of the present invention is to provide an imaging device that is suitable for high-speed operation. Another object of one embodiment of the present invention is to provide an imaging device with high resolution. Another object of one embodiment of the present invention is to provide a highly integrated imaging device. Another object of one embodiment of the present invention is to provide a low-power imaging device. Another object of one embodiment of the present invention is to provide an imaging device capable of imaging under a low illuminance condition. Another object of one embodiment of the present invention is to provide an imaging device with a wide dynamic range. Another object of one embodiment of the present invention is to provide an imaging device that can be used in a wide temperature range. Another object of one embodiment of the present invention is to provide an imaging device with a high aperture ratio. Another object of one embodiment of the present invention is to provide an imaging device with high reliability. Another object of one embodiment of the present invention is to provide a novel imaging device or the like. Another object of one embodiment of the present invention is to provide a novel semiconductor device or the like.

The description of these objects does not disturb the existence of other objects. In one embodiment of the present invention, there is no need to achieve all the objects. Other objects will be apparent from and can be derived from the description of the specification, the drawings, the claims, and the like. Other objects will be apparent from and can be derived from the description of the specification, the drawings, the claims, and the like.

One embodiment of the present invention relates to an imaging device including a transistor formed using an oxide semiconductor.

One embodiment of the present invention is an imaging device that includes a first layer, a second layer, and a third layer. The second layer is positioned between the first layer and the third layer. The first layer includes a diffraction grating. The second layer includes a photoelectric conversion element. The third layer includes a transistor including an oxide semiconductor in an active layer.

Another embodiment of the present invention is an imaging device that includes a first layer, a second layer, a third layer, and a fourth layer. The first layer, the second layer, the third layer, and the fourth layer are stacked in that order. The first layer includes a diffraction grating. The second layer includes a photoelectric conversion element. The third layer includes a transistor including an oxide semiconductor in an active layer. The fourth layer includes a transistor including silicon in an active region or an active layer.

The third layer can include a first transistor, a second transistor, a third transistor, and a fourth transistor. One of a source electrode and a drain electrode of the first transistor can be electrically connected to one electrode of the photoelectric conversion element. The other of the source electrode and the drain electrode of the first transistor can be electrically connected to a gate electrode of the second transistor. The other of the source electrode and the drain electrode of the first transistor can be electrically connected to one of a source electrode and a drain electrode of the third transistor. One of a source electrode and a drain electrode of the second transistor can be electrically connected to one of a source electrode and a drain electrode of the fourth transistor.

Alternatively, the other of the source electrode and the drain electrode of the first transistor can be electrically connected to one electrode of the capacitor.

The oxide semiconductor preferably includes In, Zn, and M (M is Al, Ti, Ga, Sn, Y, Zr, La, Ce, Nd, or Hf).

The photoelectric conversion element can contain selenium or a compound containing selenium in a photoelectric conversion layer.

According to one embodiment of the present invention, an imaging device that does not need a lens outside a chip can be provided. An imaging device that is suitable for high-speed operation can be provided. An imaging device with high resolution can be provided. A highly integrated imaging device can be provided. A low-power imaging device can be provided. An imaging device capable of imaging under a low illuminance condition can be provided. An imaging device with a wide dynamic range can be provided. An imaging device that can be used in a wide temperature range can be provided. An imaging device with a high aperture ratio can be provided. An imaging device with high reliability can be provided. A novel imaging device or the like can be provided. A novel semiconductor device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

In the accompanying drawings:

FIGS. 20A1, 20A2, 20A3, 20B1, 20B2, and 20B3 illustrate a bent imaging device;

FIGS. 22A to 22C are timing charts each illustrating the operation of a pixel circuit;

FIGS. 30A and 30B are timing charts illustrating operations of a global shutter system and a rolling shutter system, respectively;

DETAILED DESCRIPTION OF THE INVENTION

Figure 1A:
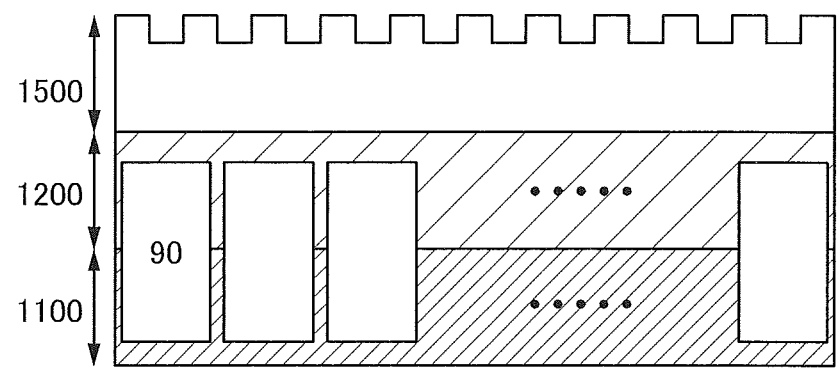
FIGS. 1A and 1B are a cross-sectional view and a top view illustrating an imaging device.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. In structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, each of X and Y denotes an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected."

For example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are connected in that order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Still another example of the expressions is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, the term "electrical connection" in this specification also means such a case where one conductive film has functions of a plurality of components.

Note that the terms "film" and "layer" can be interchanged with each other depending on circumstances or conditions. For example, the term "conductive layer" can be changed into the term "conductive film" in some cases. In addition, the term "insulating film" can be changed into the term "insulating layer" in some cases.

Embodiment 1

In this embodiment, an imaging device that is one embodiment of the present invention is described with reference to drawings.

FIG. 1A is a cross-sectional schematic view of an imaging device in one embodiment of the present invention. The imaging device includes a layer 1100, a layer 1200, and a layer 1500. The layer 1200 is provided between the layer 1100 and the layer 1500.

The layer 1100 includes a transistor, and the layer 1200 includes a photoelectric conversion element. Here, a circuit 90 is formed using the transistor and the photoelectric conversion element. The circuit 90 can function as a pixel circuit. In addition, as illustrated in a top view of FIG. 1B, the circuits 90 are arranged in a matrix to form a pixel array 91. Extraction of signals from the circuits 90 can form image data. Note that FIG. 1B does not illustrate the layer 1500 for clarity.

The layer 1500 has a light-transmitting property and includes a plurality of grooves or protrusions on a side opposite to the layer 1200 side. The layer 1500 can function as a diffraction grating owing to a region where the grooves or protrusions are provided.

In the imaging device in one embodiment of the present invention, an image of an object through a diffraction grating (i.e., a diffraction pattern) is scanned into a pixel, and an input image (an object image) is formed from a captured image in the pixel by arithmetic processing. Here, in the arithmetic processing, the diffraction grating converts the input image into the diffraction pattern.

In the case where the input image is defined as a set of an infinite number of point light sources, light emitted from the point light sources is diffracted through the diffraction grating. After the diffracted light is detected in each pixel of the imaging device, what pattern is generated in the pixel array 91 is calculated by ray tracing, electromagnetic field simulation, or the like.

Thus, it is possible to obtain a coefficient that makes data obtained by the pixel in the imaging device correspond to the intensity of light emitted from the point light source. By calculating the coefficients in all the pixels, a coefficient for converting the input image into the diffraction pattern by the diffraction grating can be formed.

In addition, the input image can be defined as an input image obtained by weighting light intensity of a plurality of point light sources. Thus, the captured image in the imaging device can be calculated by matrix operation of a vector having a weight coefficient corresponding to the input image and a matrix having a variable coefficient. In other words, a vector that corresponds to the input image is obtained by matrix operation of a vector having data of the captured image in each pixel in the imaging device as a component and an inverse matrix of the matrix.

In the imaging device, diffracted light from the diffraction grating is detected in the pixel; thus, even when a point light source is used as an input image, arithmetic processing using data of all the pixels in the imaging device is needed. In other words, when the point light source moves in imaging, the pattern of diffracted light from the diffraction grating is totally changed. Consequently, an image obtained by arithmetic processing of an image obtained by combination of some of images captured before and after movement is totally different from the input image.

Figure 1B:
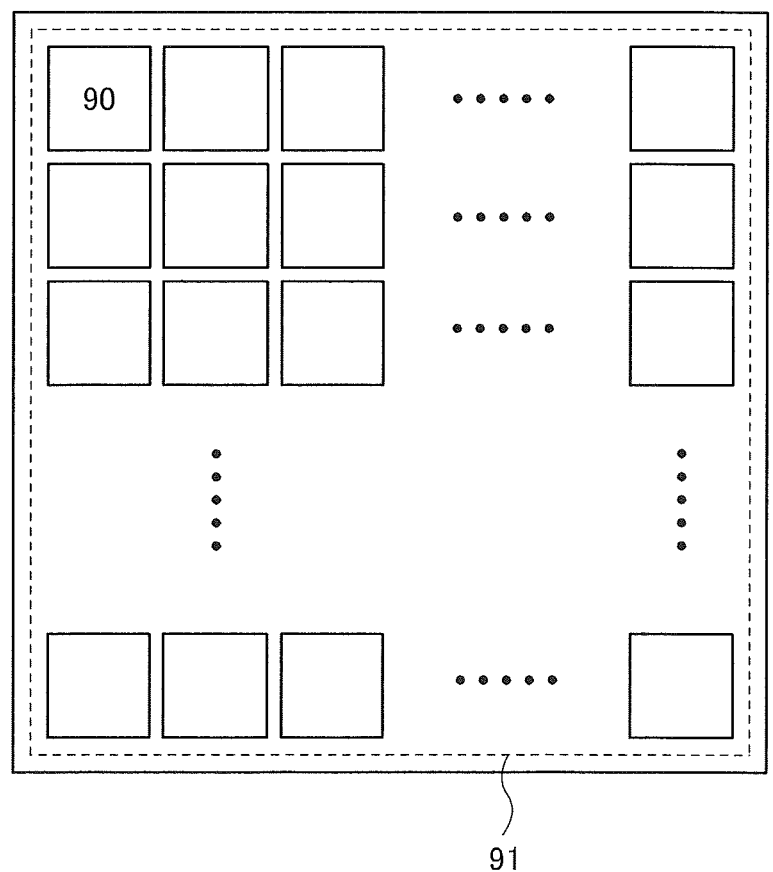
Figure 2A:
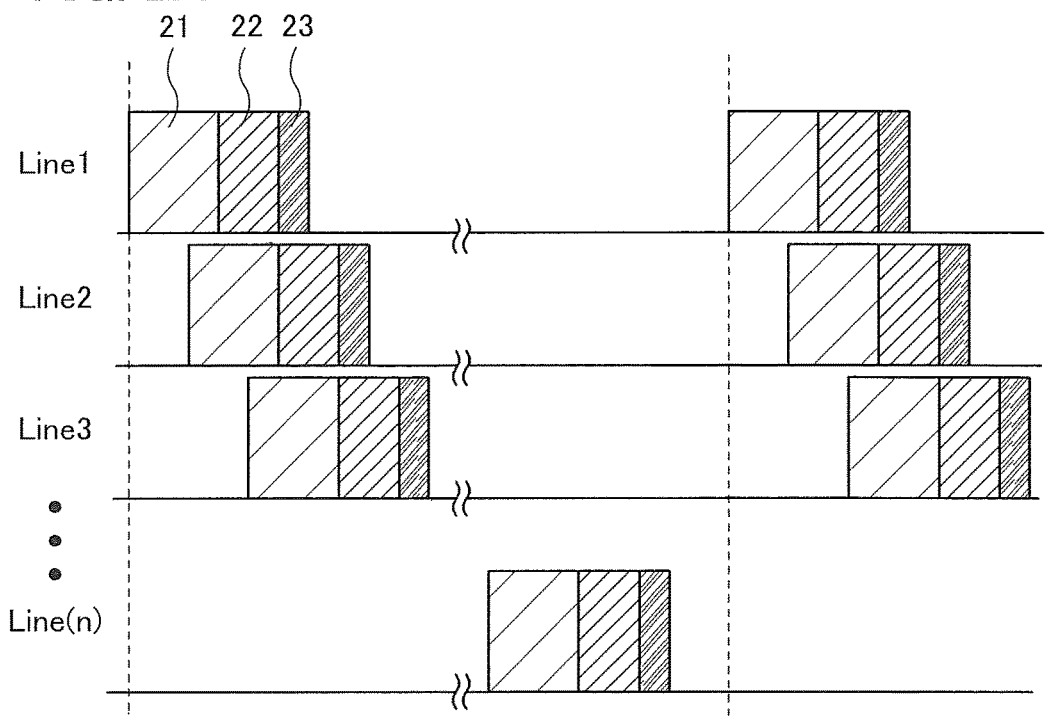
FIGS. 2A and 2B are timing charts illustrating operations of a global shutter system and a rolling shutter system, respectively.

In general, in an imaging device where pixels are arranged in a matrix as illustrated in the top view of FIG. 1B, a rolling shutter system is employed, in which imaging operation 21, retention operation 22, and read operation 23 are performed row by row as illustrated in FIG. 2A. In the case of employing the rolling shutter system, simultaneousness of imaging is lost. Therefore, when an object moves, it is difficult to form an input image by arithmetic processing.

Figure 2B:
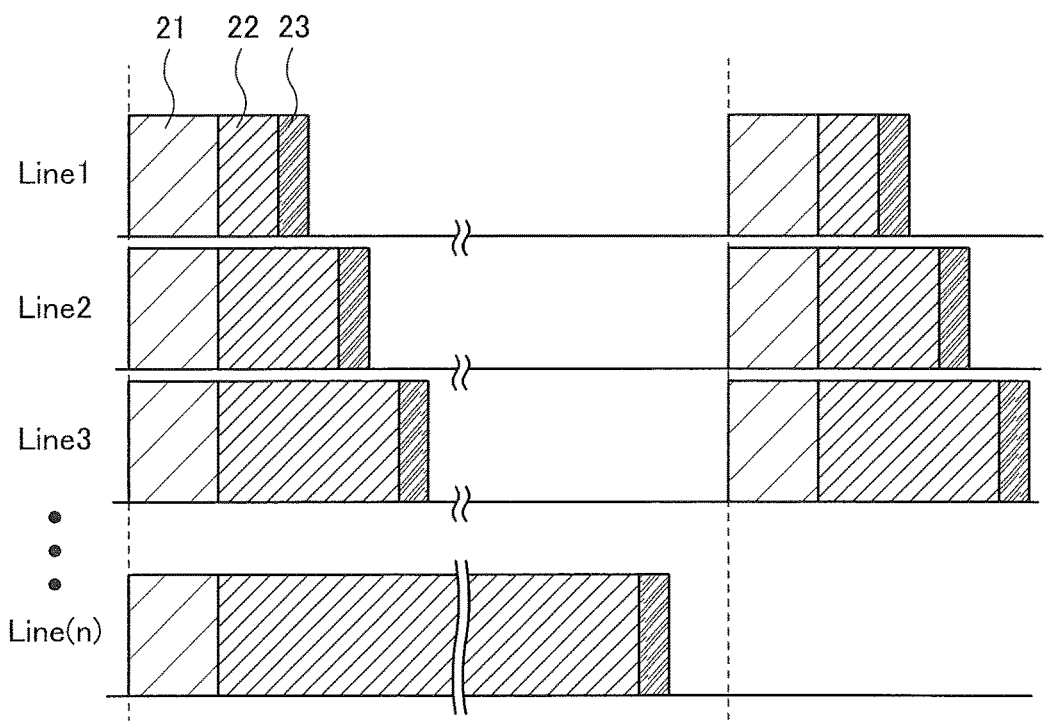

As a result, in one embodiment of the present invention, the imaging device using the diffraction grating employs a global shutter system in which the imaging operation 21 and the retention operation 22 are performed simultaneously in all the rows and the read operation 23 is performed row by row as illustrated in FIG. 2B. By employing the global shutter system, simultaneousness of imaging in all the pixels in the imaging device can be secured, and a high-quality input image can be formed from a captured image even when an object moves.

Figure 3A:
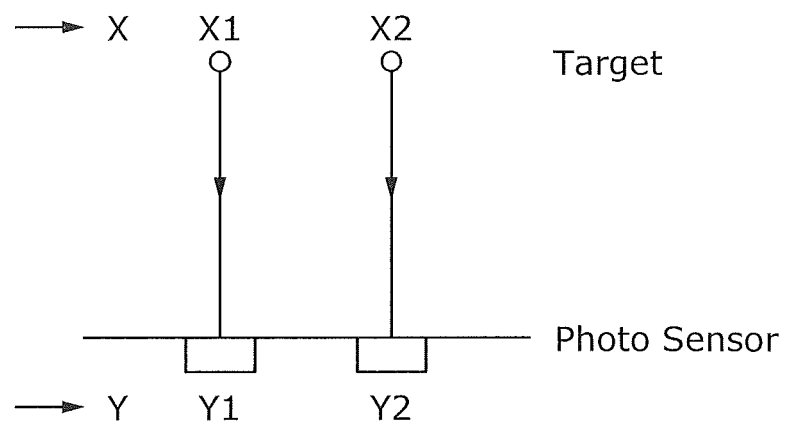
FIGS. 3A and 3B each illustrate an imaging method.

Here, imaging when an object moves is described with reference to FIGS. 3A and 3B. It is assumed that at times T1 and T2, the position of an object (Target) that is a point light source moves to X1 and X2. For simplicity, pixels of the imaging device are denoted by Y1 and Y2. In FIG. 3A, the imaging device includes a lens. Note that light from the object enters the imaging device through the lens. Furthermore, for simplicity, it is assumed that when the object is positioned at X1 or X2, light mainly enters the pixel Y1 or Y2.

Vectors corresponding to input images at the times T1 and T2 are $'(1,0)$ and $'(0,1)$, and vectors corresponding to light entering the imaging device are also $'(1,0)$ and $'(0,1)$. In the case where the imaging device is driven using a global shutter system, a vector corresponding to a captured image is $'(1,0)$ when imaging operation is performed simultaneously in all the rows at the time T1. This means that the object can be captured without distortion at the time T1.

On the other hand, in the case where the imaging device is driven using a rolling shutter system, when imaging operation is sequentially performed in the row of the pixel Y1 at the time T1 and in the row of the pixel Y2 at the time T2, a vector corresponding to a captured image is $'(1,1)$. This corresponds to an image in which images of the object at the times T1 and T2 are mixed uniformly, i.e., a distorted captured image.

Figure 3B:
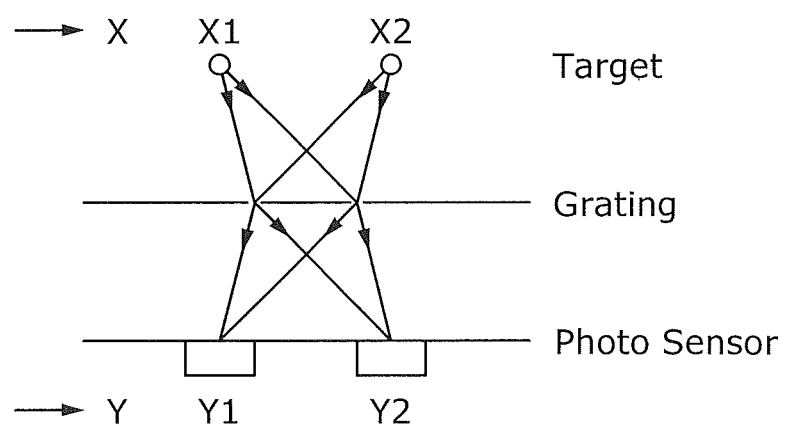

FIG. 3B illustrates an imaging device including a diffraction grating. Here, light from the object enters the imaging device through the diffraction grating. Here, if a matrix corresponding to the diffraction grating is $A=\{(a,b),(c,d)\}$ and vectors corresponding to input images at the times T1 and T2 are $'(1,0)$ and $'(0,1)$, vectors corresponding to light entering the imaging device are $'(a,c)$ and $'(b,d)$. Note that an inverse conversion matrix of the matrix is $A^{-1}=\{(d,-b),(-c,a)\}$ (for simplicity, $ad-bc=1$).

In the case where the imaging device is driven using a rolling shutter system, when imaging operation is sequentially performed in the row of the pixel Y1 at the time T1 and in the row of the pixel Y2 at the time T2, a vector corresponding to a captured image is $'(a,d)$. Thus, an inverse conversion matrix is $A^{-1} \cdot '(a,d)='((a-b)d, d^2-ac)$. This corresponds not to an image in which images at the times T1 and T2 are mixed simply, but to an image that is totally different from the image of the object at the times T1 and T2. That is, it is not easy to form the input image of the object by arithmetic processing.

On the other hand, in the case where the imaging device is driven using a global shutter system, when imaging operation is simultaneously performed in all the rows at the time T1, a vector corresponding to a captured image is $'(a,c)$. Thus, an inverse conversion matrix is $A^{-1} \cdot '(a,c)='(1,0)$. This means that it is possible to form the input image of the object at the time T1 by arithmetic processing. Thus, by driving with a global shutter system, it is possible to provide a lensless imaging device that can also capture the image of a moving object.

In order to achieve a global shutter system, a pixel circuit preferably includes an oxide semiconductor transistor (hereinafter referred to as an OS transistor). For example, the circuit 90 can have a structure in FIG. 4A.

In the circuit 90, one of a source electrode and a drain electrode of a transistor 51 is electrically connected to one electrode 66 of a photoelectric conversion element 60. The other of the source electrode and the drain electrode of the transistor 51 is electrically connected to a gate electrode of a transistor 52. The other of the source electrode and the drain electrode of the transistor 51 is also electrically connected to one of a source electrode and a drain electrode of a transistor 53. One of a source electrode and a drain electrode of the transistor 52 is electrically connected to one of a source electrode and a drain electrode of a transistor 54. A capacitor 59 is not necessarily provided.

The source electrode and the drain electrode of each transistor can function as wirings. For example, one of wirings 71 and 79 can function as a power supply line, and the other of the wirings 71 and 79 can function as an output line. A wiring 72 can function as a power supply line. A wiring 77 can function as a power supply line (low-potential power supply line). Wirings 75, 76, and 78 can function as signal lines for controlling the on/off states of transistors. A wiring 74 can function as a connection wiring.

Here, the transistor 51 can function as a transfer transistor for controlling the potential of a charge accumulation portion (FD) in response to output of the photoelectric conversion element 60. The transistor 52 can function as an amplifying transistor that outputs a signal based on the potential of the charge accumulation portion (FD). The transistor 53 can function as a reset transistor for initializing the potential of the charge accumulation portion (FD). The transistor 54 can function as a selection transistor for selecting a pixel.

It is particularly preferable to use OS transistors as the transistors 51 to 54.

Extremely low off-state current of the OS transistor can widen the dynamic range of imaging. In the circuit illustrated in FIG. 4A, an increase in the intensity of light entering the photoelectric conversion element 60 reduces the potential of the charge accumulation portion (FD). Since the OS transistor has extremely low off-state current, current based on a gate potential can be accurately output even when the gate potential is extremely low. Thus, it is possible to widen the detection range of illuminance, i.e., the dynamic range.

A period during which charge can be held in the charge accumulation portion (FD) can be extremely long owing to the low off-state current of the transistors 51 and 53. Therefore, a global shutter system in which accumulation operation is performed in all the pixels at the same time can be used without a complicated circuit structure and operation method. Consequently, an image with little distortion can be easily obtained even in the case of a moving object.

In addition, the OS transistor has lower temperature dependence of change in electrical characteristics than a transistor including silicon in an active region or an active layer (hereinafter referred to as a Si transistor), and thus can be used in an extremely wide range of temperatures. Therefore, an imaging device and a semiconductor device that include the OS transistors are suitable for automobiles, aircrafts, and spacecrafts.

Moreover, the OS transistor has higher drain breakdown voltage than the Si transistor. In a photoelectric conversion element in which a selenium-based material is used for a photoelectric conversion layer, comparatively high voltage (e.g., 10 V or higher) is preferably applied to cause an avalanche phenomenon easily. Therefore, by combination of the OS transistor and the photoelectric conversion element in which the selenium-based material is used for the photoelectric conversion layer, a highly reliable imaging device can be obtained.

Figure 4A:
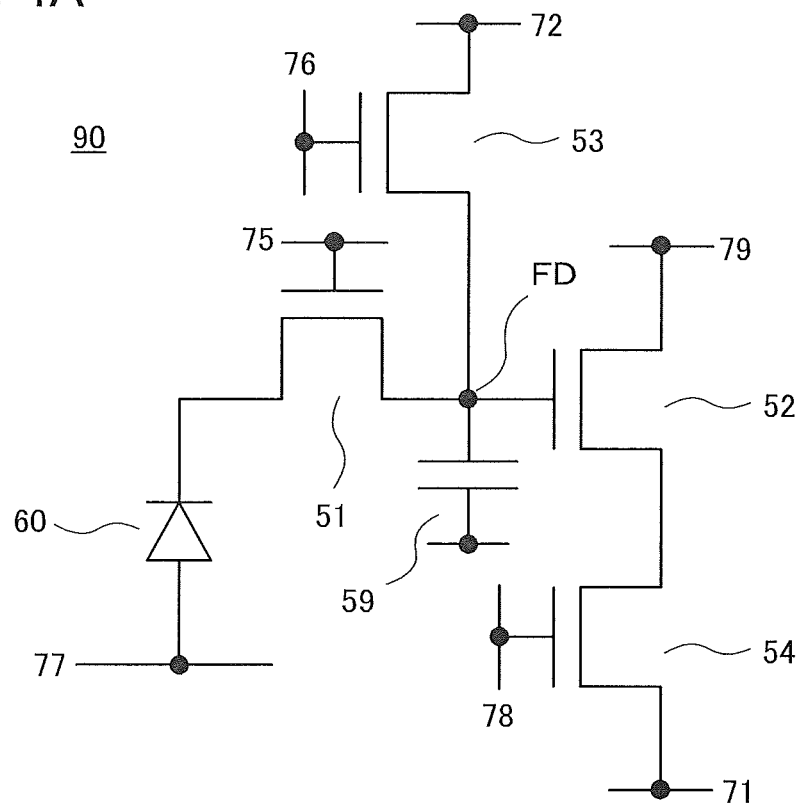
FIGS. 4A and 4B illustrate circuits of an imaging device.
Figure 5A:
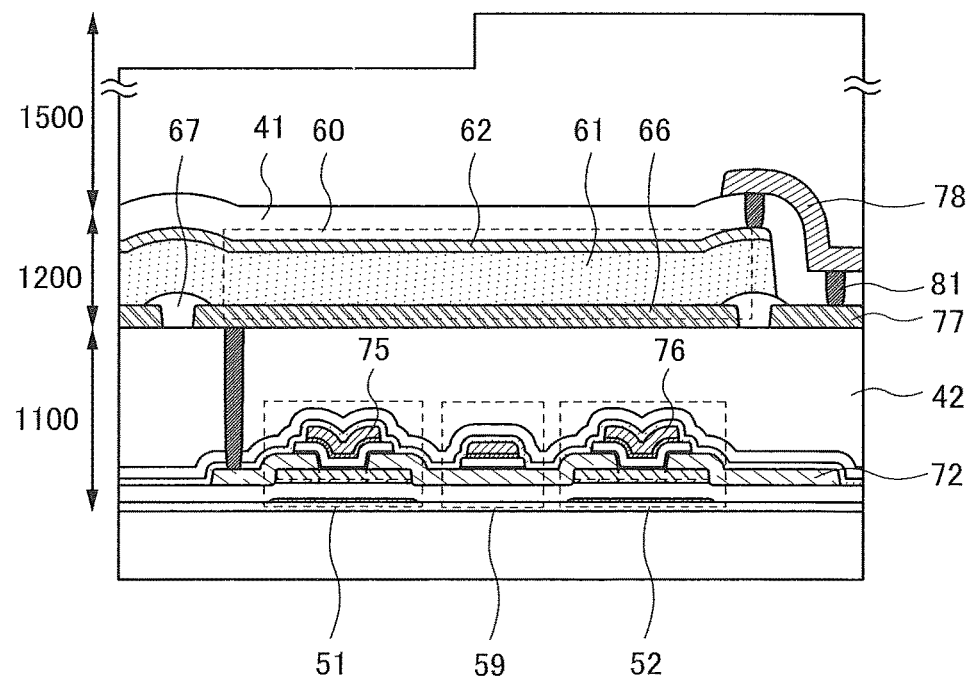
FIGS. 5A to 5C are cross-sectional views illustrating an imaging device.

FIG. 5A is an example of a cross-sectional view of the imaging device in one embodiment of the present invention and illustrates an example of specific connection between the photoelectric conversion element 60, the transistor 51, the transistor 52, and the capacitor 59 which are included in a pixel circuit in FIG. 4A. Note that electrical connection between the above components is only an example.

Although the wirings, the electrodes, and conductors 81 are illustrated as independent components in this embodiment, some of them are provided as one component in some cases when they are electrically connected to each other. In addition, a structure in which a gate electrode, a source electrode, or a drain electrode of the transistor is connected to the wirings through the conductor 81 is only an example, and the gate electrode, the source electrode, and the drain electrode of the transistor might each function as a wiring. In some cases, one or more of the wirings and the like illustrated in the drawing are not provided or another wiring or transistor is included in each layer.

In addition, insulating layers 41 and 42 and the like that function as protective films, interlayer insulating films, or planarization films are provided over the components. For example, an inorganic insulating film such as a silicon oxide film or a silicon oxynitride film can be used as each of the insulating layers 41 and 42 and the like. Alternatively, an organic insulating film such as an acrylic resin film or a polyimide resin film may be used. Top surfaces of the insulating layers 41 and 42 and the like are preferably planarized by chemical mechanical polishing (CMP) or the like as necessary.

In some cases, one or more of the wirings and the like are not provided or another wiring or transistor is included in each layer. In addition, another layer might be included. Furthermore, one or more of the layers are not included in some cases.

Although the layer 1500 has a region with a difference in level on a top surface, a plurality of grooves or protrusions provided on the top surface of the layer 1500 have a variety of shapes, and the layer 1500 does not necessarily have a difference in level in the position shown in FIG. 5A. In some cases, the layer 1500 does not have a difference in level over a certain pixel.

Figure 5B:
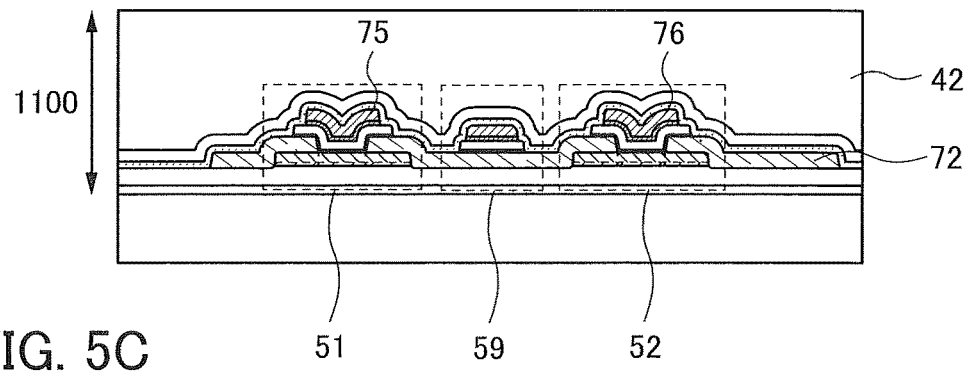
Figure 5C:
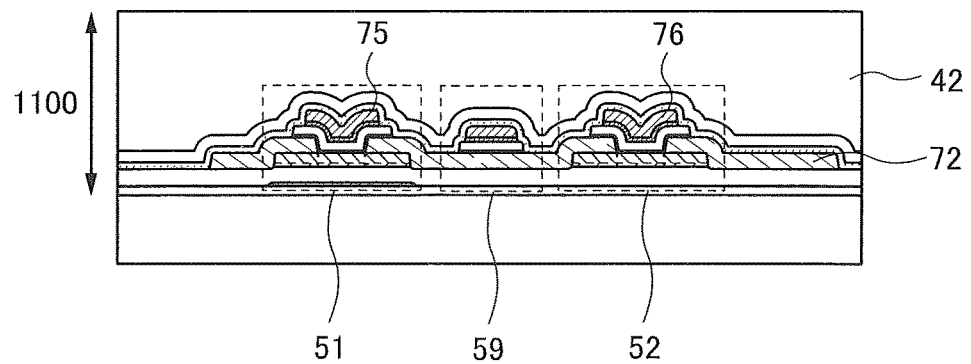

Note that although each transistor includes a back gate in FIG. 5A, as illustrated in FIG. 5B, each transistor does not necessarily include a back gate. Alternatively, as illustrated in FIG. 5C, one or more transistors, for example, only the transistor 51 may include a back gate. The back gate might be electrically connected to a front gate of an opposite transistor. Alternatively, different fixed potentials might be supplied to the back gate and the front gate. Note that the presence or absence of the back gate can also be applied to another imaging device described in this embodiment.

A variety of elements can be used as the photoelectric conversion element 60 provided in the layer 1200. FIG. 5A illustrates the photoelectric conversion element 60 including a selenium-based material for the photoelectric conversion layer 61. The photoelectric conversion element 60 including a selenium-based material has high external quantum efficiency with respect to visible light. In the photoelectric conversion element, a highly sensitive sensor in which the amount of amplification of electrons with respect to the amount of incident light by avalanche multiplication is large can be obtained. In other words, the use of a selenium-based material for the photoelectric conversion layer 61 allows a sufficient amount of photocurrent to be obtained even when pixel area is reduced. Furthermore, because of being highly sensitive to light, the photoelectric conversion element including a selenium-based material is also suitable for imaging in a low illuminance environment. Moreover, the selenium-based material has a high light absorption coefficient, which leads to an advantage that the photoelectric conversion layer 61 is easily formed to be thin.

Amorphous selenium or crystalline selenium can be used as a selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity and light-absorption coefficient than those of amorphous selenium.

Although the photoelectric conversion layer 61 is a single layer, a structure can be employed in which gallium oxide, cerium oxide, or the like is used on a light-receiving surface side of a selenium-based material for a layer for preventing hole injection and nickel oxide, antimony sulfide, or the like is used for a layer for preventing electron injection.

Furthermore, the photoelectric conversion layer 61 may be a layer including a compound of copper, indium, and selenium (CIS). Alternatively, a layer including a compound of copper, indium, gallium, and selenium (CIGS) may be used. With the CIS layer or the CIGS layer, a photoelectric conversion element that can utilize avalanche multiplication in a manner similar to that of a single layer of selenium can be formed.

In the photoelectric conversion element 60 including a selenium-based material, for example, the photoelectric conversion layer 61 can be provided between a light-transmitting conductive layer 62 and the electrode 66 formed using a metal material or the like. CIS and CIGS are p-type semiconductors and may be formed in contact with an n-type semiconductor such as cadmium sulfide or zinc sulfide to form a junction.

Comparatively high voltage (e.g., 10 V or higher) is preferably applied to the photoelectric conversion element to cause the avalanche phenomenon. Since the OS transistor has higher drain breakdown voltage than the Si transistor, comparatively high voltage can be easily applied to the photoelectric conversion element. Therefore, by combination of the OS transistor with high drain breakdown voltage and the photoelectric conversion element in which the selenium-based material is used for the photoelectric conversion layer, a highly sensitive, highly reliable imaging device can be obtained.

Figure 6A:
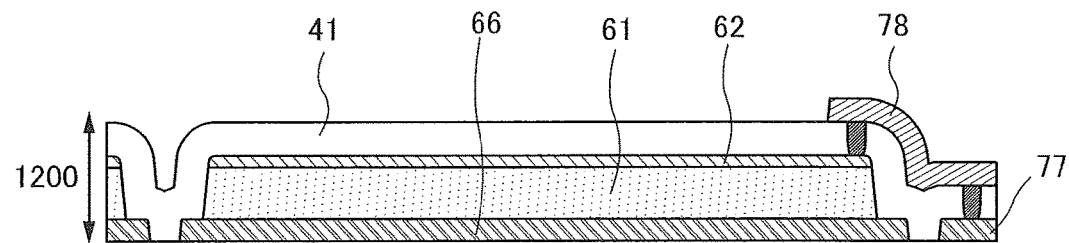
FIGS. 6A to 6D are cross-sectional views each illustrating connection of a photoelectric conversion element.
Figure 6B:
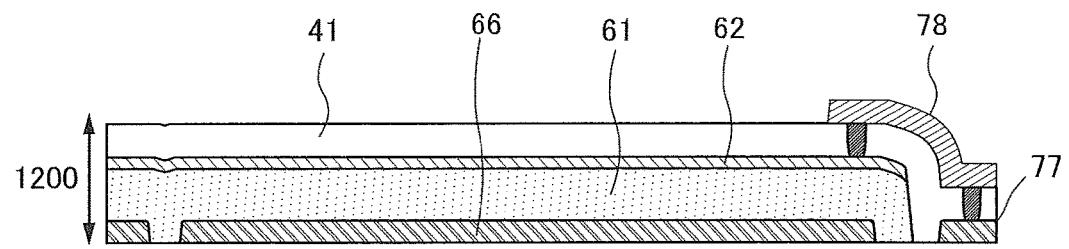
Figure 6C:
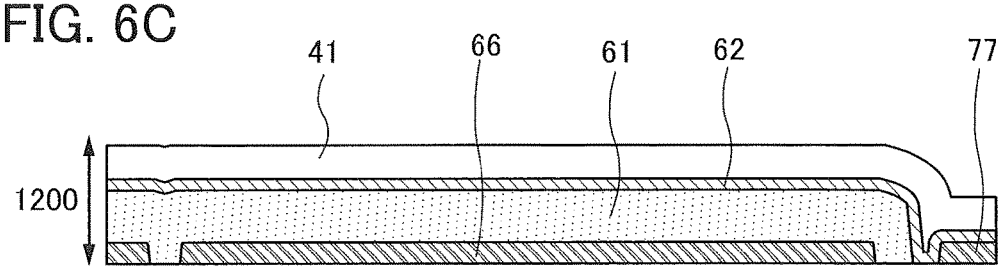
Figure 6D:
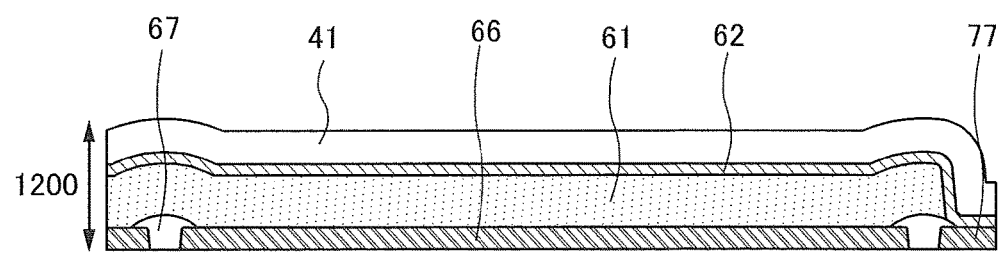

Although the photoelectric conversion layer 61 and the light-transmitting conductive layer 62 are not divided between pixel circuits in FIG. 5A, the photoelectric conversion layer 61 and the light-transmitting conductive layer 62 may be divided between circuits as illustrated in FIG. 6A. Furthermore, a partition wall 67 formed using an insulator is preferably provided in a region between pixels where the electrode 66 is not provided so as not to generate a crack in the photoelectric conversion layer 61 and the light-transmitting conductive layer 62; however, the partition wall 67 is not necessarily provided as illustrated in FIG. 6B. Alternatively, as illustrated in FIGS. 6C and 6D, the light-transmitting conductive layer 62 may be directly in contact with the wiring 77.

Figure 7A:
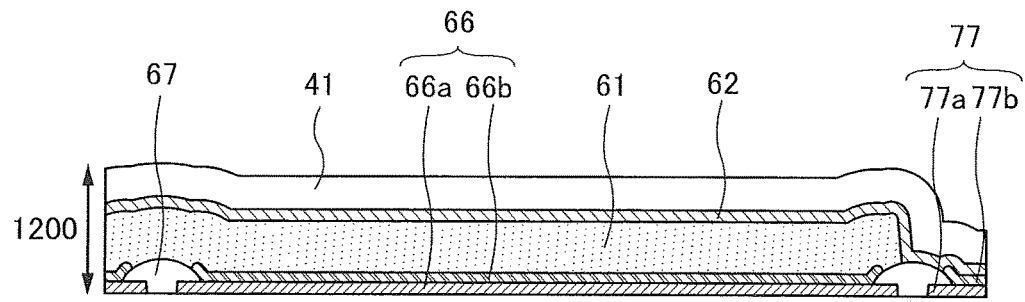
FIGS. 7A to 7C are cross-sectional views each illustrating connection of a photoelectric conversion element.

The electrode 66, the wiring 77, and the like may each be a multilayer. For example, as illustrated in FIG. 7A, the electrode 66 can include two conductive layers 66a and 66b and the wiring 77 can include two conductive layers 77a and 77b. In the structure of FIG. 7A, for example, the conductive layers 66a and 77a may be made of a low-resistance metal or the like, and the conductive layers 66b and 77b may be made of a metal or the like that exhibits an excellent contact property with the photoelectric conversion layer 61. Such a structure improves the electrical properties of the photoelectric conversion element. Furthermore, even when the conductive layer 77a contains a metal that causes electrolytic corrosion, which occurs when some kinds of metal are in contact with the light-transmitting conductive layer 62, electrolytic corrosion can be prevented because the conductive layer 77b is placed between the conductive layer 77a and the light-transmitting conductive layer 62.

The conductive layers 66b and 77b can be formed using, for example, molybdenum, tungsten, or the like. The conductive layers 66a and 77a can be formed using, for example, aluminum, titanium, or a stack of titanium, aluminum, and titanium that are layered in that order.

Figure 7B:
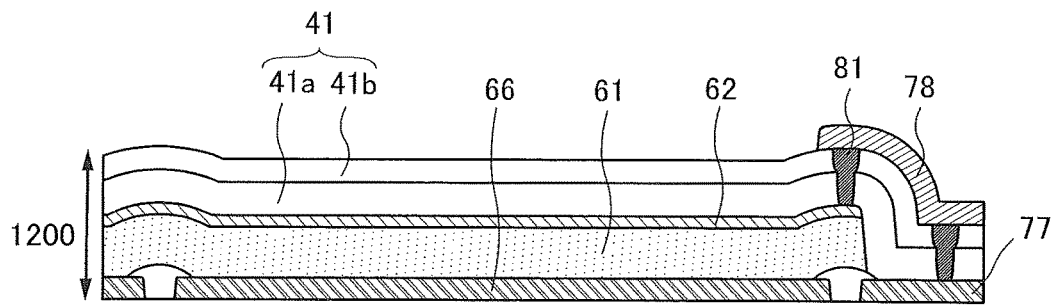
Figure 7C:
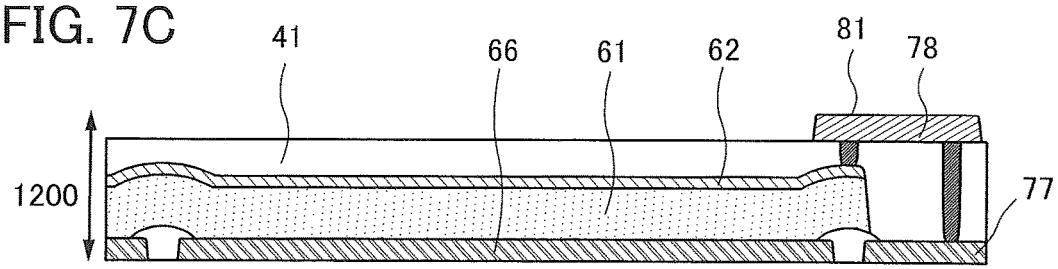

The insulating layers 41 and 42 may each be a multilayer. For example, as illustrated in FIG. 7B, the conductor 81 has a difference in level in the case where the insulating layer 41 includes insulating layers 41a and 41b that have different etching rates. In the case where another insulating layer used as an interlayer insulating film or a planarization film is a multilayer, the conductor 81 also has a difference in level. Although the insulating layer 41 is formed using two layers here, the insulating layer 41 and another insulating layer may each be formed using three or more layers. In addition, as illustrated in FIG. 7C, a top surface of the insulating layer 41 may be planarized.

Note that the partition wall 67 can be formed using an inorganic insulator, an insulating organic resin, or the like. The partition wall 67 may be colored black or the like in order to shield the transistors and the like from light and/or to determine the area of a light-receiving portion in each pixel.

Alternatively, a PIN diode element or the like formed using an amorphous silicon film, a microcrystalline silicon film, or the like may be used.

Figure 8:
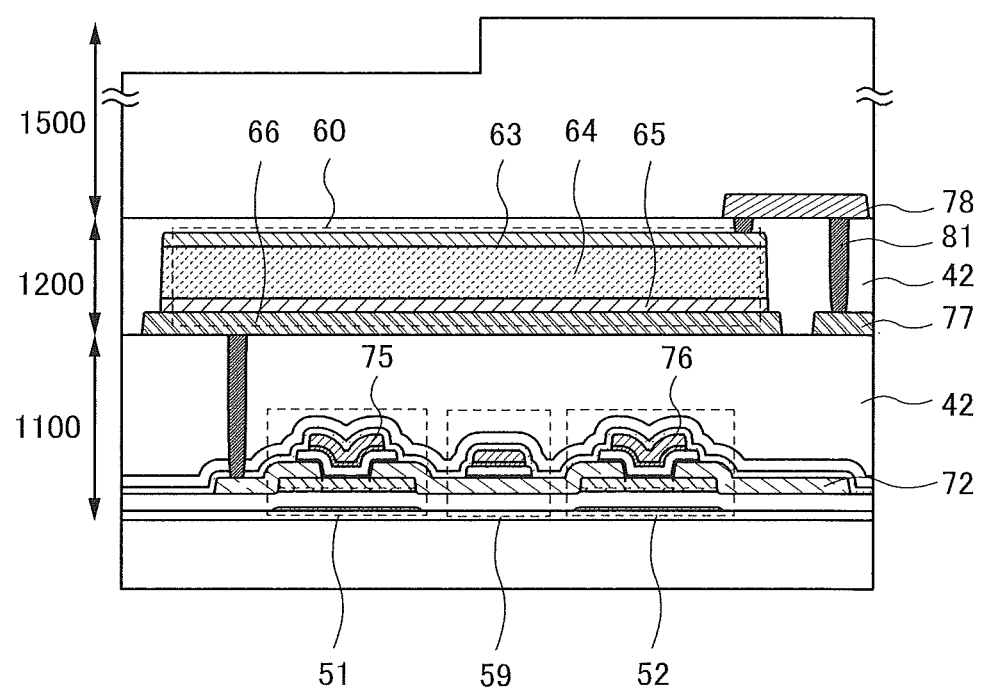
FIG. 8 is a cross-sectional view illustrating an imaging device.

FIG. 8 illustrates an example in which a thin film PIN photodiode is used as the photoelectric conversion element 60. In the photodiode, an n-type semiconductor layer 65, an i-type semiconductor layer 64, and a p-type semiconductor layer 63 are stacked in that order. The i-type semiconductor layer 64 is preferably formed using amorphous silicon. The p-type semiconductor layer 63 and the n-type semiconductor layer 65 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

In the photoelectric conversion element 60 in FIG. 8, the n-type semiconductor layer 65 functioning as a cathode is electrically connected to the electrode 66 that is electrically connected to the transistor 51. Furthermore, the p-type semiconductor layer 63 functioning as an anode is electrically connected to the wiring 78 through the conductor 81.

Note that as to the connection of the photoelectric conversion element 60 with wirings or the like, what the anode is connected to and what the cathode is connected to in the circuit 90 in FIG. 4A might be reversed.

In any case, the photoelectric conversion element 60 is preferably formed so that the p-type semiconductor layer 63 serves as a light-receiving surface. When the p-type semiconductor layer 63 serves as a light-receiving surface, the output current of the photoelectric conversion element 60 can be increased.

Furthermore, any of examples illustrated in FIGS. 9A to 9F may be applied to the structure of the photoelectric conversion element 60 having a configuration of a PIN thin film photodiode and the connection between the photoelectric conversion element 60 and the wirings. Note that the structure of the photoelectric conversion element 60 and the connection between the photoelectric conversion element 60 and the wirings are not limited thereto, and other configurations may be applied.

Figure 9A:
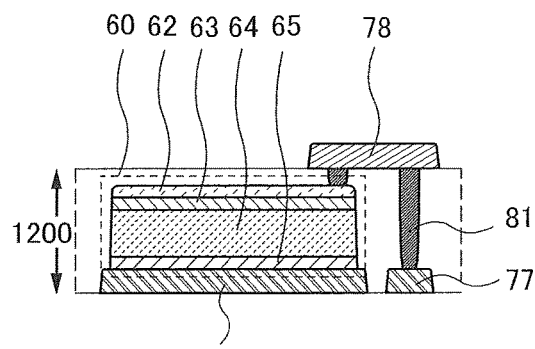
FIGS. 9A to 9F are cross-sectional views each illustrating connection of a photoelectric conversion element.

FIG. 9A illustrates a structure provided with the light-transmitting conductive layer 62 in contact with the p-type semiconductor layer 63 of the photoelectric conversion element 60. The light-transmitting conductive layer 62 functions as an electrode and can increase the output current of the photoelectric conversion element 60.

For the light-transmitting conductive layer 62, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 62 is not limited to a single layer, and may be a stacked layer of different films.

Figure 9B:
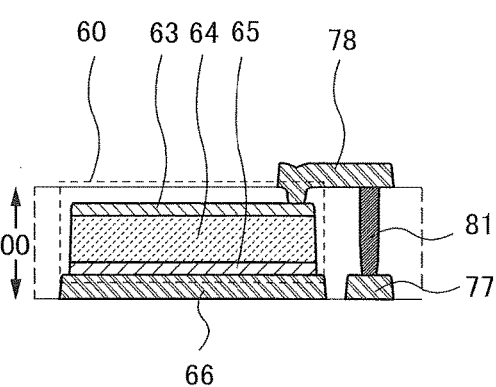

FIG. 9B illustrates a structure in which the p-type semiconductor layer 63 of the photoelectric conversion element 60 is directly connected to the wiring 78.

Figure 9C:
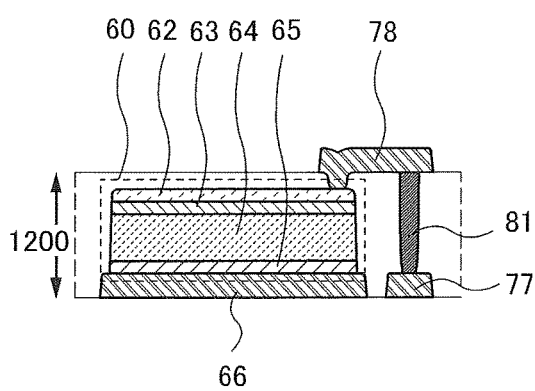

FIG. 9C illustrates a structure in which the light-transmitting conductive layer 62 in contact with the p-type semiconductor layer 63 of the photoelectric conversion element 60 is provided, and the wiring 78 is electrically connected to the light-transmitting conductive layer 62.

Figure 9D:
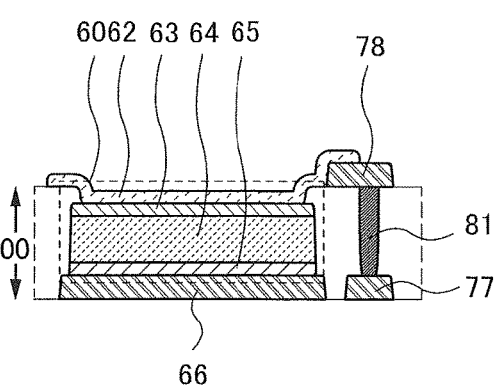

FIG. 9D illustrates a structure in which an opening portion exposing the p-type semiconductor layer 63 is provided in an insulating layer covering the photoelectric conversion element 60, and the light-transmitting conductive layer 62 that covers the opening portion is electrically connected to the wiring 78.

Figure 9E:
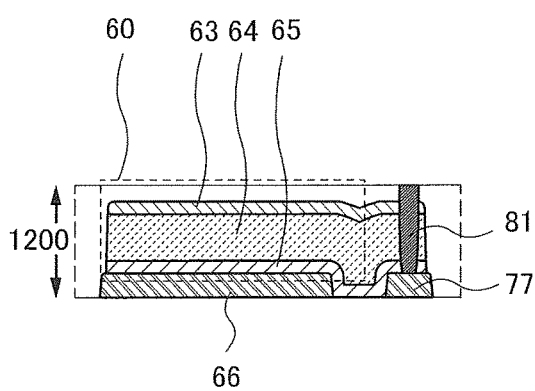

FIG. 9E illustrates a structure provided with the conductor 81 that penetrates the photoelectric conversion element 60. In the structure, the wiring 77 is electrically connected to the p-type semiconductor layer 63 through the conductor 81. Note that in the drawing, the wiring 77 appears to be electrically connected to the electrode 66 through the n-type semiconductor layer 63. However, resistance in the lateral direction of the n-type semiconductor layer 63 is high; therefore, when an appropriate distance is provided between the wiring 77 and the electrode 66, the resistance between the wiring 77 and the electrode 66 is extremely high. Thus, the photoelectric conversion element 60 can have diode characteristics without a short circuit between the anode and the cathode. Note that two or more conductors 81 that are electrically connected to the p-type semiconductor layer 63 may be provided.

Figure 9F:
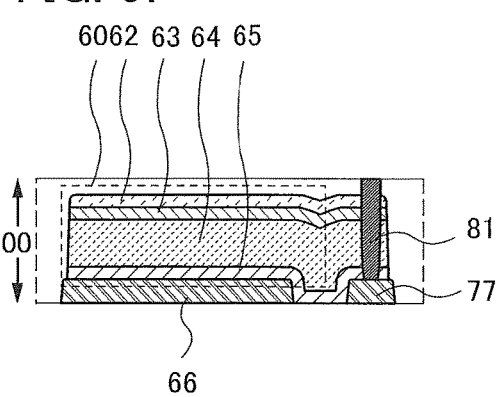

FIG. 9F illustrates a structure in which the photoelectric conversion element 60 in FIG. 9E is provided with the light-transmitting conductive layer 62 in contact with the p-type semiconductor layer 63.

Note that each of the photoelectric conversion elements 60 in FIGS. 9D to 9F has an advantage of having a large light-receiving area because wirings and the like do not overlap with a light-receiving region.

Figure 10:
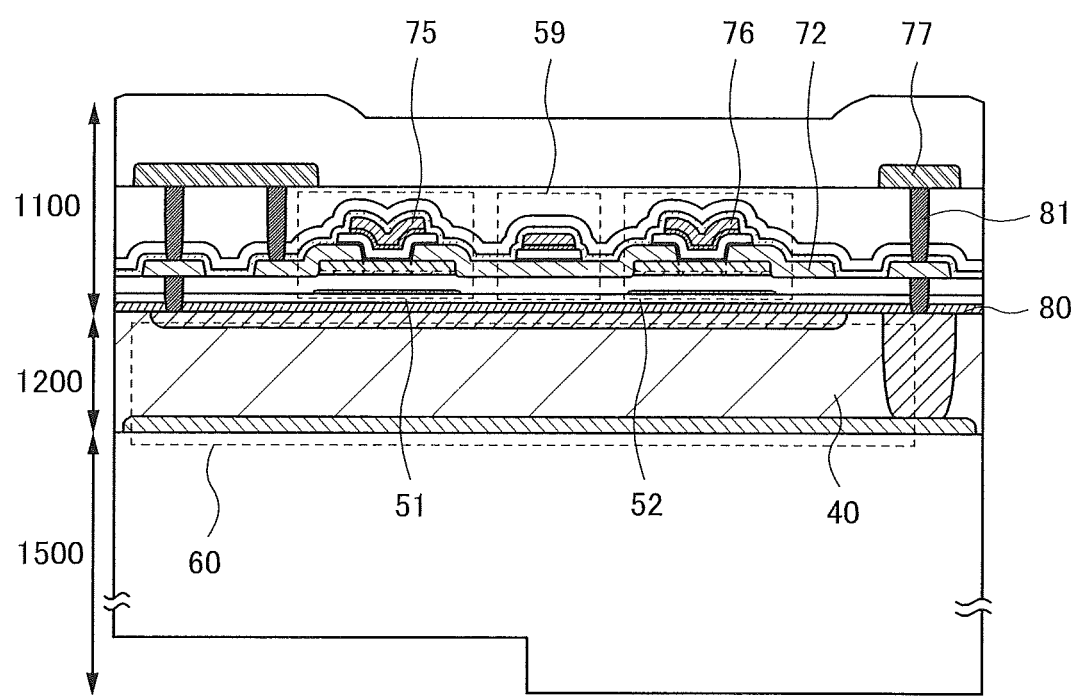
FIG. 10 is a cross-sectional view illustrating an imaging device.

Alternatively, as illustrated in FIG. 10, the photoelectric conversion element 60 can be a photodiode including a silicon substrate 40 as a photoelectric conversion layer.

The photoelectric conversion element 60 formed using the selenium-based material, amorphous silicon, or the like can be formed through general semiconductor manufacturing processes such as a deposition process, a lithography process, and an etching process. Furthermore, the resistance of the selenium-based material is high; thus, a structure in which the photoelectric conversion layer 61 is not divided between the circuits can be employed as illustrated in FIG. 5A. Therefore, the imaging device in one embodiment of the present invention can be manufactured with a high yield at low cost. Meanwhile, to form a photodiode in which the photoelectric conversion layer 61 is formed using crystalline silicon, processes with high difficulty, such as a polishing process and a bonding process, are needed.

Figure 11A:
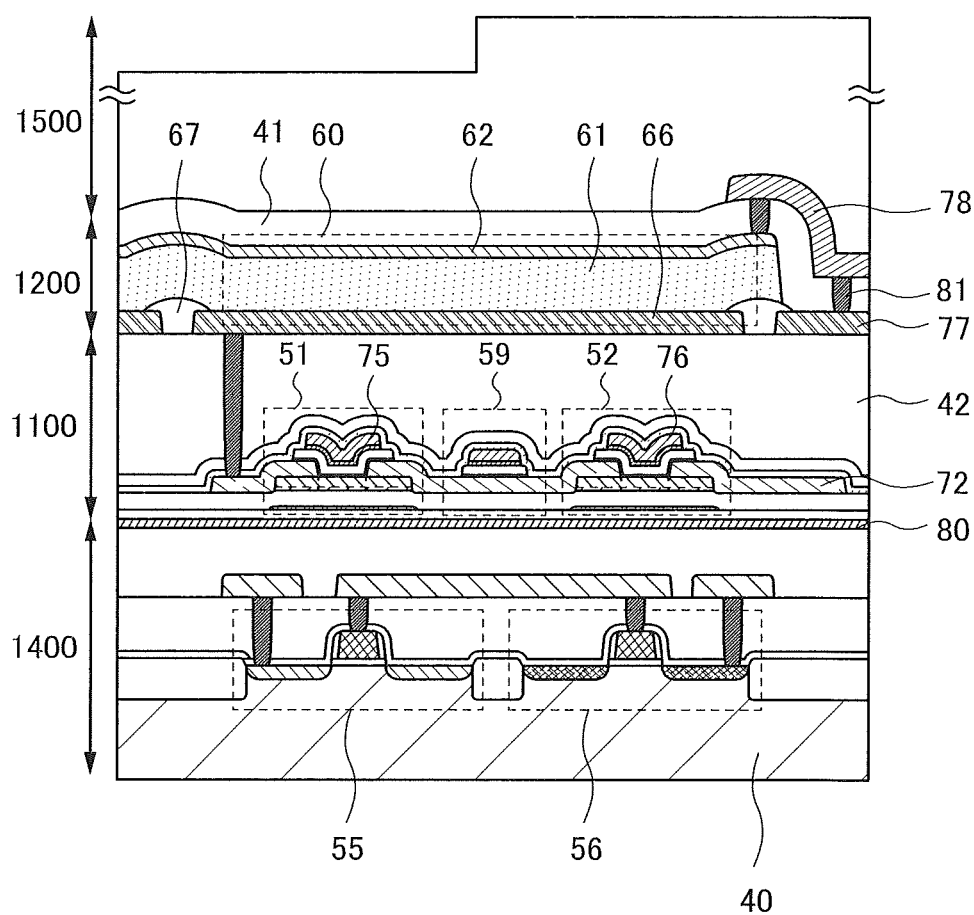
FIGS. 11A and 11B are cross-sectional views illustrating an imaging device.

Furthermore, the imaging device in one embodiment of the present invention may be stacked over the silicon substrate 40 including circuits. For example, as illustrated in FIGS. 11A and 11B, the pixel circuit may overlap with a layer 1400 that includes transistors 55 and 56 whose active regions are formed in the silicon substrate 40.

Figure 4B:
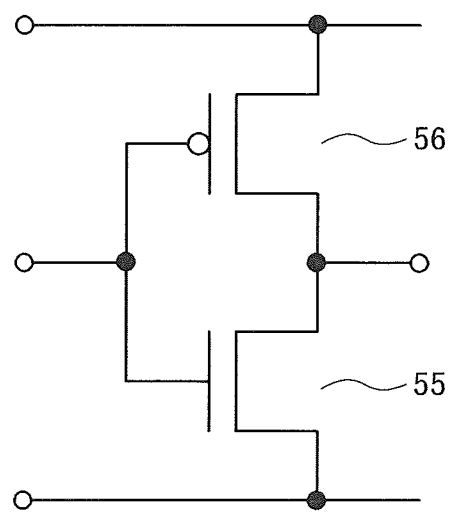

The circuit formed in the silicon substrate 40 is capable of reading a signal output from the pixel circuit and converting the signal; for example, the circuit can include a CMOS inverter as illustrated in the circuit diagram in FIG. 4B. A gate electrode of the transistor 55 (n-channel transistor) is electrically connected to a gate electrode of the transistor 56 (p-channel transistor). One of a source electrode and a drain electrode of one transistor is electrically connected to one of a source electrode and a drain electrode of the other transistor. The other of the source electrode and the drain electrode of the one transistor is electrically connected to a wiring, and the other of the source electrode and the drain electrode of the other transistor is electrically connected to another wiring.

Furthermore, the silicon substrate 40 is not limited to a bulk silicon substrate and can be a substrate made of germanium, silicon germanium, silicon carbide, gallium arsenide, aluminum gallium arsenide, indium phosphide, gallium nitride, or an organic semiconductor.

Figure 11B:
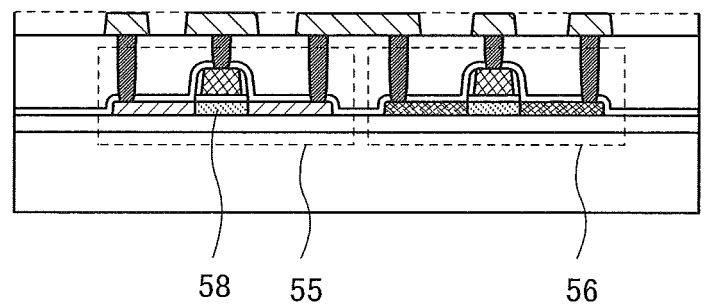

As illustrated in FIG. 11B, the transistors 55 and 56 may each be a transistor including the active layer 58 formed using a silicon thin film. The active layer 58 can be formed using polycrystalline silicon or single crystal silicon of a silicon-on-insulator (SOI) structure.

In the stack, an insulating layer 80 is provided between the layer including the transistors 55 and 56 and the layer including the transistors 51 and 52. Here, as illustrated in FIG. 10 and FIG. 11A, the insulating layer 80 is provided between a region including an oxide semiconductor transistor and a region including a Si transistor (a Si photodiode in FIG. 10).

Dangling bonds of silicon are terminated with hydrogen in insulating layers provided in the vicinities of the active regions of the transistors 55 and 56. Therefore, hydrogen has an effect of improving the reliability of the transistors 55 and 56. Meanwhile, hydrogen in insulating layers which are provided in the vicinity of the oxide semiconductor layer that is the active layer of the transistor 51 or the like causes generation of carriers in the oxide semiconductor layer. Therefore, hydrogen might reduce the reliability of the transistor 51 or the like. Consequently, in the case where one layer including the transistor formed using a silicon-based semiconductor material and the other layer including the OS transistor are stacked, it is preferable that the insulating layer 80 having a function of preventing diffusion of hydrogen be provided between the layers. Hydrogen is confined in the one layer by the insulating layer 80, so that the reliability of the transistors 55 and 56 can be improved. Furthermore, diffusion of hydrogen from the one layer to the other layer is inhibited, so that the reliability of the transistor 51 or the like can also be improved.

The insulating layer 80 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Note that as illustrated in FIGS. 11A and 11B, a circuit (e.g., a driver circuit) formed using the silicon substrate 40, the transistor 51 or the like, and the photoelectric conversion element 60 can overlap with each other; thus, the integration degree of pixels can be increased. In other words, the resolution of the imaging device can be increased. For example, the imaging device is suitable for an imaging device whose number of pixels is 4K2K, 8K4K, 16K8K, or the like.

In the imaging device in FIGS. 11A and 11B, no photoelectric conversion element is provided on the silicon substrate 40. Therefore, an optical path for the photoelectric conversion element 60 can be secured without being influenced by the transistors or wirings, and a pixel with a high aperture ratio can be formed.

Figure 12:
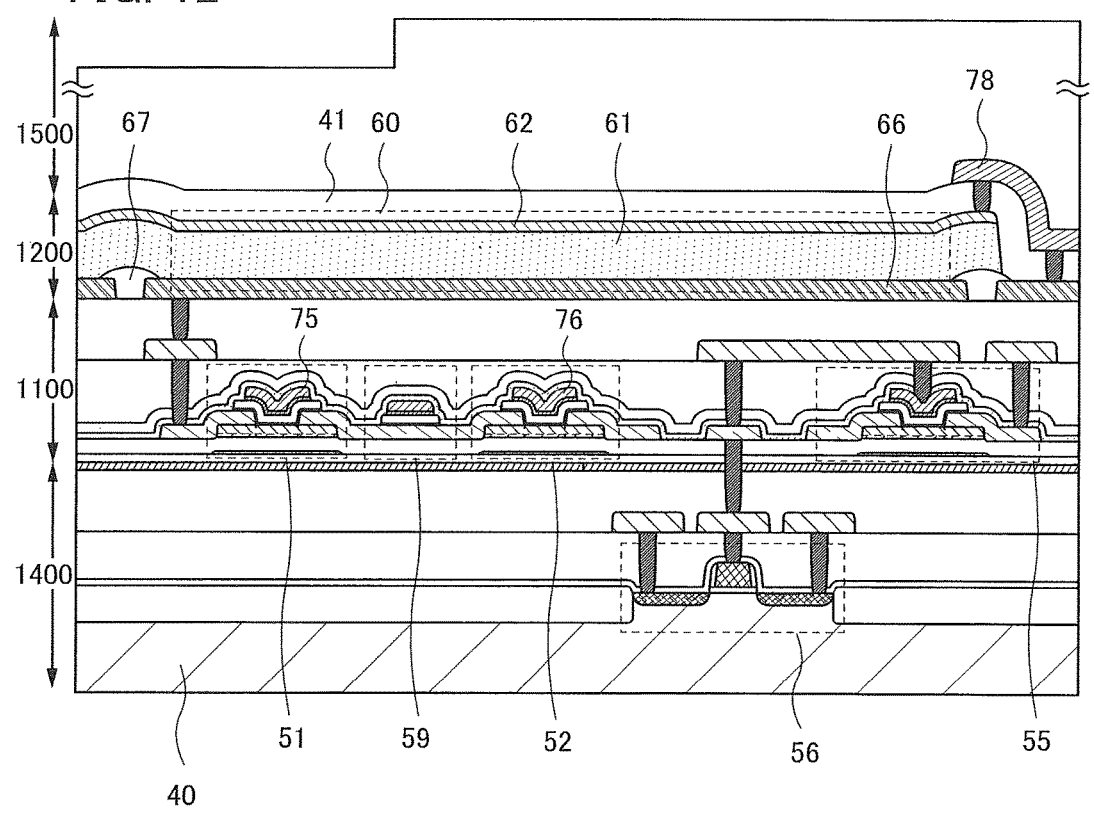
FIG. 12 is a cross-sectional view illustrating an imaging device.
Figure 13A:
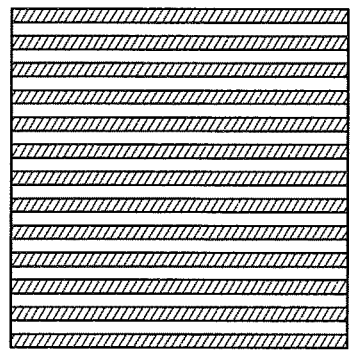
FIGS. 13A to 13F are top views each illustrating the shape of a diffraction grating.
Figure 13B:
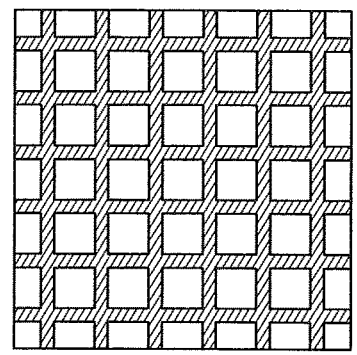
Figure 13C:
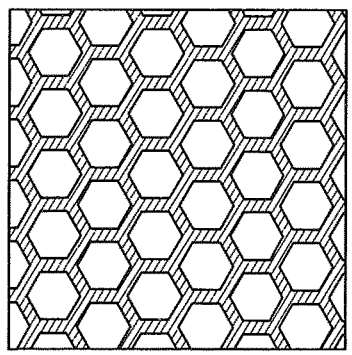
Figure 13D:
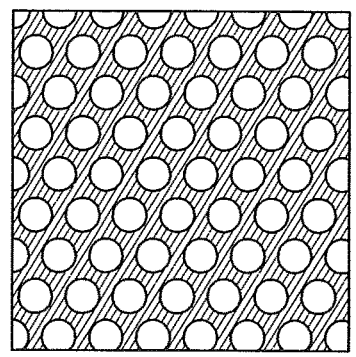
Figure 13E:
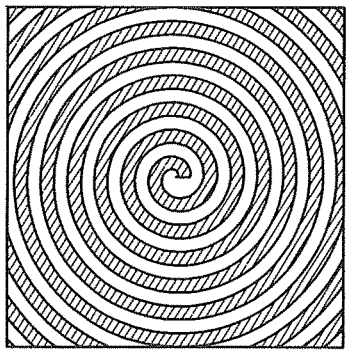
Figure 13F:
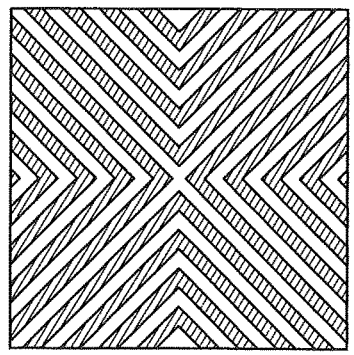

The imaging device in one embodiment of the present invention can have a structure in FIG. 12.

The imaging device in FIG. 12 is a modification example of the imaging device in FIG. 11A. A CMOS inverter is formed using an OS transistor and a Si transistor.

Here, the transistor 56 is a p-channel Si transistor provided in the layer 1400, and the transistor 55 is an n-channel OS transistor provided in the layer 1100. When only the p-channel transistor is provided on the silicon substrate 40, a step of forming a well, an n-type impurity layer, or the like can be skipped.

Although selenium is used for the photoelectric conversion element 60 in the imaging device in FIG. 12, a PIN thin film photodiode may be used as in FIG. 8.

In the imaging device in FIG. 12, the transistor 55 can be formed in the same process as the transistors 51 and 52 formed in the layer 1100. Thus, the manufacturing process of the imaging device can be simplified.

Note that the structure of the transistor and the photoelectric conversion element included in each of the imaging devices described in this embodiment is only an example. Therefore, for example, one or more of the transistors 51 to 54 can be formed using a transistor in which an active region or an active layer includes silicon or the like. Furthermore, either one or both the transistors 55 and 56 can be formed using a transistor including an oxide semiconductor layer as an active layer.

FIGS. 13A to 13F are examples of top views of the layer 1500 functioning as a diffraction grating. Hatching portions in FIGS. 13A to 13F may be either convex portions or concave portions. Note that a plurality of patterns illustrated in FIGS. 13A to 13F may be arranged on a pixel array.

Figure 14A:
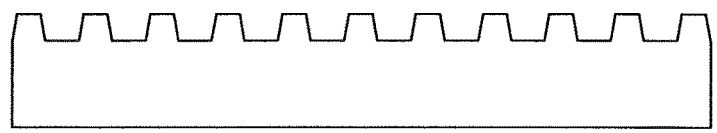
FIGS. 14A to 14E are cross-sectional views each illustrating the shape of a diffraction grating.
Figure 14B:
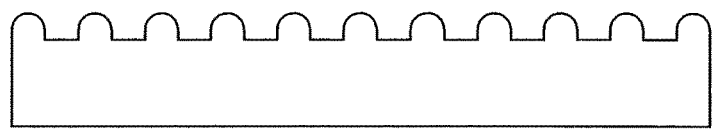
Figure 14C:
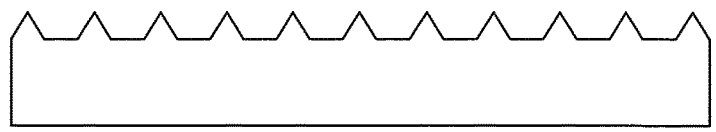
Figure 14D:
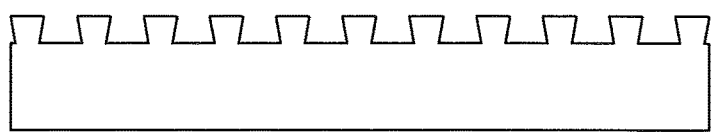
Figure 14E:
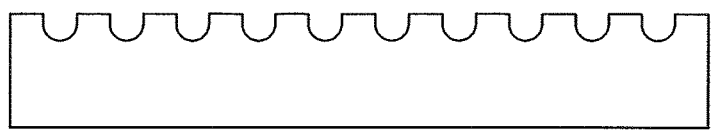

The cross section of a convex portion or a concave portion is not limited to a cross section with a perpendicular side as illustrated in FIG. 1A, and may be any of cross sections illustrated in FIGS. 14A to 14D. Furthermore, the concave portion may have a structure as illustrated in FIG. 14E.

The layer 1500 can be formed using a light-transmitting material. An inorganic insulating film such as a silicon oxide film or a silicon oxynitride film can be used, for example. Alternatively, an organic insulating film such as an acrylic resin film or a polyimide resin film may be used. Alternatively, a stack of the inorganic insulating film and the organic insulating film may be used.

In addition, the layer 1500 can be formed by a lithography process using a photosensitive resin or the like. Alternatively, the layer 1500 can be formed by a lithography process and an etching process. Alternatively, the layer 1500 can be formed by nanoimprint lithography, laser scribing, or the like.

Figure 15A:
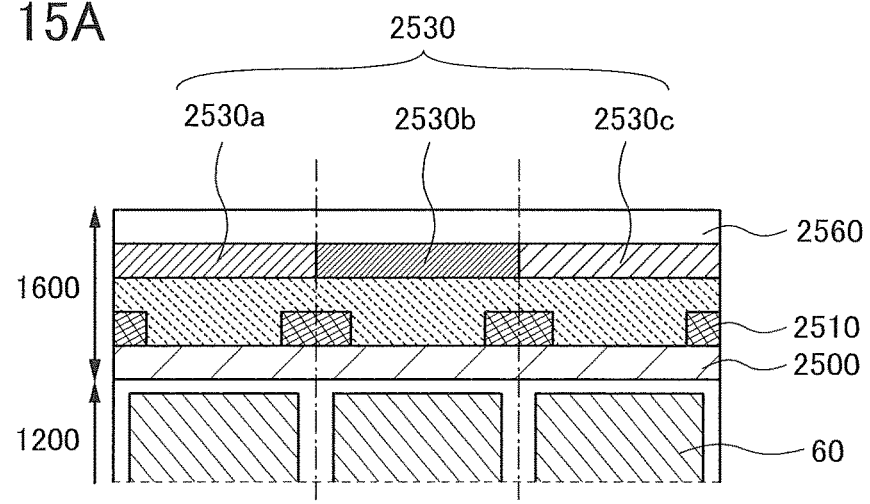
FIGS. 15A to 15C are cross-sectional views each illustrating the structure of an imaging device.

FIG. 15A is a cross-sectional view of an example of a mode in which a color filter and the like are added to the imaging device. The cross-sectional view illustrates part of a region including pixel circuits for three pixels. An insulating layer 2500 is formed over the layer 1200 where the photoelectric conversion element 60 is formed. As the insulating layer 2500, for example, a silicon oxide film with a high visible-light transmitting property can be used. In addition, a silicon nitride film may be stacked as a passivation film. Furthermore, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through the color filter. The light-blocking layer 2510 can be formed using a metal layer of aluminum, tungsten, or the like, or a stack including the metal layer and a dielectric film functioning as an anti-reflection film.

An organic resin layer 2520 can be formed as a planarization film over the insulating layer 2500 and the light-blocking layer 2510. A color filter 2530 is formed in each pixel. For example, a color filter 2530a, a color filter 2530b, and a color filter 2530c each have a color of red (R), green (G), blue (B), yellow (Y), cyan (C), magenta (M), or the like, so that a color image can be obtained.

A light-transmitting insulating layer 2560 or the like can be provided over the color filter 2530. Alternatively, the layer 1500 may be formed without formation of the insulating layer 2560.

Figure 15B:
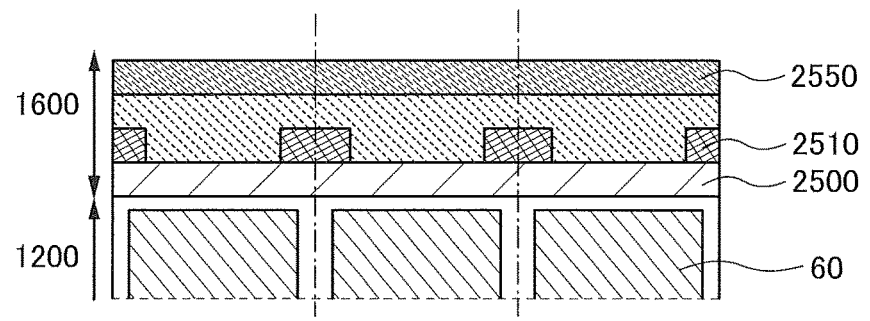

As illustrated in FIG. 15B, an optical conversion layer 2550 may be used instead of the color filter 2530. Such a structure enables the imaging device to capture images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far infrared imaging device can be obtained. When a filter that blocks light having a wavelength longer than or equal to that of visible light is used as the optical conversion layer 2550, an ultraviolet imaging device can be obtained.

Furthermore, when a scintillator is used as the optical conversion layer 2550, an imaging device that captures an image visualizing the intensity of radiation and is used for an X-ray imaging device, for example, can be obtained. Radiation such as X-rays passes through an object to enter a scintillator, and then is converted into light (fluorescence) such as visible light or ultraviolet light owing to a phenomenon known as photoluminescence. Then, the photoelectric conversion element 60 detects the light to obtain image data. Furthermore, the imaging device having the structure may be used in a radiation detector or the like.

A scintillator is formed using a substance that, when irradiated with radiation such as X-rays or gamma-rays, absorbs energy of the radiation to emit visible light or ultraviolet light, or a material containing the substance. For example, materials such as $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO and a resin or ceramics in which any of the materials is dispersed can be used.

In the photoelectric conversion element 60 including a selenium-based material, radiation such as X-rays can be directly converted into charge; thus, the scintillator is not necessarily used.

A microlens array 2540 may be provided over the color filters 2530a, 2530b, and 2530c. Light penetrating lenses included in the microlens array 2540 goes through the color filters positioned thereunder to reach the photoelectric conversion element 60. Note that a region other than the layer 1200 in FIGS. 15A to 15C is referred to as a layer 1600.

Figure 16:
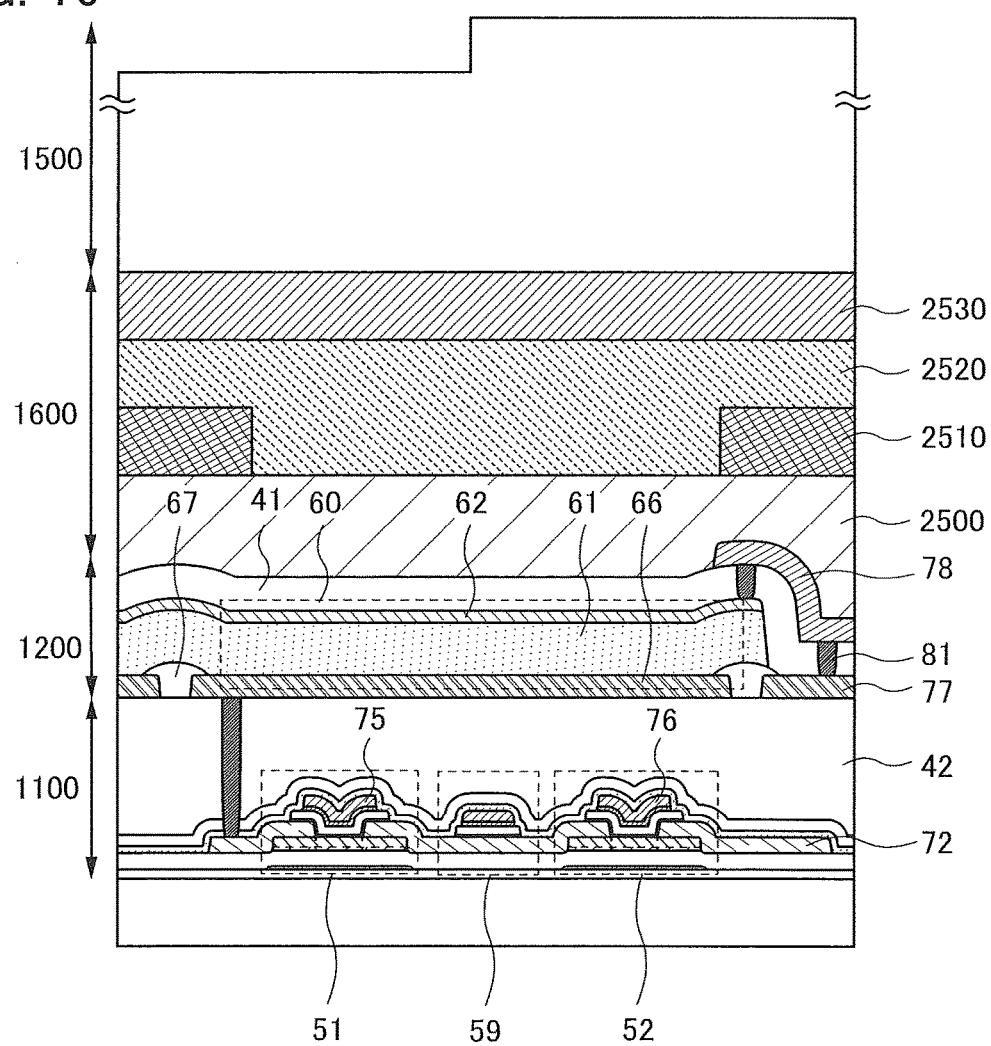
FIG. 16 is a cross-sectional view illustrating the structure of an imaging device.
Figure 17:
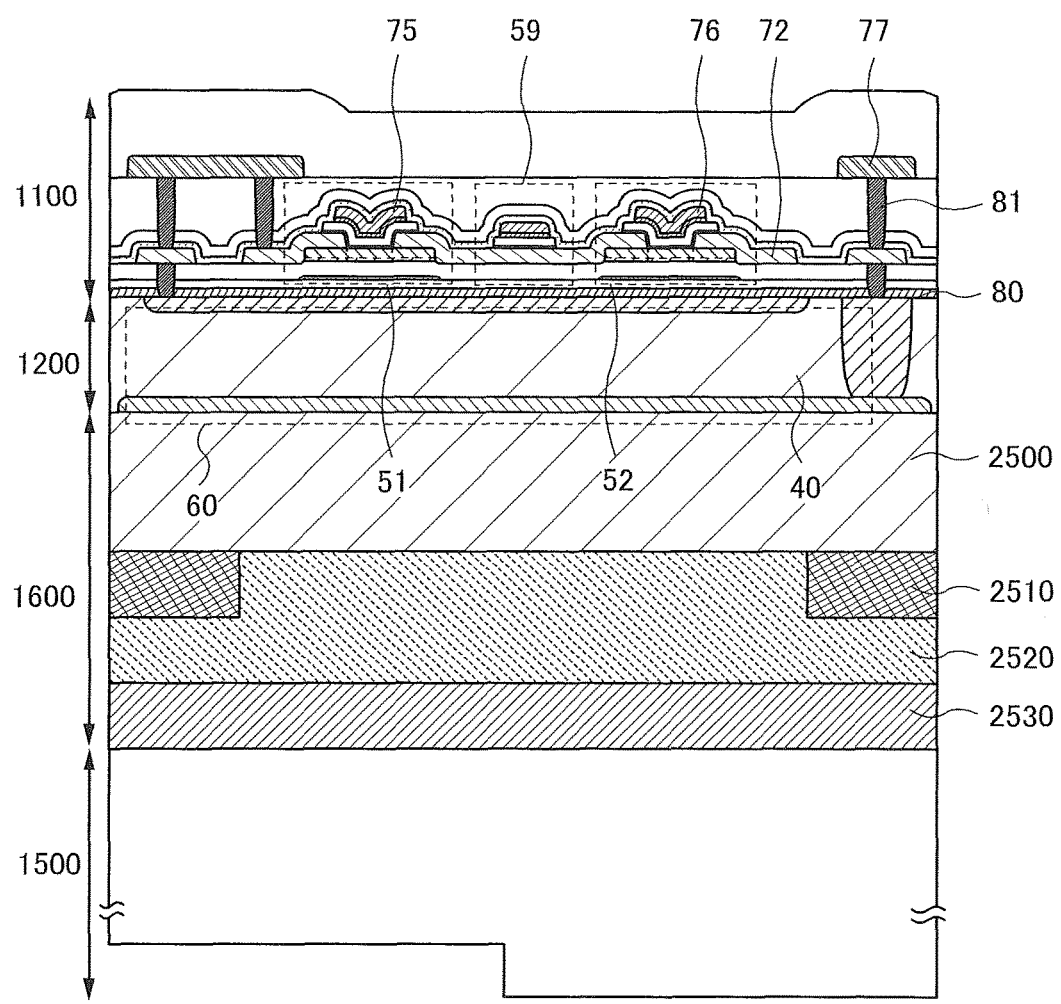
FIG. 17 is a cross-sectional view illustrating the structure of an imaging device.

The specific structure of the imaging device in FIG. 15A is illustrated in FIG. 16 by taking an example of the imaging device in FIGS. 5A to 5C. In addition, the specific structure of the imaging device in FIG. 15A is illustrated in FIG. 17 by taking an example of the imaging device in FIG. 10.

Figure 15C:
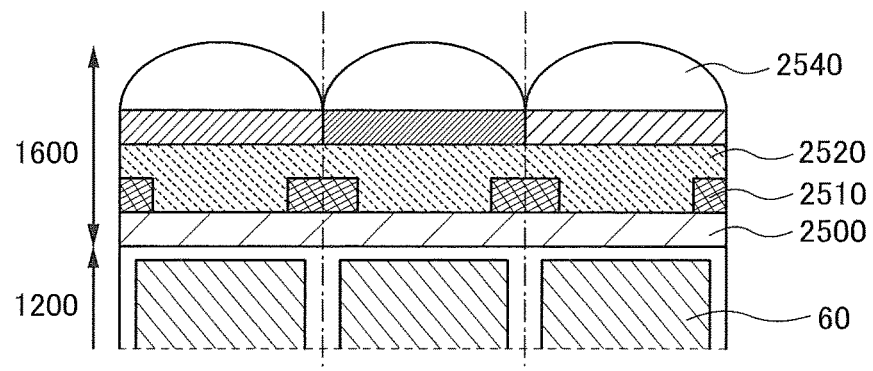
Figure 18:
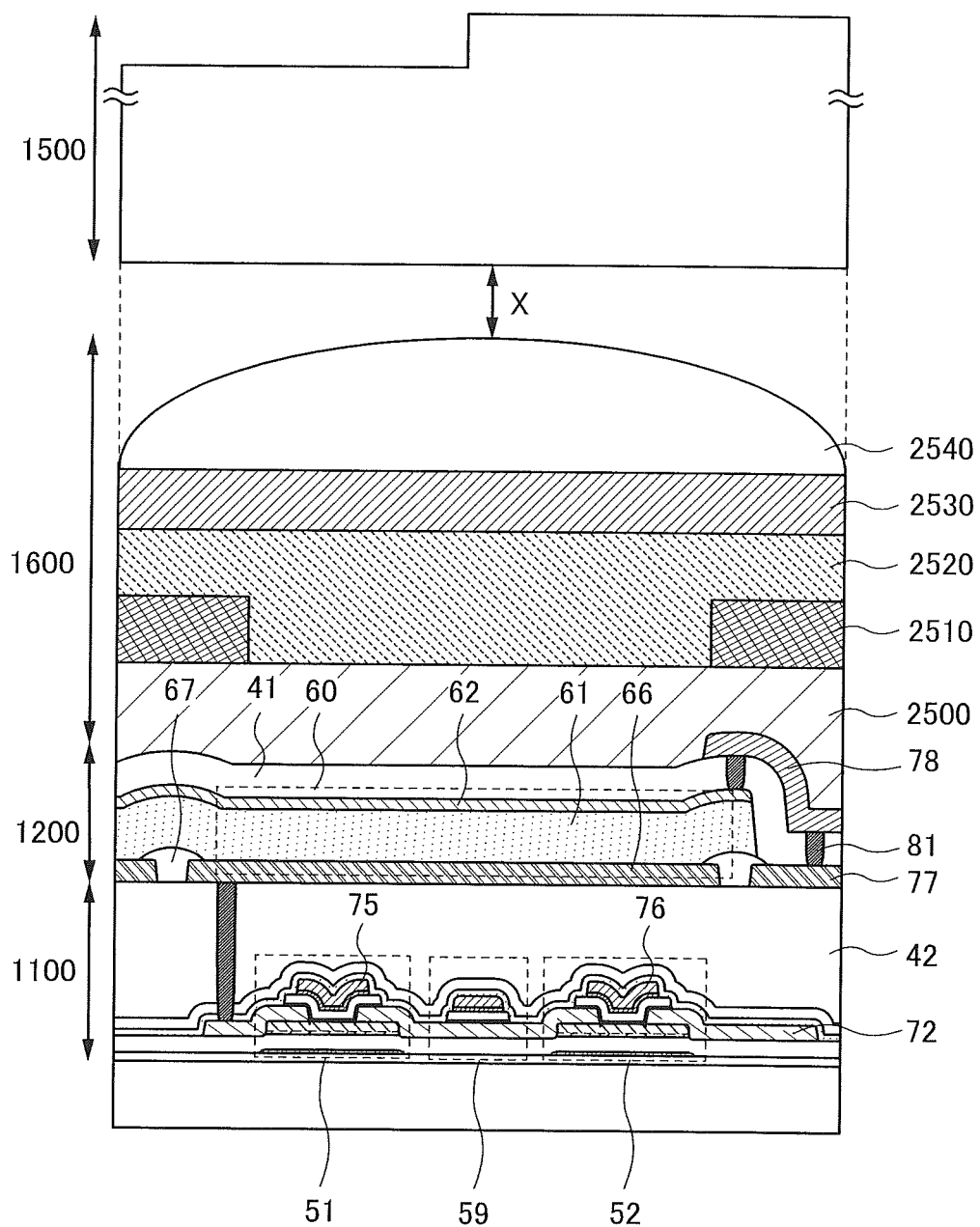
FIG. 18 is a cross-sectional view illustrating the structure of an imaging device.
Figure 19:
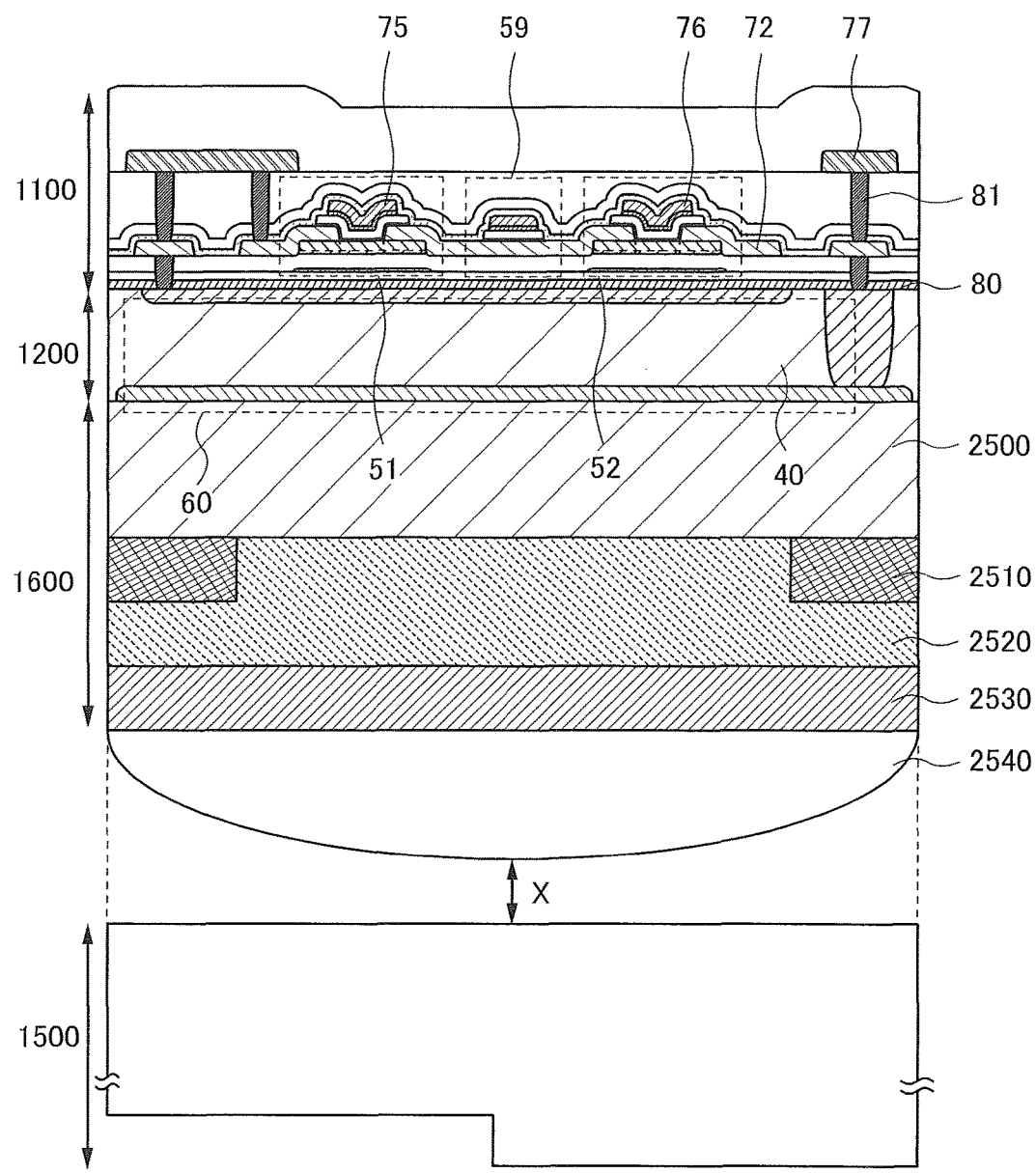
FIG. 19 is a cross-sectional view illustrating the structure of an imaging device.

The specific structure of the imaging device in FIG. 15C is illustrated in FIG. 18 by taking an example of the imaging device in FIGS. 5A to 5C. In addition, the specific structure of the imaging device in FIG. 15C is illustrated in FIG. 19 by taking an example of the imaging device in FIG. 10. Note that a space X may be provided between the layer 1500 and the microlens array 2540. The space X can be less than or equal to 1 mm, preferably less than or equal to 100 μm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Alternatively, a liquid such as silicone oil may be provided. Even in the case where the microlens array 2540 is not provided, the space X may be provided between the color filter 2530 and the layer 1500.

As illustrated in FIGS. 20A1 and 20B1, the imaging device may be bent. FIG. 20A1 illustrates a state in which the imaging device is bent in the direction of dashed-two dotted line X1-X2. FIG. 20A2 is a cross-sectional view illustrating a portion indicated by dashed-two dotted line X1-X2 in FIG. 20A1. FIG. 20A3 is a cross-sectional view illustrating a portion indicated by dashed-two dotted line Y1-Y2 in FIG. 20A1.

FIG. 20B1 illustrates a state where the imaging device is bent in the direction of dashed-two dotted line X3-X4 and the direction of dashed two dotted line Y3-Y4. FIG. 20B2 is a cross-sectional view illustrating a portion indicated by dashed-two dotted line X3-X4 in FIG. 20B1. FIG. 20B3 is a cross-sectional view illustrating a portion indicated by dashed-two dotted line Y3-Y4 in FIG. 20B1.

Bending the imaging device can reduce field curvature and astigmatism. Thus, the optical design of the lens and the like, which are used in combination of the imaging device, can be facilitated. For example, the number of lenses used for aberration correction can be reduced; accordingly, the size or weight of semiconductor devices including the imaging device can be easily reduced. In addition, the quality of captured images can be improved.

In this embodiment, one embodiment of the present invention has been described. Other embodiments of the present invention are described in the other embodiments. Note that one embodiment of the present invention is not limited thereto. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. Although an example in which one embodiment of the present invention includes a diffraction grating is described, one embodiment of the present invention is not limited thereto. Depending on circumstances or conditions, one embodiment of the present invention may include another optical element. Alternatively, for example, depending on circumstances or conditions, one embodiment of the present invention does not necessarily include a diffraction grating.

This embodiment can be combined with any of the structures described in the other embodiments as appropriate.

Embodiment 2

In this embodiment, the circuit 90 described in Embodiment 1 is described.

Figure 21A:
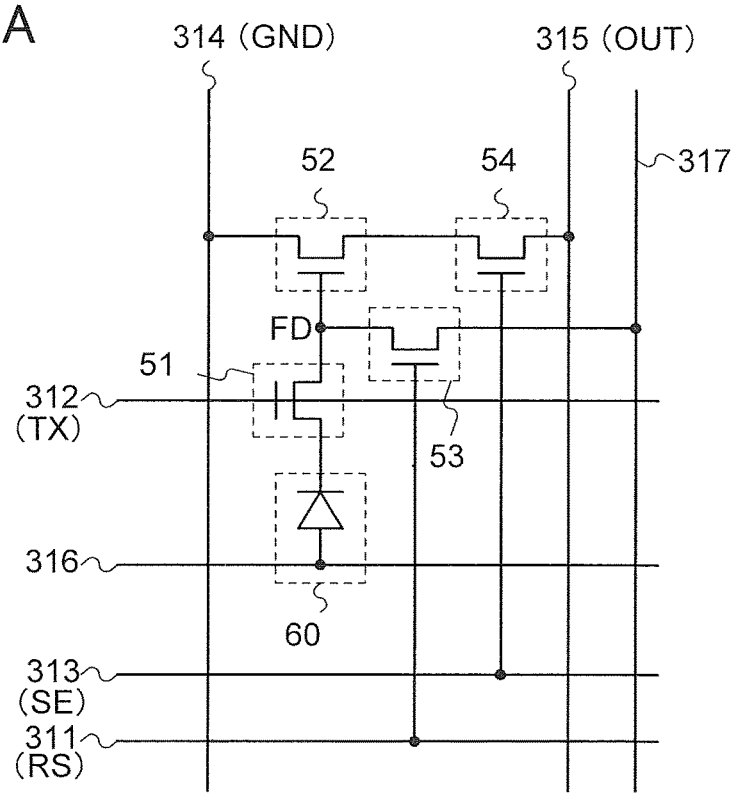
FIGS. 21A and 21B each illustrate the structure of a pixel circuit.

FIG. 21A illustrates details of connection between the circuit 90 in FIG. 4A and wirings. The circuit in FIG. 21A includes the photoelectric conversion element 60 and the transistors 51 to 54.

The anode of the photoelectric conversion element 60 is connected to a wiring 316, and the cathode of the photoelectric conversion element 60 is connected to one of the source electrode and the drain electrode of the transistor 51. The other of the source electrode and the drain electrode of the transistor 51 is connected to the charge accumulation portion (FD), and a gate electrode of the transistor 51 is connected to a wiring 312 (TX). One of the source electrode and the drain electrode of the transistor 52 is connected to a wiring 314 (GND), and the other of the source electrode and the drain electrode of the transistor 52 is connected to one of a source electrode and a drain electrode of the transistor 54. The gate electrode of the transistor 52 is connected to the charge accumulation portion (FD). One of the source electrode and the drain electrode of the transistor 53 is connected to the charge accumulation portion (FD), and the other of the source electrode and the drain electrode of the transistor 53 is connected to a wiring 317. A gate electrode of the transistor 53 is connected to a wiring 311 (RS). The other of the source electrode and the drain electrode of the transistor 54 is connected to a wiring 315 (OUT), and a gate electrode of the transistor 54 is connected to a wiring 313 (SE). Note that all the connection is electrical connection.

A potential such as GND, VSS, or VDD may be applied to the wiring 314. Here, a potential or voltage has a relative value. Therefore, the potential GND is not necessarily 0 V.

The photoelectric conversion element 60 is a light-receiving element and has a function of generating current based on the amount of light that enters the pixel circuit. The transistor 53 has a function of controlling accumulation of charge in the charge accumulation portion (FD) by the photoelectric conversion element 60. The transistor 54 has a function of outputting a signal based on the potential of the charge accumulation portion (FD). The transistor 55 has a function of resetting the potential of the charge accumulation portion (FD). The transistor 56 has a function of controlling selection of the pixel circuit at the time of reading.

Note that the charge accumulation portion (FD) is a charge retention node and retains charge that is changed depending on the amount of light received by the photoelectric conversion element 60.

Note that the transistors 52 and 54 only need to be connected in series between the wirings 314 and 315. Thus, the wiring 314, the transistor 52, the transistor 54, and the wiring 315 may be arranged in that order, or the wiring 314, the transistor 54, the transistor 52, and the wiring 315 may be arranged in that order.

The wiring 311 (RS) functions as a signal line for controlling the transistor 53. The wiring 312 (TX) functions as a signal line for controlling the transistor 51. The wiring 313 (SE) functions as a signal line for controlling the transistor 54. The wiring 314 (GND) functions as a signal line for supplying a reference potential (e.g., GND). The wiring 315 (OUT) functions as a signal line for reading a signal output from the transistor 52. The wiring 316 functions as a signal line for outputting charge from the charge accumulation portion (FD) through the photoelectric conversion element 60 and is a low-potential line in the circuit in FIG. 21A. The wiring 317 functions as a signal line for resetting the potential of the charge accumulation portion (FD) and is a high-potential line in the circuit in FIG. 21A.

Here, relationship between the wirings in FIG. 21A and the wirings in FIG. 4A is as follows. The wiring 76 corresponds to the wiring 311 (RS). The wiring 75 corresponds to the wiring 312 (TX). The wiring 78 corresponds to the wiring 313 (SE). The wiring 79 corresponds to the wiring 314 (GND). The wiring 71 corresponds to the wiring 315 (OUT). The wiring 77 corresponds to the wiring 316.

Figure 21B:
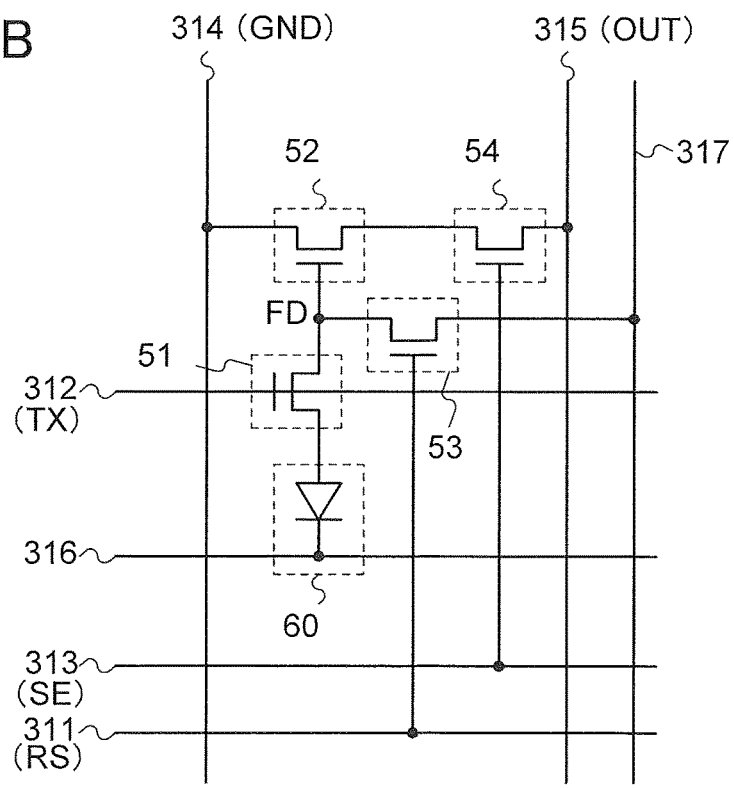

The pixel circuit in one embodiment of the present invention may have a structure in FIG. 21B. The circuit in FIG. 21B includes the same components as those in the circuit in FIG. 10 but is different from the circuit in that the anode of the photoelectric conversion element 60 is electrically connected to one of the source electrode and the drain electrode of the transistor 51 and the cathode of the photoelectric conversion element 60 is electrically connected to the wiring 316. In that case, the wiring 316 functions as a signal line for supplying charge to the charge accumulation portion (FD) through the photoelectric conversion element 60 and is a high-potential line in the circuit in FIG. 21B. Furthermore, the wiring 317 is a low-potential line.

Next, the structure of each component in FIGS. 21A and 21B is described.

As described in Embodiment 1, an element formed using a selenium-based material and a conductive layer or an element in which a PIN junction is formed using a silicon layer can be used as the photoelectric conversion element 60.

Although a silicon semiconductor such as amorphous silicon, microcrystalline silicon, polycrystalline silicon, or single crystal silicon can be used to form the transistors 51 to 54, the transistors 51 to 54 are preferably OS transistors. A transistor in which a channel formation region is formed using an oxide semiconductor has extremely low off-state current.

In particular, when the transistors 51 and 53 connected to the charge accumulation portion (FD) has high leakage current, charge accumulated in the charge accumulation portion (FD) cannot be held for a sufficiently long time. The use of OS transistors as the transistors 51 and 53 can prevent unwanted output of charge from the charge accumulation portion (FD).

Unwanted output of charge also occurs in the wiring 314 or 315 when the transistors 52 and 54 have high leakage current; thus, a transistor in which a channel formation region is formed using an oxide semiconductor is preferably used as each of these transistors.

An operation example of the circuit in FIG. 21A is described with reference to a timing chart in FIG. 22A.

In FIG. 22A, the potential of each wiring is a signal that varies between two levels for simplicity. Since each potential is an analog signal, the potential can, in practice, have various levels depending on conditions without being limited to two levels. In the drawing, a signal 701 corresponds to the potential of the wiring 311 (RS); a signal 702 corresponds to the potential of the wiring 312 (TX); a signal 703 corresponds to the potential of the wiring 313 (SE); a signal 704 corresponds to the potential of the charge accumulation portion (FD); and a signal 705 corresponds to the potential of the wiring 315 (OUT). Note that the potential of the wiring 316 is always at a low level, and the potential of the wiring 317 is always at a high level.

At time A, the potential (signal 701) of the wiring 311 is at a high level and the potential (signal 702) of the wiring 312 is at a high level, so that the potential (signal 704) of the charge accumulation portion (FD) is initialized to the potential (high level) of the wiring 317, and reset operation is started. Note that the potential (signal 705) of the wiring 315 is precharged to a high level.

At time B, the potential (signal 701) of the wiring 311 is set at a low level, so that the reset operation is terminated to start accumulation operation. Here, a reverse bias is applied to the photoelectric conversion element 60, so that the potential (signal 704) of the charge accumulation portion (FD) starts to decrease due to reverse current. Since irradiation of the photoelectric conversion element 60 with light increases the reverse current, the rate of decrease in the potential (signal 704) of the charge accumulation portion (FD) changes depending on the amount of the light irradiation. In other words, channel resistance between the source electrode and the drain electrode of the transistor 54 changes depending on the amount of light delivered to the photoelectric conversion element 60.

At time C, the potential (signal 702) of the wiring 312 is set to a low level to terminate the accumulation operation, so that the potential (signal 704) of the charge accumulation portion (FD) becomes constant. Here, the potential is determined by the amount of charge generated by the photoelectric conversion element 60 during the accumulation operation. That is, the potential changes depending on the amount of light delivered to the photoelectric conversion element 60. Furthermore, since each of the transistors 51 and 53 is a transistor that includes a channel formation region formed using an oxide semiconductor layer and has extremely low off-state current, the potential of the charge accumulation portion (FD) can be kept constant until subsequent selection operation (read operation) is performed.

Note that when the potential (signal 702) of the wiring 312 is set at a low level, the potential of the charge accumulation portion (FD) might change owing to parasitic capacitance between the wiring 312 and the charge accumulation portion (FD). In the case where the amount of change in the potential is large, the amount of charge generated by the photoelectric conversion element 60 during the accumulation operation cannot be obtained accurately. Examples of effective measures to reduce the amount of change in the potential include reducing capacitance between the gate electrode and the source electrode (or between the gate electrode and the drain electrode) of the transistor 51, increasing the gate capacitance of the transistor 52, and providing a storage capacitor in the charge accumulation portion (FD). Note that in this embodiment, the change in the potential can be ignored by taking these measures.

At time D, the potential (signal 703) of the wiring 313 is set at a high level to turn on the transistor 54, so that selection operation starts and the wirings 314 and 315 are electrically connected to each other through the transistors 52 and 54. The potential (signal 705) of the wiring 315 starts to decrease. Note that precharge of the wiring 315 is terminated before the time D. Here, the rate at which the potential (signal 705) of the wiring 315 decreases depends on current between the source electrode and the drain electrode of the transistor 52. That is, the potential (signal 705) of the wiring 315 changes depending on the amount of light delivered to the photoelectric conversion element 60 during the accumulation operation.

At time E, the potential (signal 703) of the wiring 313 is set at a low level to turn off the transistor 54, so that the selection operation is terminated and the potential (signal 705) of the wiring 315 becomes a constant value. Here, the constant value changes depending on the amount of light delivered to the photoelectric conversion element 60. Therefore, the amount of light delivered to the photoelectric conversion element 60 during the accumulation operation can be determined by measuring the potential of the wiring 315.

Specifically, when the photoelectric conversion element 60 is irradiated with light with high intensity, the potential of the charge accumulation portion (FD), that is, the gate voltage of the transistor 52 is decreased. Therefore, current flowing between the source electrode and the drain electrode of the transistor 52 becomes small; as a result, the potential (signal 705) of the wiring 315 is gradually decreased. Thus, a comparatively high potential can be read from the wiring 315.

In contrast, when the photoelectric conversion element 60 is irradiated with light with low intensity, the potential of the charge accumulation portion (FD), that is, the gate voltage of the transistor 52 is increased. Therefore, the current flowing between the source electrode and the drain electrode of the transistor 52 becomes large; as a result, the potential (signal 705) of the wiring 315 is rapidly decreased. Thus, a comparatively low potential can be read from the wiring 315.

Next, an operation example of the circuit in FIG. 21B is described with reference to a timing chart in FIG. 22B. Note that the wiring 316 is always at a high level, and the potential of the wiring 317 is always at a low level.

At time A, the potential (signal 701) of the wiring 311 is at a high level and the potential (signal 702) of the wiring 312 is at a high level, so that the potential (signal 704) of the charge accumulation portion (FD) is initialized to the potential (low level) of the wiring 317, and reset operation is started. Note that the potential (signal 705) of the wiring 315 is precharged to a high level.

At time B, the potential (signal 701) of the wiring 311 is set at a low level, so that the reset operation is terminated to start accumulation operation. Here, a reverse bias is applied to the photoelectric conversion element 60, so that the potential (signal 704) of the charge accumulation portion (FD) starts to increase due to reverse current.

The description of the timing chart in FIG. 22A can be referred to for operations at and after time C. The amount of light delivered to the photoelectric conversion element 60 during the accumulation operation can be determined by measuring the potential of the wiring 315 at time E.

Figure 26:
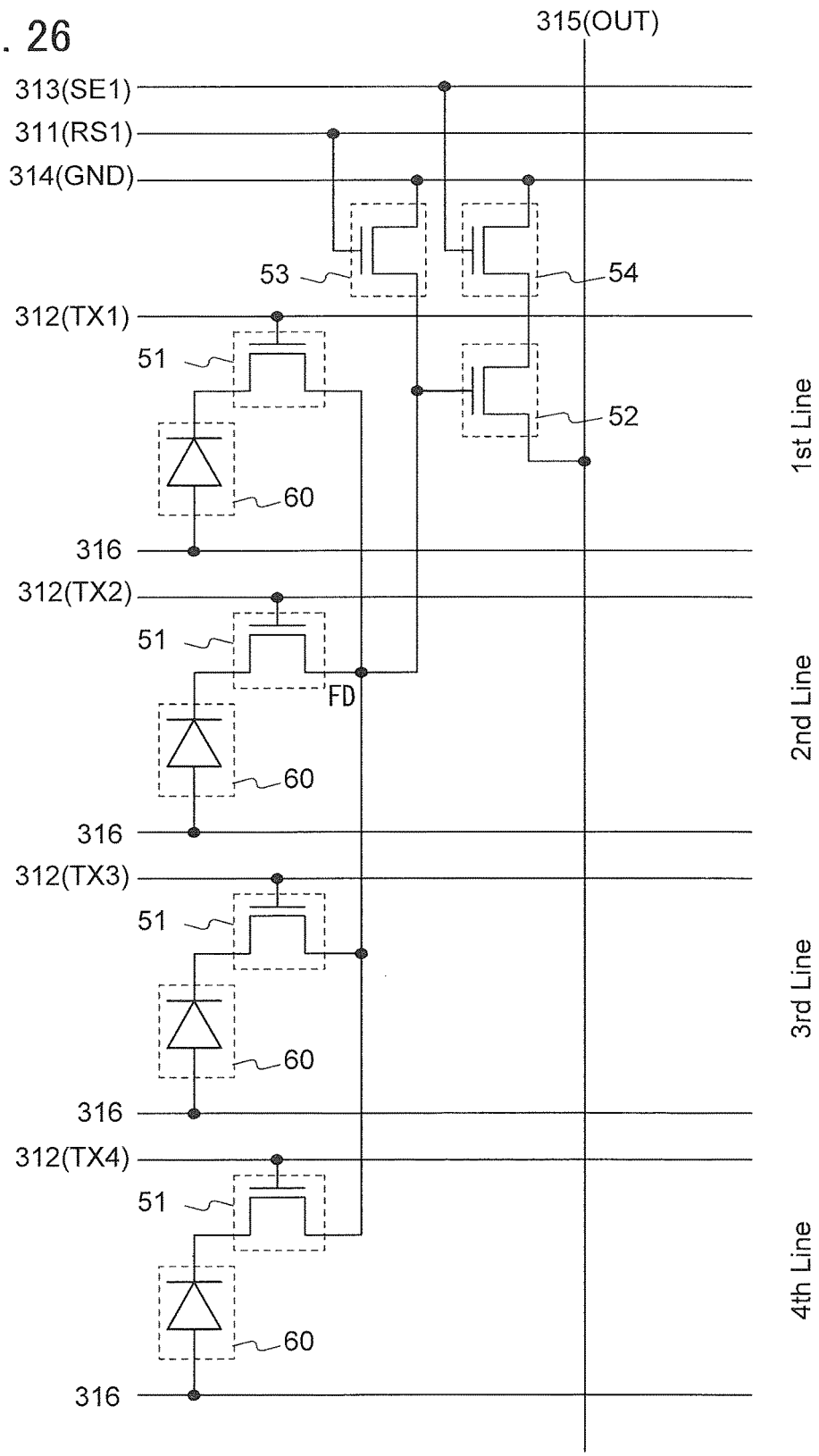
FIG. 26 illustrates the structure of a pixel circuit.

Note that the pixel circuit in FIG. 21A may have a structure in which the transistors 52 to 54 are shared among a plurality of pixels as illustrated in FIG. 26. FIG. 26 illustrates a structure in which the transistors 52 to 54 are shared among a plurality of pixels in a perpendicular direction; however, the transistors 52 to 54 may be shared among a plurality of pixels in a horizontal direction or in a horizontal and perpendicular direction. Such a structure can reduce the number of transistors included in one pixel. Although FIG. 26 illustrates a structure in which the transistors 52 to 54 are shared among four pixels, the transistors 52 to 54 may be shared among two pixels, three pixels, or five or more pixels. Furthermore, the pixel circuit in FIG. 21B can have a structure similar to that of the pixel circuit in FIG. 26.

Figure 23A:
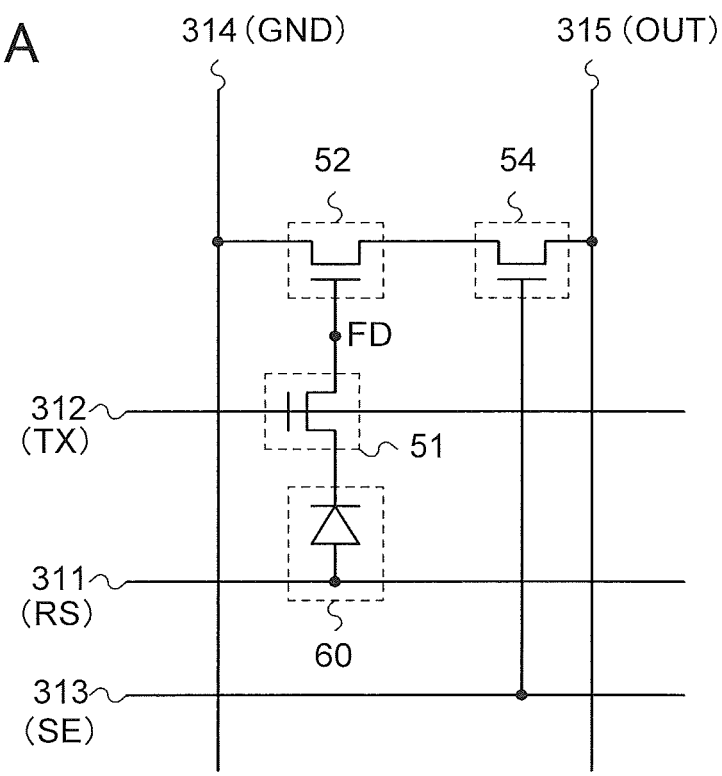
FIGS. 23A and 23B each illustrate the structure of a pixel circuit.
Figure 23B:
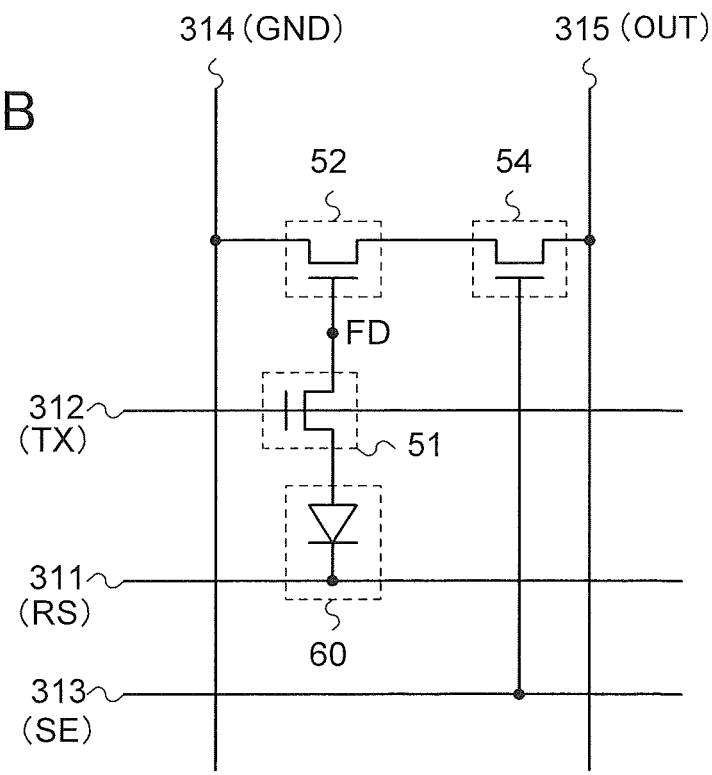

The pixel circuit in one embodiment of the present invention may have any of structures illustrated in FIGS. 23A and 23B.

The structure of a circuit in FIG. 23A is different from that of the circuit in FIG. 21A in that the transistor 53, the wiring 316, and the wiring 317 are not provided, and the wiring 311 (RS) is electrically connected to the anode of the photoelectric conversion element 60. The other structures are the same as those in the circuit in FIG. 21A.

The circuit in FIG. 23B includes the same components as those in the circuit in FIG. 23A but is different from the circuit in that the anode of the photoelectric conversion element 60 is electrically connected to one of the source electrode and the drain electrode of the transistor 52 and the cathode of the photoelectric conversion element 60 is electrically connected to the wiring 311 (RS).

Like the circuit in FIG. 21A, the circuit in FIG. 23A can be operated in accordance with the timing chart in FIG. 22A.

At time A, the potential (signal 701) of the wiring 311 is set at a high level and the potential (signal 702) of the wiring 312 is set at a high level, so that a forward bias is applied to the photoelectric conversion element 60 and the potential (signal 704) of the charge accumulation portion (FD) is set at a high level. In other words, the potential of the charge accumulation portion (FD) is initialized to the potential (high level) of the wiring 311 (RS) and brought into a reset state. The above is the start of the reset operation. Note that the potential (signal 705) of the wiring 315 is precharged to a high level.

At time B, the potential (signal 701) of the wiring 311 is set at a low level, so that the reset operation is terminated to start accumulation operation. Here, a reverse bias is applied to the photoelectric conversion element 60, so that the potential (signal 704) of the charge accumulation portion (FD) starts to decrease due to reverse current.

The description of the circuit operation in FIG. 21A can be referred to for operations at and after time C. The amount of light delivered to the photoelectric conversion element 60 during the accumulation operation can be determined by measuring the potential of the wiring 315 at time E.

The circuit in FIG. 23B can be operated in accordance with the timing chart in FIG. 22C.

At time A, the potential (signal 701) of the wiring 311 is set at a low level and the potential (signal 702) of the wiring 312 is set at a high level, so that a forward bias is applied to the photoelectric conversion element 60 and the potential (signal 704) of the charge accumulation portion (FD) is set at a low level to be in a reset state. The above is the start of the reset operation. Note that the potential (signal 705) of the wiring 315 is precharged to a high level.

At time B, the potential (signal 701) of the wiring 311 is set at a high level, so that the reset operation is terminated to start accumulation operation. Here, a reverse bias is applied to the photoelectric conversion element 60, so that the potential (signal 704) of the charge accumulation portion (FD) starts to increase due to reverse current.

The description of the circuit operation in FIG. 21A can be referred to for operations at and after time C. The amount of light delivered to the photoelectric conversion element 60 during the accumulation operation can be determined by measuring the potential of the wiring 315 at time E.

Figure 27:
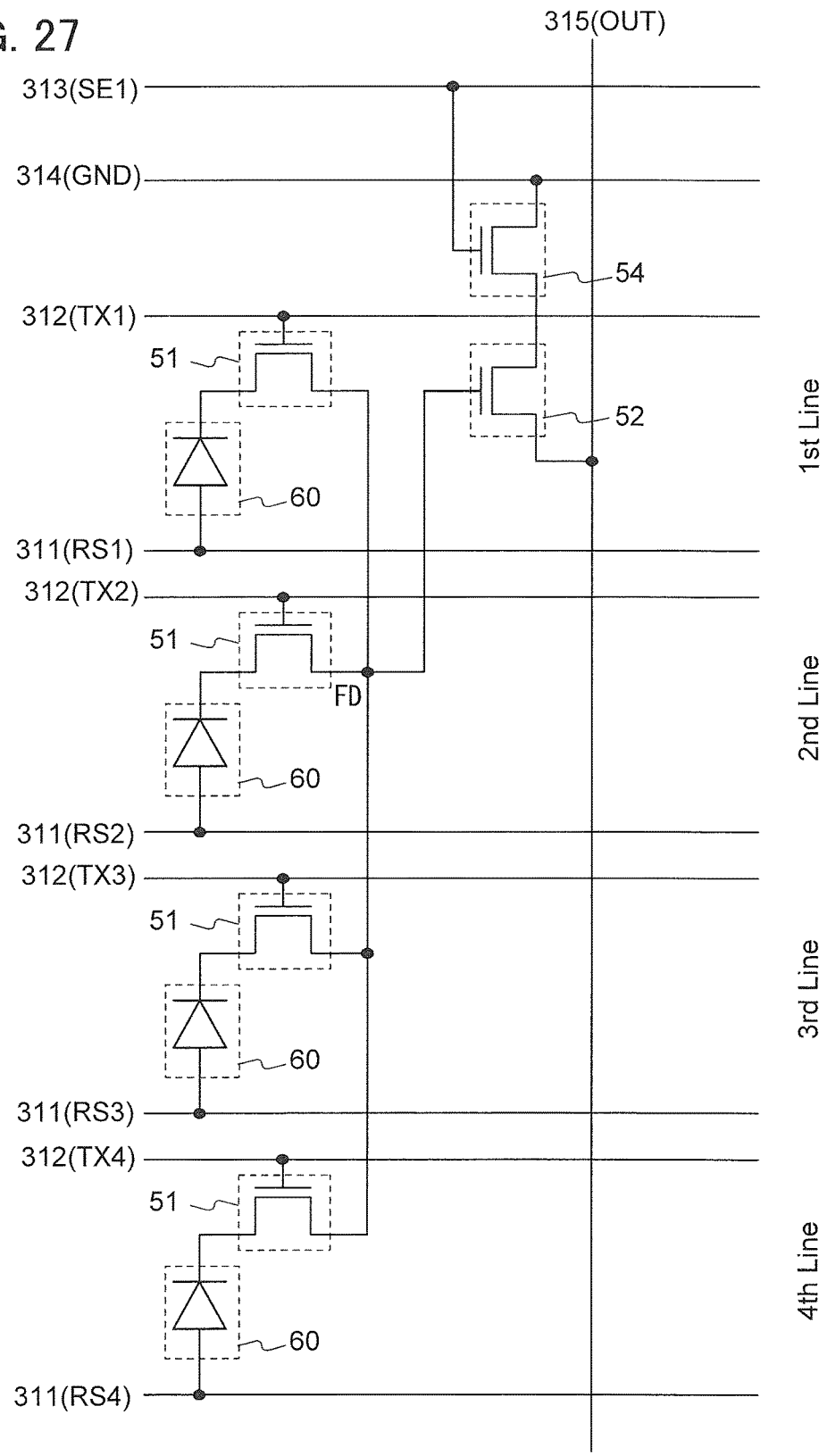
FIG. 27 illustrates the structure of a pixel circuit.

Note that the pixel circuit in FIG. 23A may have a structure in which the transistors 52 and 54 are shared among a plurality of pixels as illustrated in FIG. 27. FIG. 27 illustrates a structure in which the transistors 52 and 54 are shared among a plurality of pixels in a perpendicular direction; however, the transistors 52 and 54 may be shared among a plurality of pixels in a horizontal direction or in a horizontal and perpendicular direction. Although a structure in which the transistors 52 and 54 are shared among four pixels is illustrated in FIG. 27, the transistors 52 and 54 may be shared among two pixels, three pixels, or five or more pixels. Furthermore, the pixel circuit in FIG. 23B can have a structure similar to that of the pixel circuit in FIG. 27.

Figure 24A:
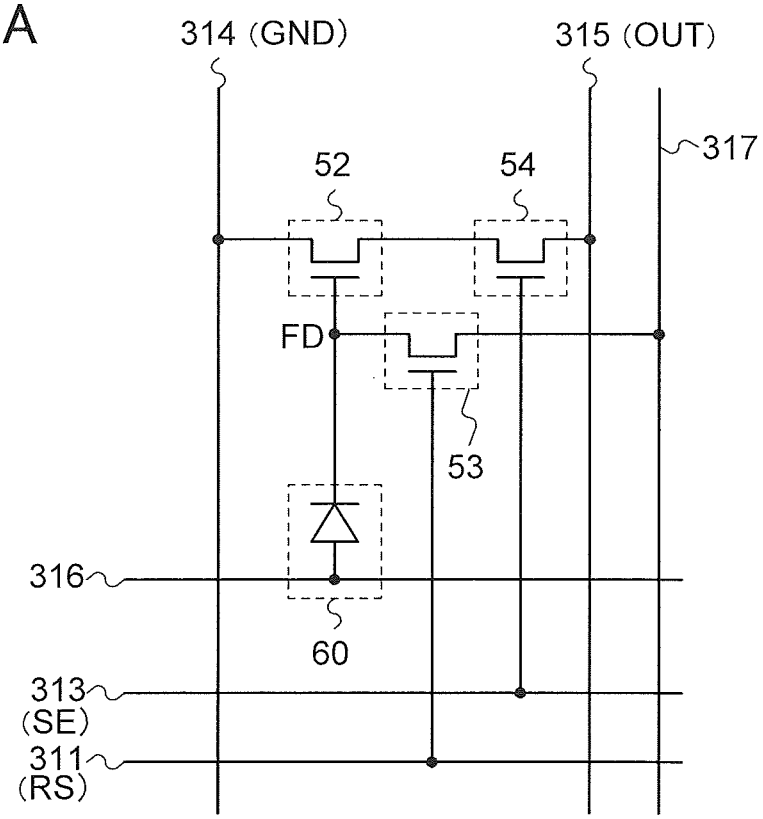
FIGS. 24A and 24B each illustrate the structure of a pixel circuit.
Figure 24B:
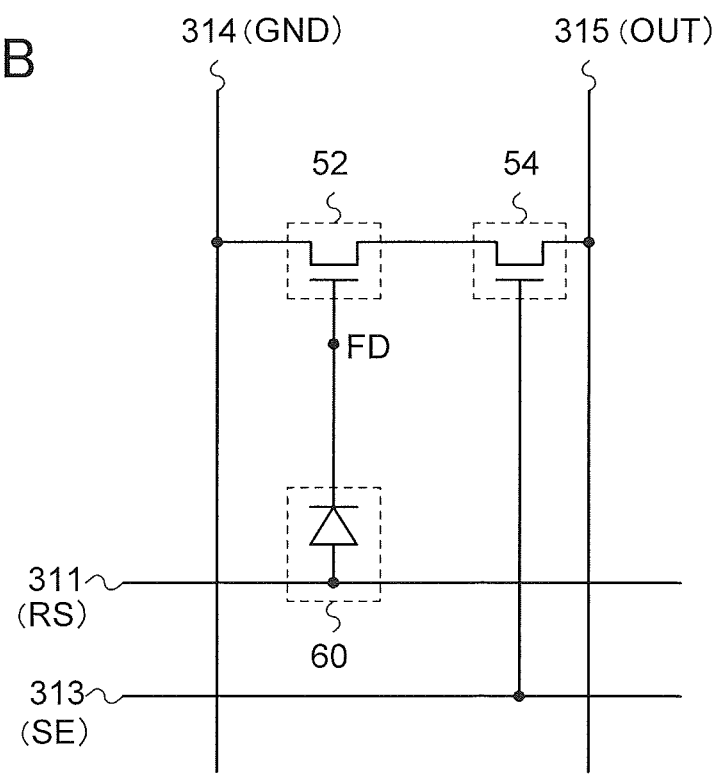

Note that FIGS. 21A and 21B and FIGS. 23A and 23B each illustrate the example in which the transistor 51 is provided; however, one embodiment of the present invention is not limited thereto. As illustrated in FIGS. 24A and 24B, the transistor 51 can be omitted.

Figure 25A:
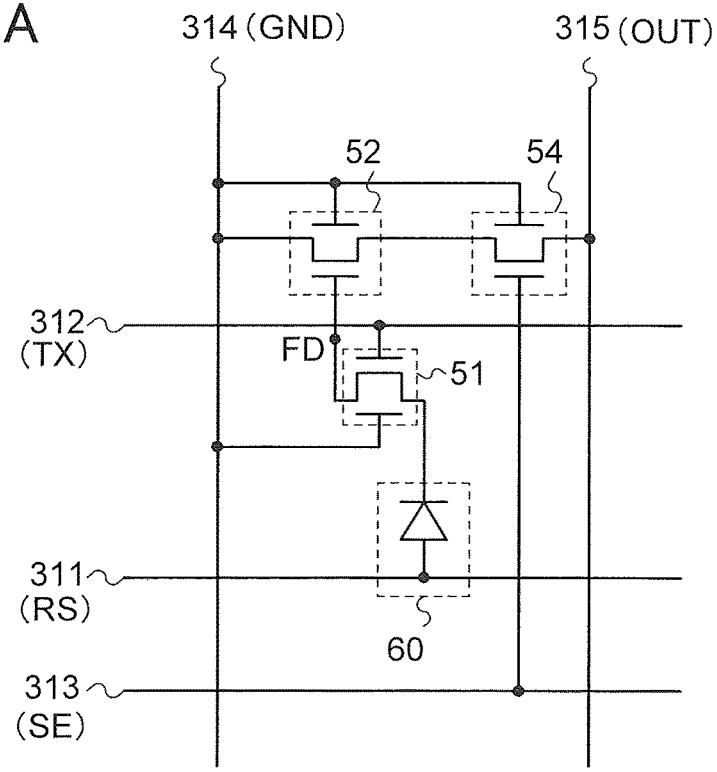
FIGS. 25A and 25B each illustrate the structure of a pixel circuit.
Figure 25B:
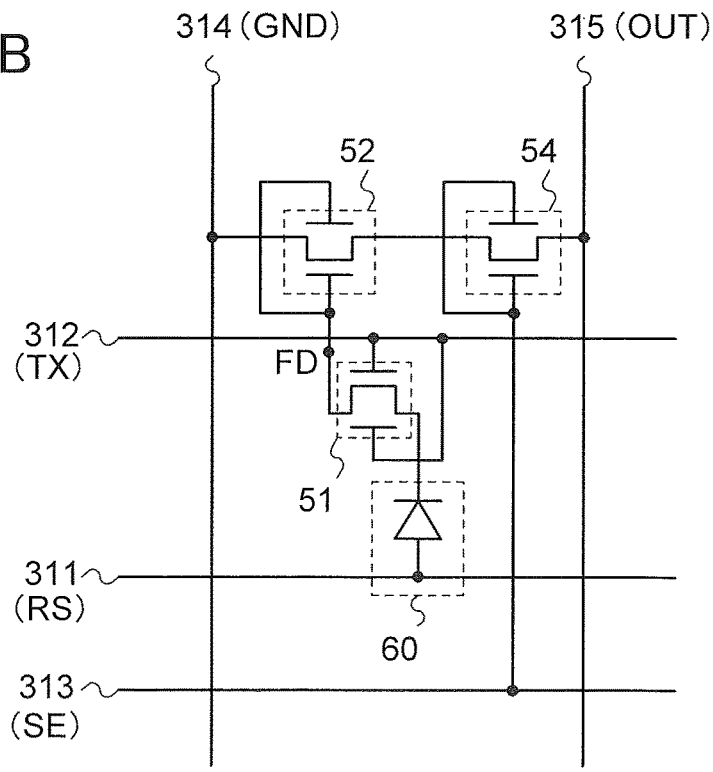

The transistors 51, 52, and 54 in the pixel circuit may each include a back gate as illustrated in FIGS. 25A and 25B. FIG. 25A illustrates a structure in which a constant potential is applied to the back gates, which enables control of the threshold voltage. FIG. 25B illustrates a structure in which the back gates are supplied with the same potential as front gates, which enables an increase in on-state current. Although the back gates are electrically connected to the wiring 314 (GND) in FIG. 25A, the back gates may be electrically connected to a different wiring to which a constant potential is applied. Furthermore, although FIGS. 25A and 25B each illustrate an example in which back gates are provided in the transistors of the circuit in FIG. 23A, the circuits in FIGS. 21A and 21B, FIG. 23B, and FIGS. 24A and 24B may have similar structures. Moreover, a structure in which the same potential is applied to a front gate and a back gate, a structure in which a constant potential is applied to a back gate, and a structure without a back gate may be optionally combined as necessary for the transistors included in one circuit.

Figure 28:
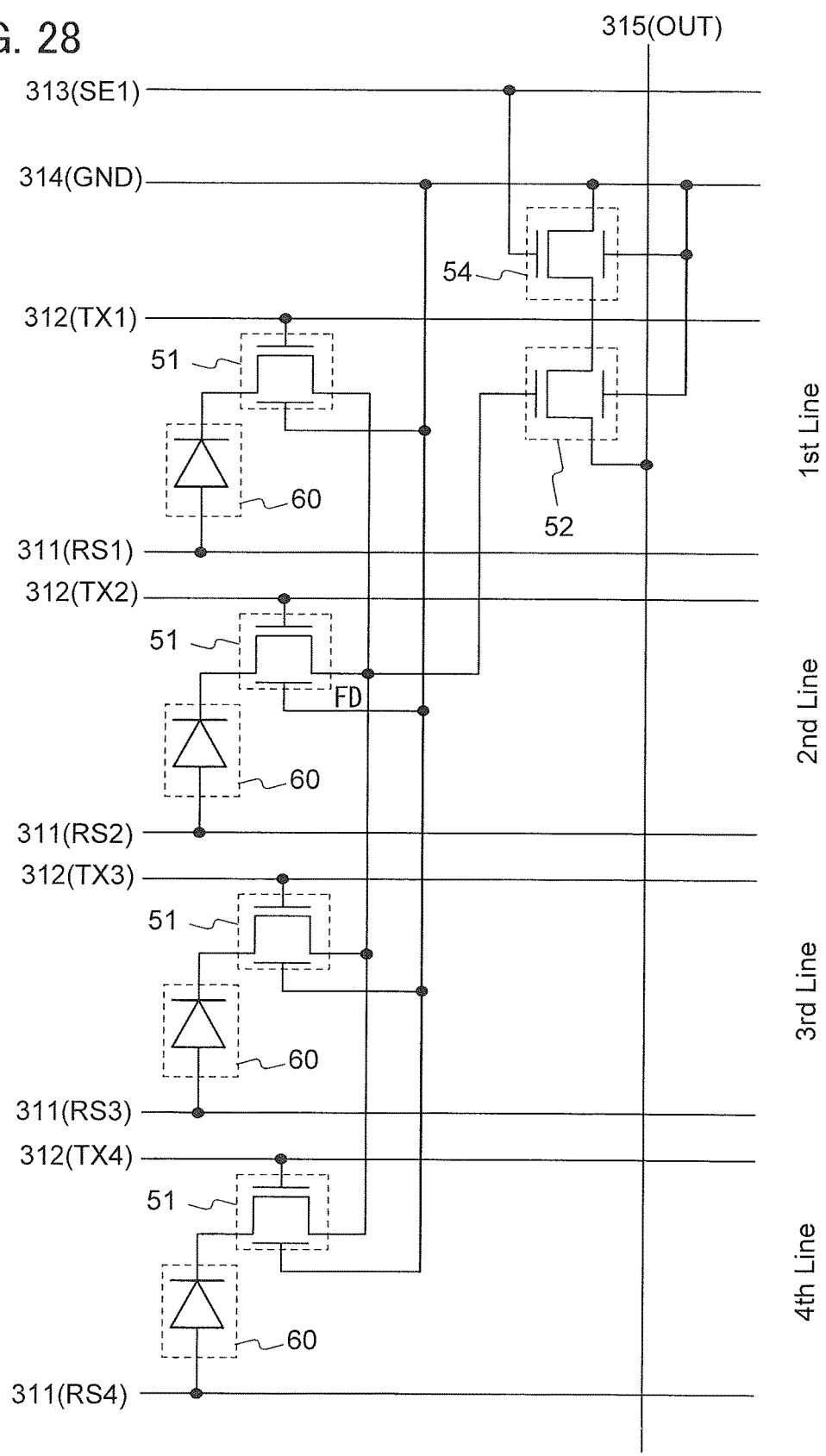
FIG. 28 illustrates the structure of a pixel circuit.
Figure 29:
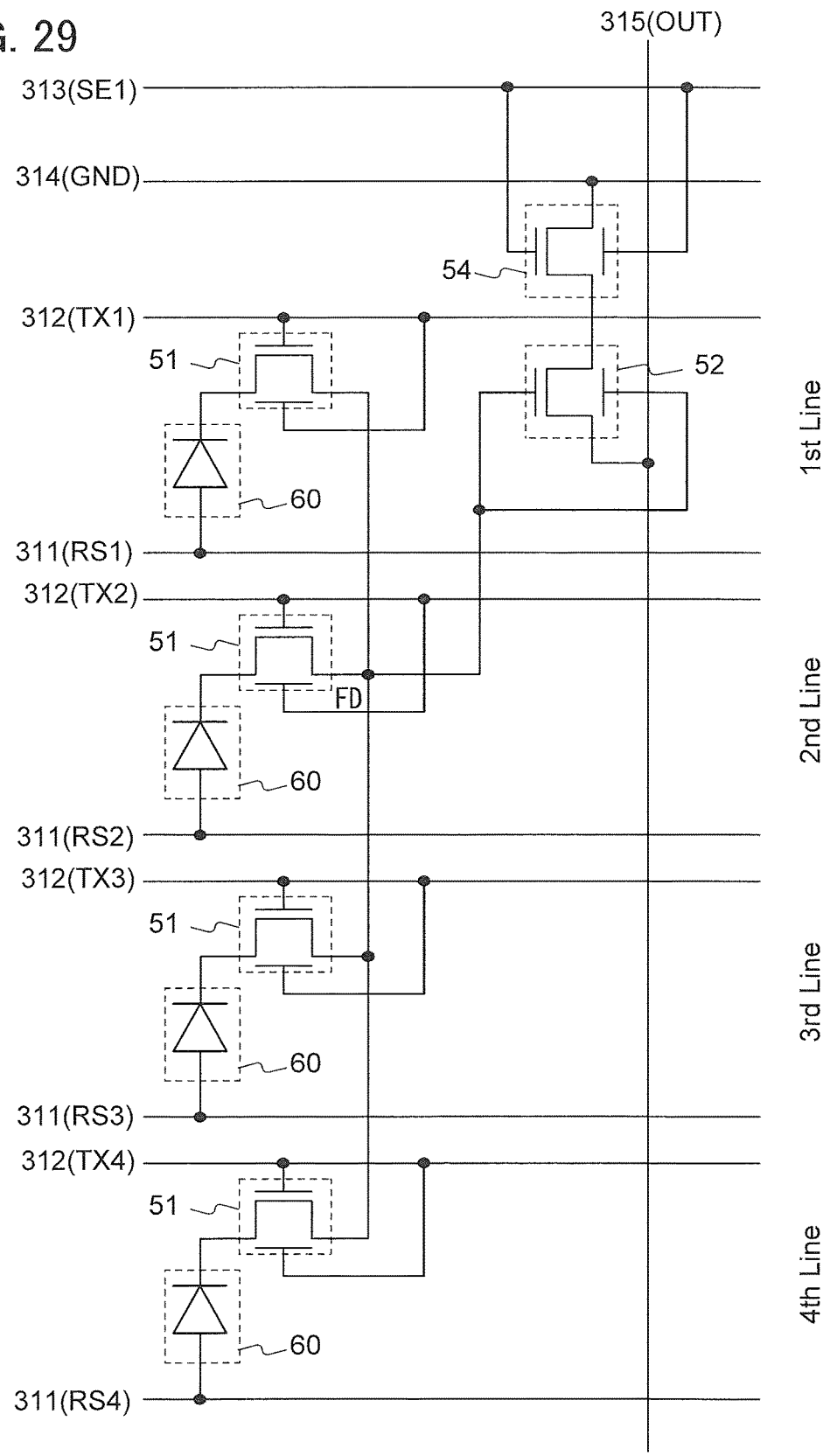
FIG. 29 illustrates the structure of a pixel circuit.

Note that the pixel circuit in FIG. 25A may have a structure in which the transistors 51 and 54 are shared among a plurality of pixels as illustrated in FIG. 28. Furthermore, the pixel circuit in FIG. 25B may have a structure in which the transistors 52 and 54 are shared among a plurality of pixels as illustrated in FIG. 29.

This embodiment can be combined with any of the structures described in the other embodiments as appropriate.

Embodiment 3

In this embodiment, details of the global shutter system and the rolling shutter system that are described in Embodiment 1 are described.

As described in Embodiment 2, the operation of the pixel circuit is repetition of the reset operation, the accumulation operation, and the selection operation. As imaging modes in which the whole pixel matrix is controlled, a global shutter system and a rolling shutter system are known.

FIG. 30A is a timing chart of a global shutter system. FIG. 30A illustrates operation of an imaging device in which a plurality of pixel circuits in FIG. 21A are arranged in a matrix. Specifically, FIG. 30A illustrates operation of the pixel circuits from a first row to an n-th row (n is a natural number of 3 or more). The following description for operation can be applied to any of the circuits in FIG. 21B, FIGS. 23A and 23B, and FIGS. 24A and 24B.

In FIG. 30A, a signal 501, a signal 502, and a signal 503 are input to the wirings 311 (RS) connected to the pixel circuits in the first row, the second row, and the n-th row, respectively. A signal 504, a signal 505, and a signal 506 are input to the wirings 312 (TX) connected to the pixel circuits in the first row, the second row, and the n-th row, respectively. A signal 507, a signal 508, and a signal 509 are input to the wirings 313 (SE) connected to the pixel circuits in the first row, the second row, and the n-th row, respectively.

A period 510 is a period required for one imaging. In a period 511, the pixel circuits in each row perform the reset operation at the same time. In a period 520, the pixel circuits in each row perform the accumulation operation at the same time. The selection operation is sequentially performed in the pixel circuits in each row. For example, in a period 531, the selection operation is performed in the pixel circuits in the first row. As described above, in the global shutter system, the reset operation is performed in all the pixel circuits substantially at the same time, the accumulation operation is performed in all the pixel circuits substantially at the same time, and then the read operation is sequentially performed for each row.

That is, in the global shutter system, since the accumulation operation is performed in all the pixel circuits substantially at the same time, imaging is simultaneously performed in the pixel circuits in all the rows. Therefore, an image with little distortion can be obtained even in the case of a moving object.

FIG. 30B is a timing chart of the case using a rolling shutter system. The description of FIG. 30A can be referred to for the signals 501 to 509. A period 610 is a period required for one imaging. A period 611, a period 612, and a period 613 are reset periods in the first row, the second row, and the n-th row, respectively. A period 621, a period 622, and a period 623 are accumulation operation periods in the first row, the second row, and the n-th row, respectively. A period 631 is a period in which the pixels in the first row perform selection operation. As described above, in the rolling shutter system, the accumulation operation is not performed at the same time in all the pixel circuits but is sequentially performed in all the rows; thus, imaging is not simultaneously performed in the pixel circuits in all the rows. Therefore, the tuning of imaging in the first row is different from that of imaging in the last row, and thus an image with large distortion is obtained in the case of a moving object.

To achieve the global shutter system, the potential of a charge accumulation portion (FD) needs to be held for a long time until sequential reading of signals from the pixels is terminated. When a transistor including a channel formation region formed using an oxide semiconductor and having extremely low off-state current is used as the transistor 53 or the like, the potential of charge accumulation portion (FD) can be held for a long time. In the case where a transistor including a channel formation region formed using silicon or the like is used as the transistor 53 or the like, the potential of the charge accumulation portion (FD) cannot be held for a long time because of high off-state current, which makes it difficult to use the global shutter system.

As described above, the use of the transistor in which a channel formation region is formed using an oxide semiconductor for the pixel circuits makes it easy to achieve the global shutter system.

This embodiment can be combined with any of the structures described in the other embodiments as appropriate.

Embodiment 4

In this embodiment, a transistor including an oxide semiconductor that can be used in one embodiment of the present invention is described with reference to drawings. In the drawings in this embodiment, some components are enlarged, reduced in size, or omitted for easy understanding.

Figure 31A:
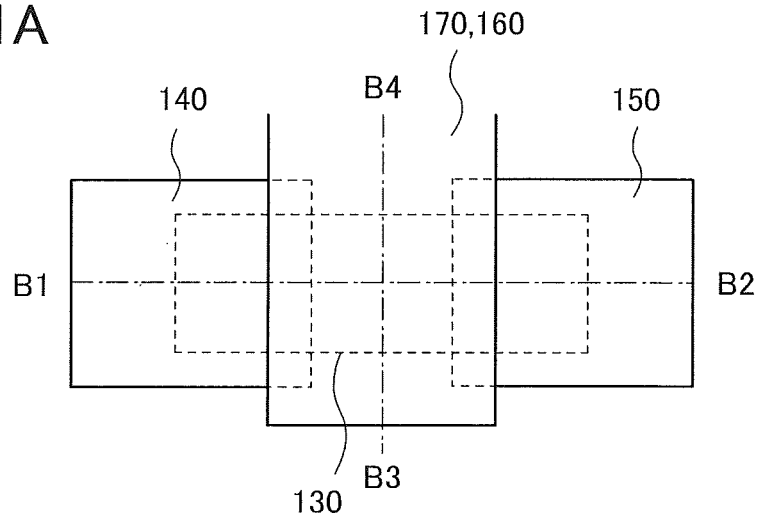
FIGS. 31A and 31B are a top view and a cross-sectional view illustrating a transistor.
Figure 31B:
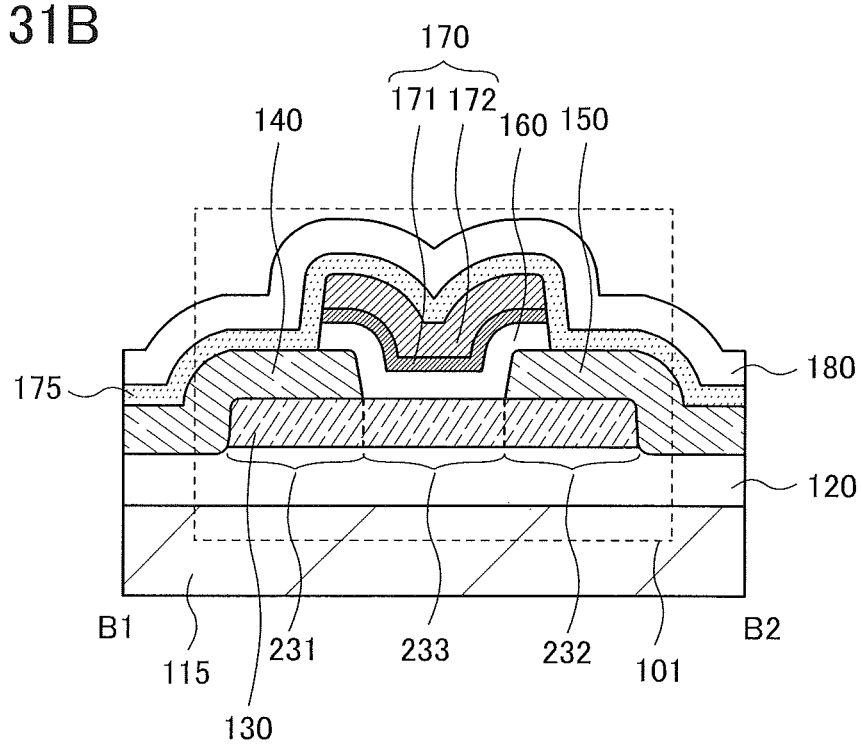
Figure 37A:
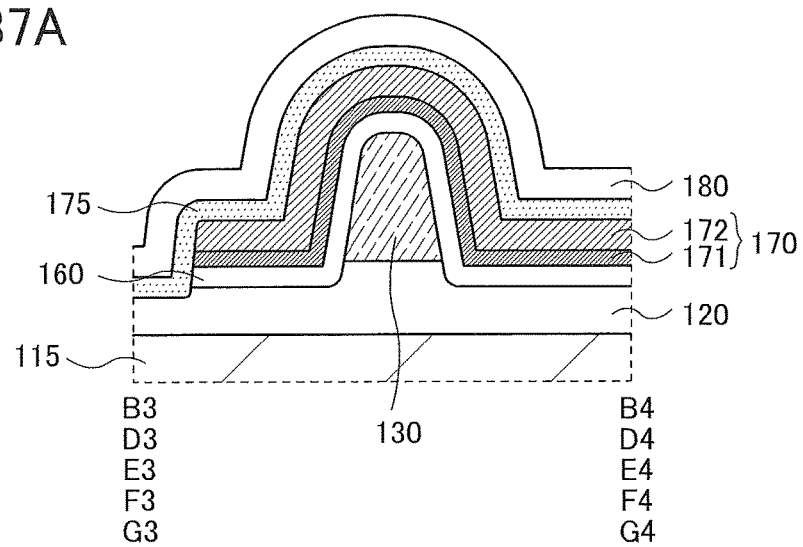
FIGS. 37A to 37D each illustrate a cross section of a transistor in a channel width direction.

FIGS. 31A and 31B are a top view and a cross-sectional view illustrating a transistor 101 in one embodiment of the present invention. FIG. 31A is a top view, and a cross section in the direction of dashed-dotted line B1-B2 in FIG. 31A is illustrated in FIG. 31B. A cross section in the direction of dashed-dotted line B3-B4 in FIG. 31A is illustrated in FIG. 37A. The direction of dashed-dotted line B1-B2 is referred to as a channel length direction, and the direction of dashed-dotted line B3-B4 is referred to as a channel width direction.

The transistor 101 includes an insulating layer 120 in contact with a substrate 115; an oxide semiconductor layer 130 in contact with the insulating layer 120; conductive layers 140 and 150 electrically connected to the oxide semiconductor layer 130; an insulating layer 160 in contact with the oxide semiconductor layer 130 and the conductive layers 140 and 150; a conductive layer 170 in contact with the insulating layer 160; an insulating layer 175 in contact with the conductive layers 140 and 150, the insulating layer 160, and the conductive layer 170; and an insulating layer 180 in contact with the insulating layer 175. The insulating layer 180 may function as a planarization film as necessary.

Here, the conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 31B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layers 140 and 150, the resistance of the regions 231 and 232 can be reduced.

Specifically, since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions 231 and 232 to n-type regions with low resistance.

Note that functions of a "source" and a "drain" of a transistor are sometimes interchanged with each other when a transistor of an opposite conductivity type is used or when the direction of current flow is changed in circuit operation, for example. Therefore, the terms "source" and "drain" can be interchanged with each other in this specification. In addition, the term "electrode layer" can be changed into the term "wiring."

The conductive layer 170 includes two layers, conductive layers 171 and 172, but also may be a single layer or a stack of three or more layers. The same applies to other transistors described in this embodiment.

Each of the conductive layers 140 and 150 is a single layer, but also may be a stack of two or more layers. The same applies to other transistors described in this embodiment.

Figure 32A:
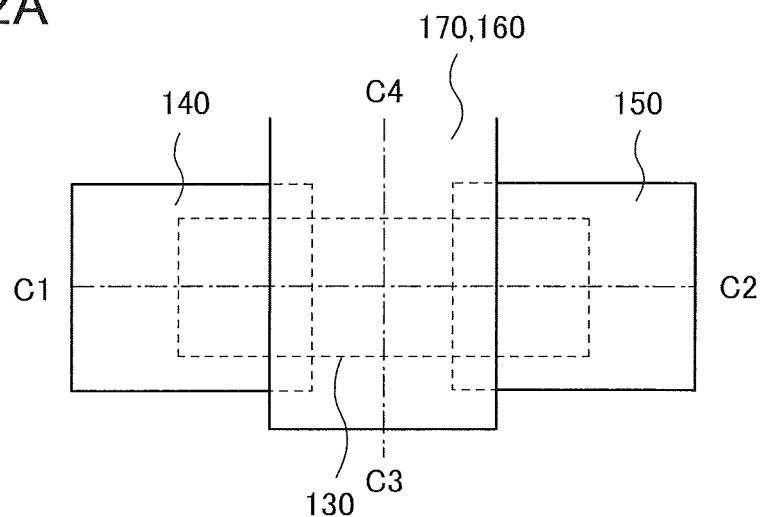
FIGS. 32A and 32B are a top view and a cross-sectional view illustrating a transistor.
Figure 32B:
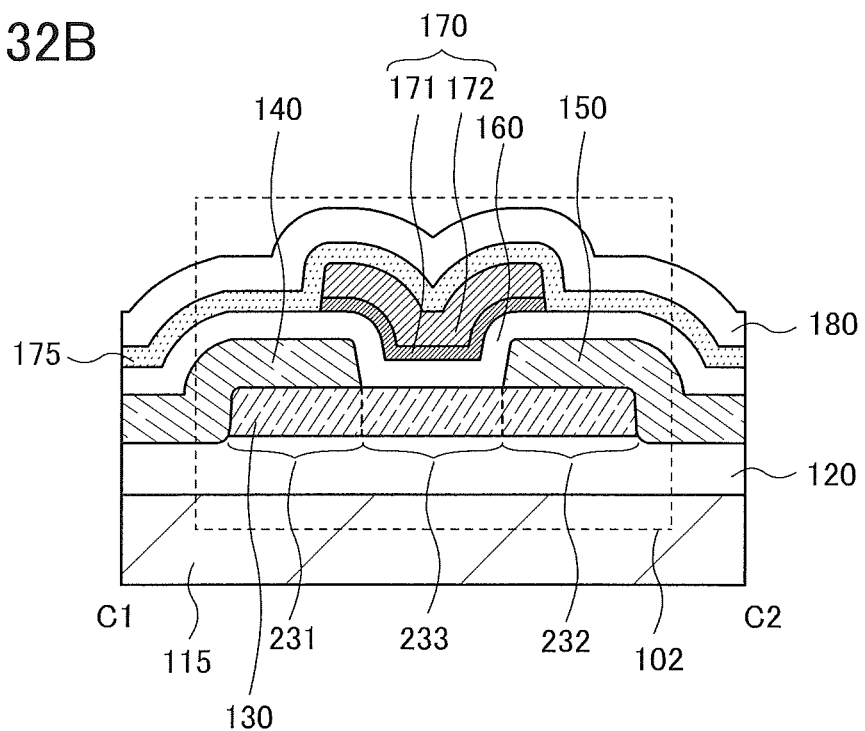
Figure 37B:
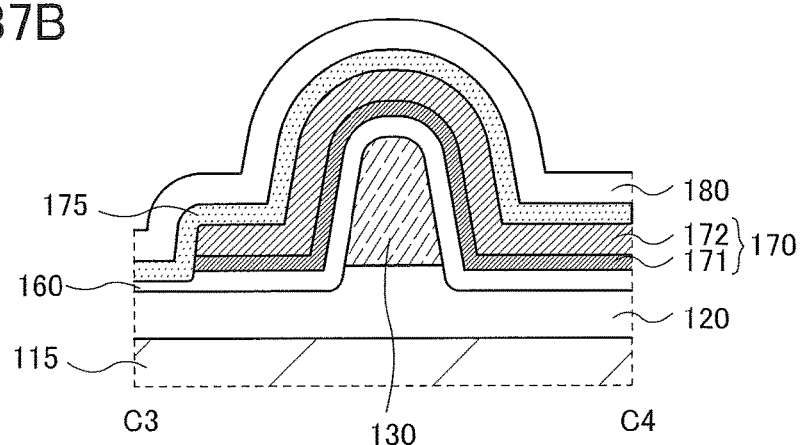

The transistor in one embodiment of the present invention may have a structure illustrated in FIGS. 32A and 32B. FIG. 32A is a top view of a transistor 102. A cross section in the direction of dashed-dotted line C1-C2 in FIG. 32A is illustrated in FIG. 32B. A cross section in the direction of dashed-dotted line C3-C4 in FIG. 32A is illustrated in FIG. 37B. The direction of dashed-dotted line C1-C2 is referred to as a channel length direction, and the direction of dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layers 140 and 150 are covered with the insulating layer 160 and accordingly the resistance between the conductive layer 170 and the conductive layers 140 and 150 is high; therefore, the transistor 102 has low gate leakage current.

The transistors 101 and 102 each have a top-gate structure including a region where the conductive layer 170 overlaps with the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with high on-state current can be easily formed.

Figure 33A:
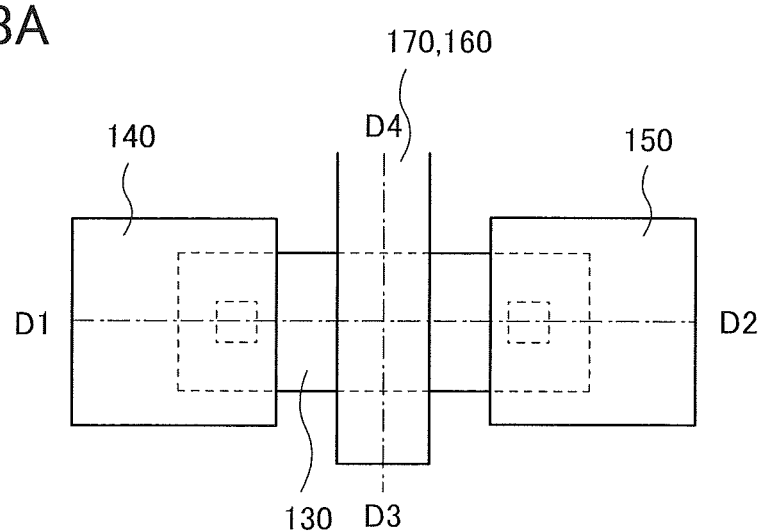
FIGS. 33A and 33B are a top view and a cross-sectional view illustrating a transistor.
Figure 33B:
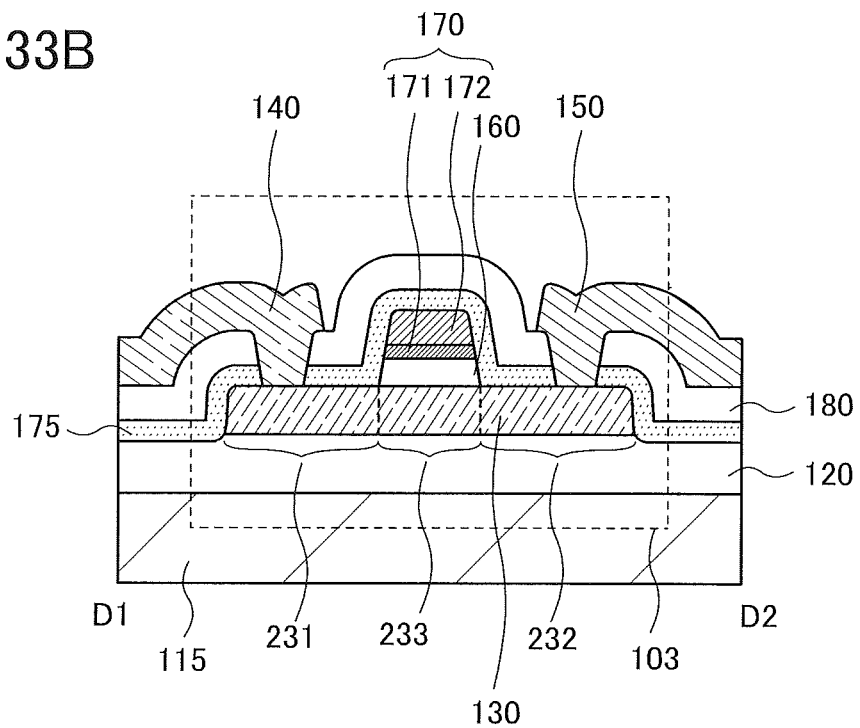

The transistor in one embodiment of the present invention may have a structure illustrated in FIGS. 33A and 33B. FIG. 33A is a top view of a transistor 103. A cross section in the direction of dashed-dotted line D1-D2 in FIG. 33A is illustrated in FIG. 33B. A cross section in the direction of dashed-dotted line D3-D4 in FIG. 33A is illustrated in FIG. 37A. The direction of dashed-dotted line D1-D2 is referred to as a channel length direction, and the direction of dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layers 140 and 150 electrically connected to the oxide semiconductor layer 130 through openings provided in the insulating layers 175 and 180. The transistor 103 may further include, for example, an insulating layer (planarization film) in contact with the insulating layer 180 and the conductive layers 140 and 150 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 33B can function as a source region, a drain region, and a channel formation region, respectively. The regions 231 and 232 are in contact with the insulating layer 175. When an insulating material containing hydrogen is used for the insulating layer 175, for example, the resistance of the regions 231 and 232 can be reduced.

Specifically, interaction between an oxygen vacancy generated in the regions 231 and 232 by the steps up to formation of the insulating layer 175 and hydrogen that diffuses into the regions 231 and 232 from the insulating layer 175 changes the regions 231 and 232 to n-type regions with low resistance. As the insulating material containing hydrogen, for example, silicon nitride, aluminum nitride, or the like can be used.

Figure 34A:
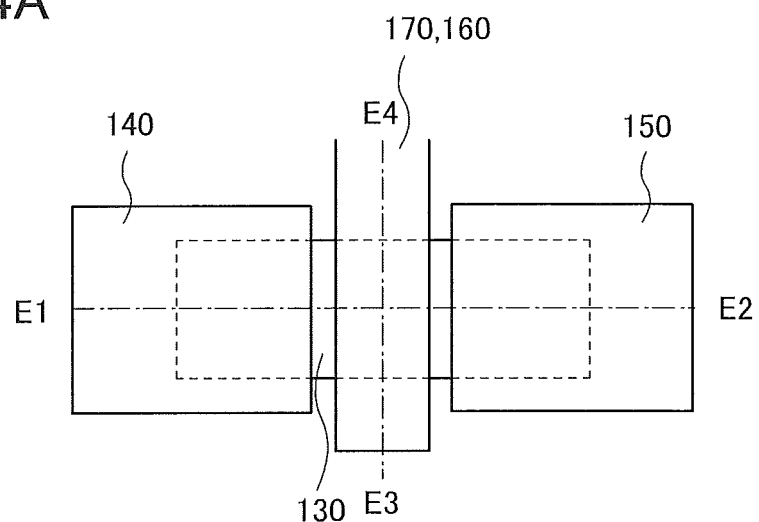
FIGS. 34A and 34B are a top view and a cross-sectional view illustrating a transistor.
Figure 34B:
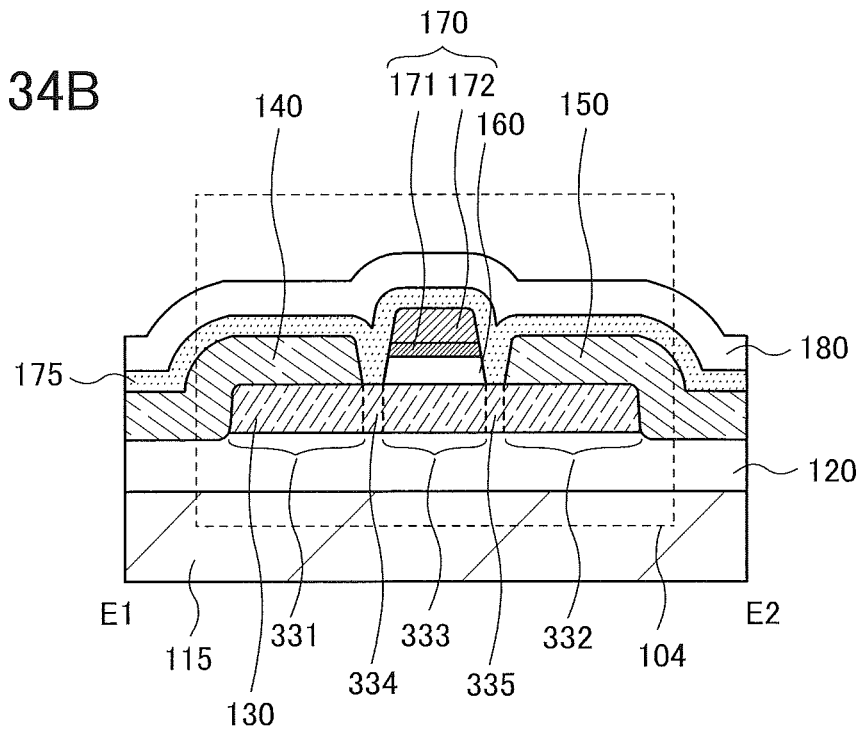

The transistor in one embodiment of the present invention may have a structure illustrated in FIGS. 34A and 34B. FIG. 34A is a top view of a transistor 104. A cross section in the direction of dashed-dotted line E1-E2 in FIG. 34A is illustrated in FIG. 34B. A cross section in the direction of dashed-dotted line E3-E4 in FIG. 34A is illustrated in FIG. 37A. The direction of dashed-dotted line E1-E2 is referred to as a channel length direction, and the direction of dashed-dotted line E3-E4 is referred to as a channel width direction.

The transistor 104 has the same structure as the transistor 103 except that the conductive layers 140 and 150 in contact with the oxide semiconductor layer 130 cover end portions of the oxide semiconductor layer 130.

In FIG. 34B, regions 331 and 334 can function as a source region, regions 332 and 335 can function as a drain region, and a region 333 can function as a channel formation region.

The resistance of the regions 331 and 332 can be reduced in a manner similar to that of the regions 231 and 232 in the transistor 101.

The resistance of the regions 334 and 335 can be reduced in a manner similar to that of the regions 231 and 232 in the transistor 103. In the case where the length of the regions 334 and 335 in the channel length direction is less than or equal to 100 nm, preferably less than or equal to 50 nm, a gate electric field prevents a significant decrease in on-state current. Therefore, a reduction in resistance of the regions 334 and 335 is not performed in some cases.

The transistors 103 and 104 each have a self-aligned structure that does not include a region where the conductive layer 170 overlaps with the conductive layers 140 and 150. A transistor with a self-aligned structure, which has extremely low parasitic capacitance between a gate electrode layer and source and drain electrode layers, is suitable for applications that require high-speed operation.

Figure 35A:
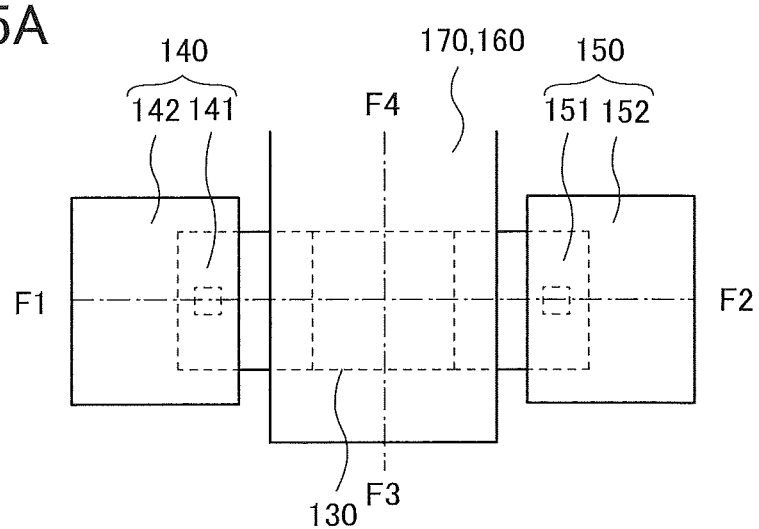
FIGS. 35A and 35B are a top view and a cross-sectional view illustrating a transistor.
Figure 35B:
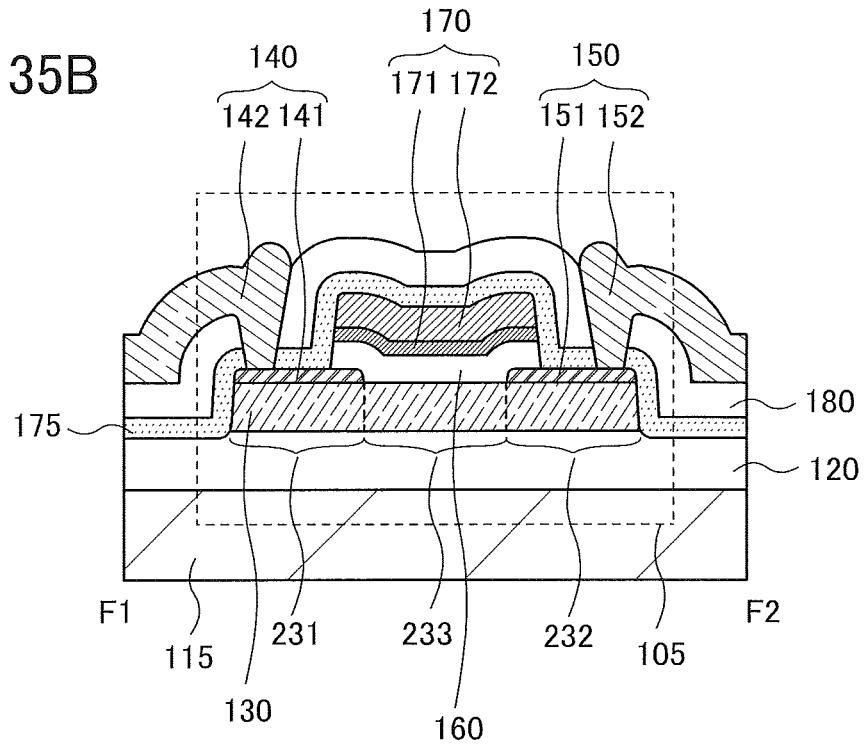

The transistor in one embodiment of the present invention may have a structure illustrated in FIGS. 35A and 35B. FIG. 35A is a top view of a transistor 105. A cross section in the direction of dashed-dotted line F1-F2 in FIG. 35A is illustrated in FIG. 35B. A cross section in the direction of dashed-dotted line F3-F4 in FIG. 35A is illustrated in FIG. 37A. The direction of dashed-dotted line F1-F2 is referred to as a channel length direction, and the direction of dashed-dotted line F3-F4 is referred to as a channel width direction.

The transistor 105 includes the insulating layer 120 in contact with the substrate 115; the oxide semiconductor layer 130 in contact with the insulating layer 120; conductive layers 141 and 151 electrically connected to the oxide semiconductor layer 130; the insulating layer 160 in contact with the oxide semiconductor layer 130 and the conductive layers 141 and 151; the conductive layer 170 in contact with the insulating layer 160; the insulating layer 175 in contact with the oxide semiconductor layer 130, the conductive layers 141 and 151, the insulating layer 160, and the conductive layer 170; the insulating layer 180 in contact with the insulating layer 175; and conductive layers 142 and 152 electrically connected to the conductive layers 141 and 151, respectively, through openings provided in the insulating layers 175 and 180. The transistor 105 may further include, for example, an insulating layer in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 105 has the same structure as the transistor 101 except that the conductive layers 141 and 151 are provided, that openings are provided in the insulating layers 175 and 180, and that the conductive layers 142 and 152 electrically connected to the conductive layers 141 and 151, respectively, through the openings are provided. The conductive layer 140 (the conductive layers 141 and 142) can function as a source electrode layer, and the conductive layer 150 (the conductive layers 151 and 152) can function as a drain electrode layer.

Figure 36A:
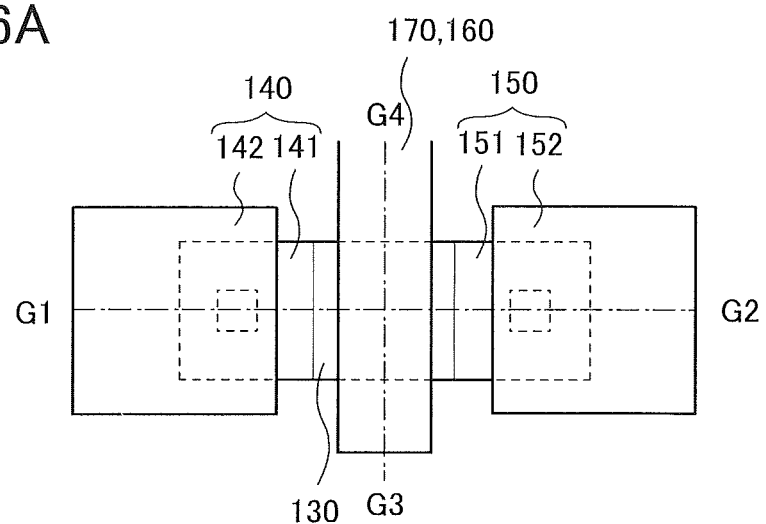
FIGS. 36A and 36B are a top view and a cross-sectional view illustrating a transistor.
Figure 36B:
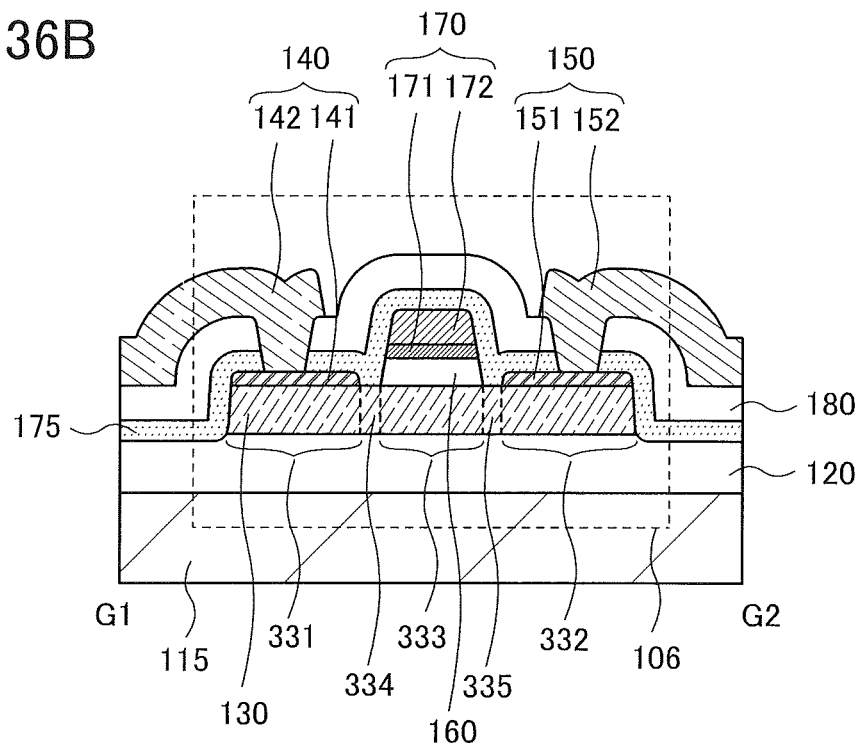

The transistor in one embodiment of the present invention may have a structure illustrated in FIGS. 36A and 36B. FIG. 36A is a top view of a transistor 106. A cross section in the direction of dashed-dotted line G1-G2 in FIG. 36A is illustrated in FIG. 36B. A cross section in the direction of dashed-dotted line G3-G4 in FIG. 36A is illustrated in FIG. 37A. The direction of dashed-dotted line G1-G2 is referred to as a channel length direction, and the direction of dashed-dotted line G3-G4 is referred to as a channel width direction.

The transistor 106 includes the insulating layer 120 in contact with the substrate 115; the oxide semiconductor layer 130 in contact with the insulating layer 120; the conductive layers 141 and 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 106 may further include, for example, an insulating layer (planarization film) in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 106 has the same structure as the transistor 103 except that the conductive layers 141 and 151 are provided. The conductive layer 140 (the conductive layers 141 and 142) can function as a source electrode layer, and the conductive layer 150 (the conductive layers 151 and 152) can function as a drain electrode layer.

In the structures of the transistors 105 and 106, the conductive layers 140 and 150 are not in contact with the insulating layer 120. These structures make the insulating layer 120 less likely to be deprived of oxygen by the conductive layers 140 and 150 and facilitate oxygen supply from the insulating layer 120 to the oxide semiconductor layer 130.

An impurity for forming an oxygen vacancy to increase conductivity may be added to the regions 231 and 232 in the transistor 103 and the regions 334 and 335 in the transistors 104 and 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property in a manner similar to the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 37C:
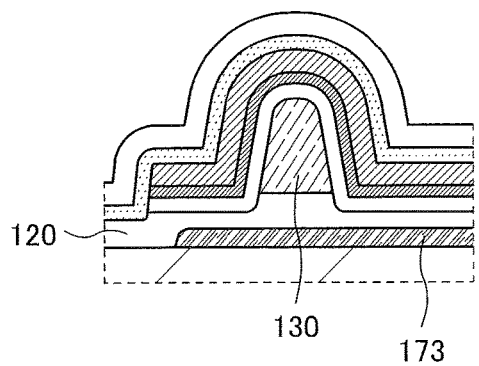
Figure 37D:
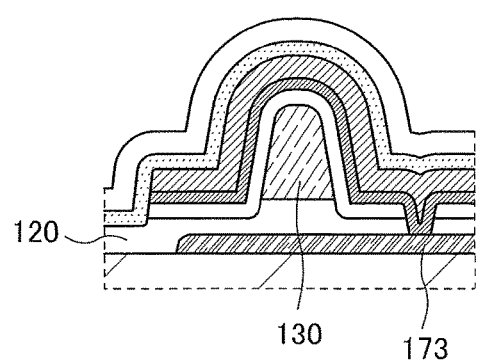
Figure 38A:
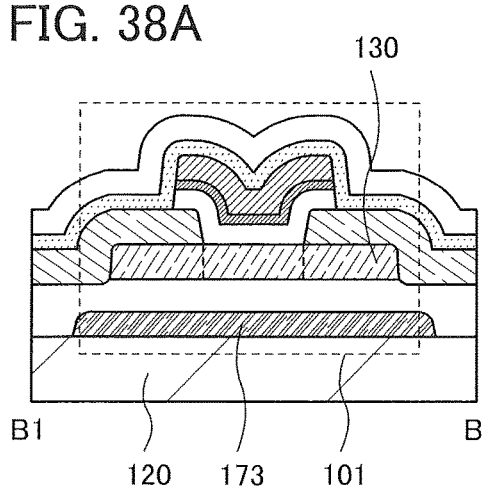
FIGS. 38A to 38F each illustrate a cross section of a transistor in a channel length direction.
Figure 38B:
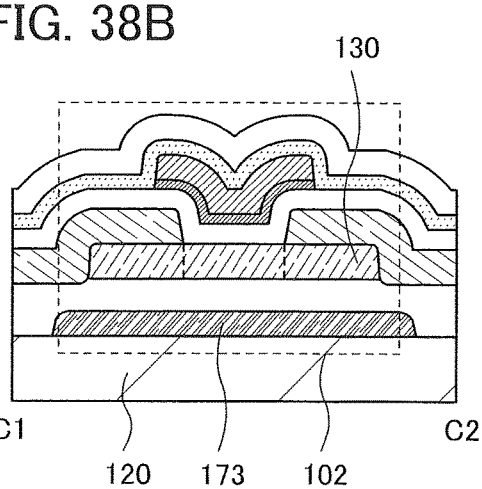
Figure 38C:
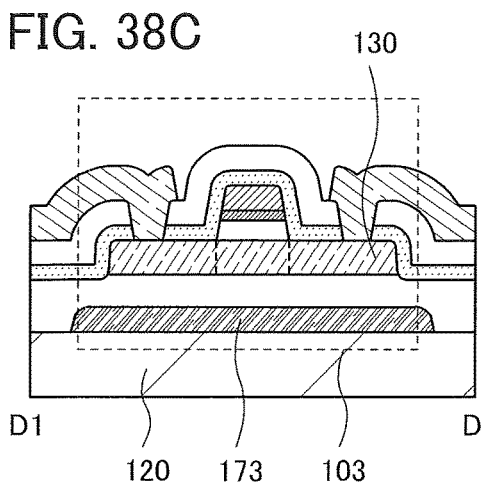
Figure 38D:
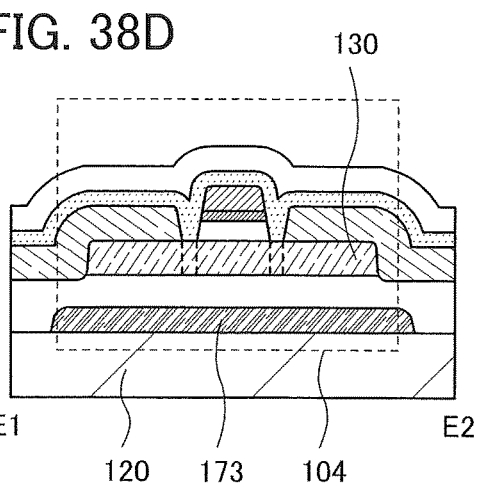
Figure 38E:
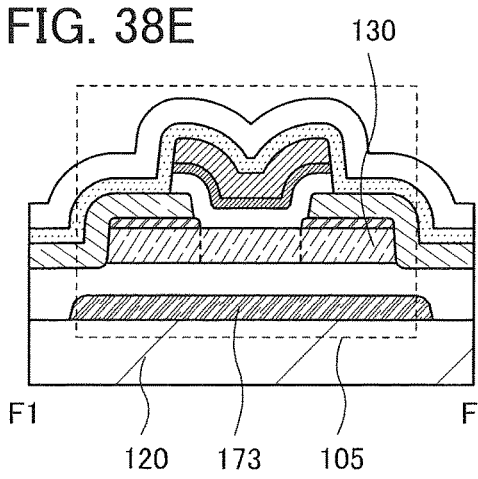
Figure 38F:
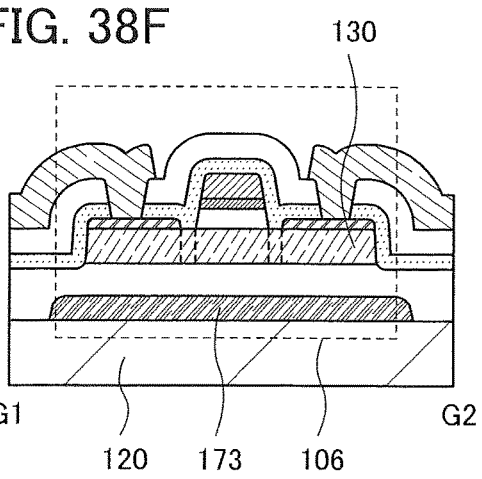

The transistor in one embodiment of the present invention may include a conductive layer 173 between the oxide semiconductor layer 130 and the substrate 115 as illustrated in cross-sectional views in the channel length direction in FIGS. 38A to 38F and cross-sectional views in the channel width direction in FIGS. 37C and 37D. When the conductive layer 173 is used as a second gate electrode layer (back gate), the on-state current can be increased or the threshold voltage can be controlled. In the cross-sectional views in FIGS. 38A to 38F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is applied to the conductive layer 173. To set the conductive layers 170 and 173 at the same potential, for example, as illustrated in FIG. 37D, the conductive layers 170 and 173 may be electrically connected to each other through a contact hole.

Although the transistors 101 to 106 in FIGS. 31A and 31B, FIGS. 32A and 32B, FIGS. 33A and 33B, FIGS. 34A and 34B, FIGS. 35A and 35B, and FIGS. 36A and 36B are examples in which the oxide semiconductor layer 130 is a single layer, the oxide semiconductor layer 130 may be a stacked layer. The oxide semiconductor layer 130 in the transistors 101 to 106 can be replaced with the oxide semiconductor layer 130 in FIG. 39B, 39C, 39D, or 39E.

Figure 39A:
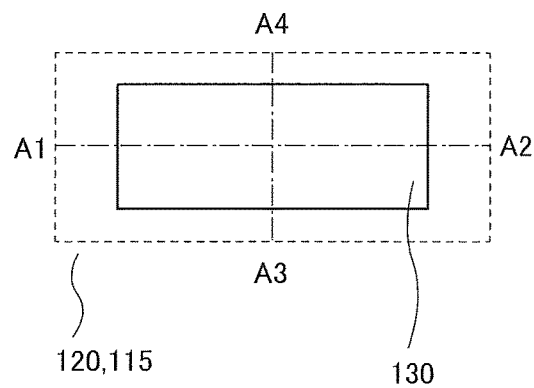
FIGS. 39A to 39E are a top view and cross-sectional views illustrating a semiconductor layer.
Figure 39B:
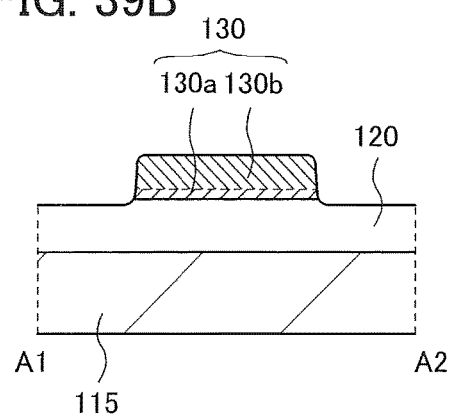
Figure 39D:
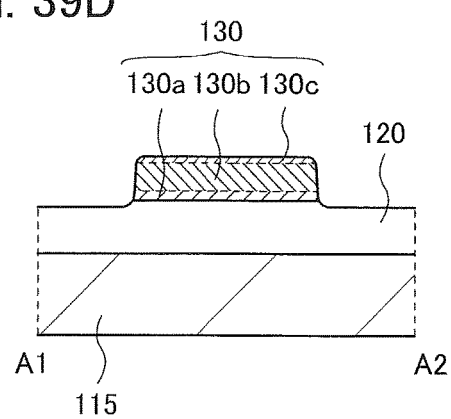
Figure 39C:
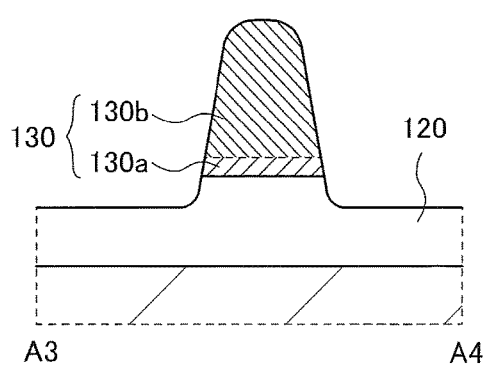
Figure 39E:
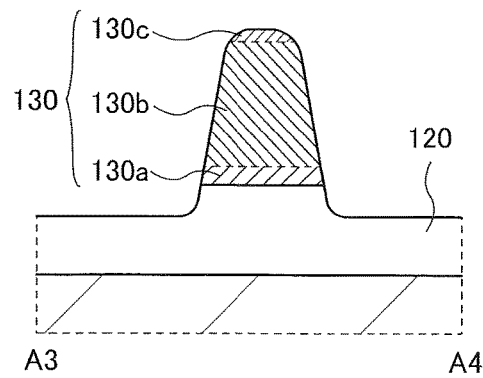

FIG. 39A is a top view of the oxide semiconductor layer 130, and FIGS. 39B and 39C are cross-sectional views of the oxide semiconductor layer 130 with a two-layer structure. FIGS. 39D and 39E are cross-sectional views of the oxide semiconductor layer 130 with a three-layer structure.

Oxide semiconductor layers with different compositions, for example, can be used as an oxide semiconductor layer 130a, an oxide semiconductor layer 130b, and an oxide semiconductor layer 130c.

Figure 40A:
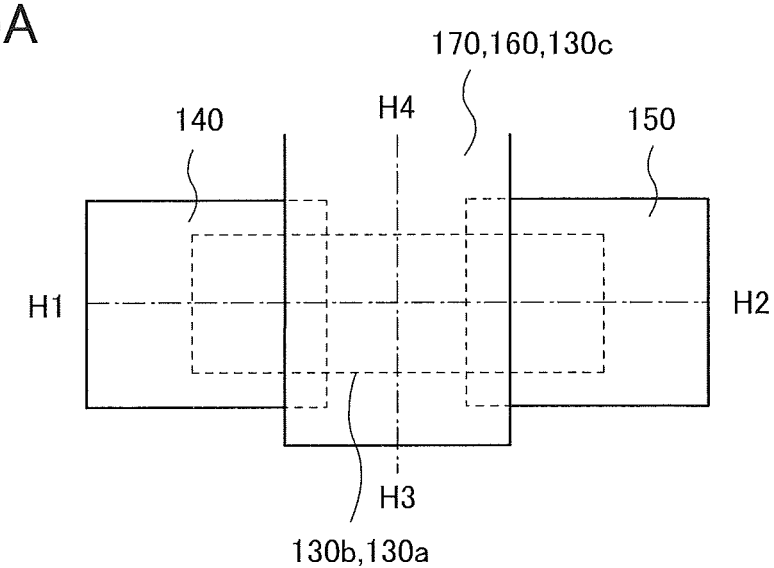
FIGS. 40A and 40B are a top view and a cross-sectional view illustrating a transistor.
Figure 40B:
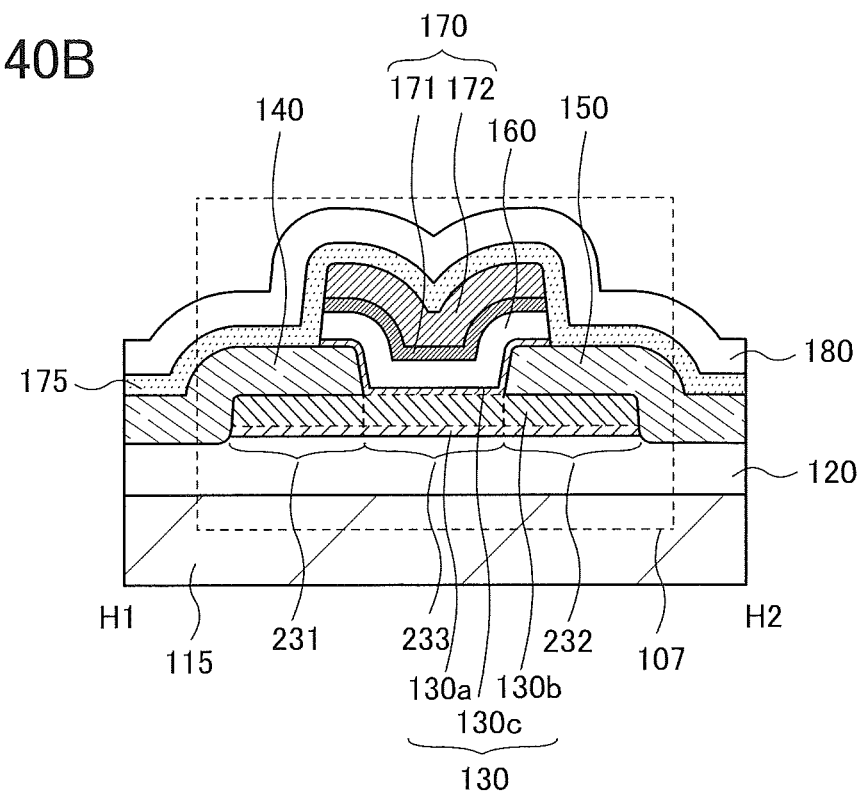
Figure 46A:
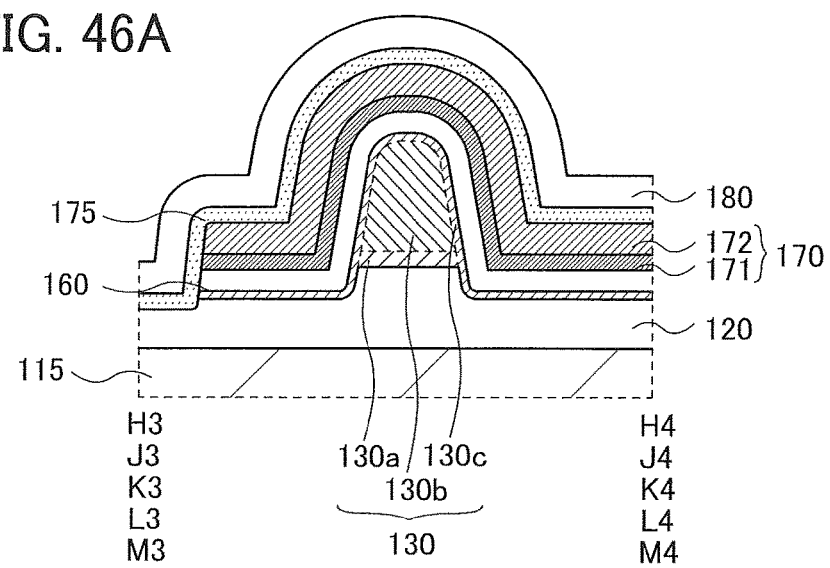
FIGS. 46A to 46D each illustrate a cross section of a transistor in a channel width direction.

The transistor in one embodiment of the present invention may have a structure illustrated in FIGS. 40A and 40B. FIG. 40A is a top view of a transistor 107. A cross section in the direction of dashed-dotted line H1-H2 in FIG. 40A is illustrated in FIG. 40B. A cross section in the direction of dashed-dotted line H3-H4 in FIG. 40A is illustrated in FIG. 46A. The direction of dashed-dotted line H1-H2 is referred to as a channel length direction, and the direction of dashed-dotted line H3-H4 is referred to as a channel width direction.

The transistor 107 includes the insulating layer 120 in contact with the substrate 115; a stack of the oxide semiconductor layers 130a and 130b in contact with the insulating layer 120; the conductive layers 140 and 150 electrically connected to the stack; the oxide semiconductor layer 130c in contact with the stack and the conductive layers 140 and 150; the insulating layer 160 in contact with the oxide semiconductor layer 130c; the conductive layer 170 in contact with the insulating layer 160; the insulating layer 175 in contact with the conductive layers 140 and 150, the oxide semiconductor layer 130c, the insulating layer 160, and the conductive layer 170; and the insulating layer 180 in contact with the insulating layer 175. The insulating layer 180 may function as a planarization film as necessary.

The transistor 107 has the same structure as the transistor 101 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 140 and 150.

Figure 41A:
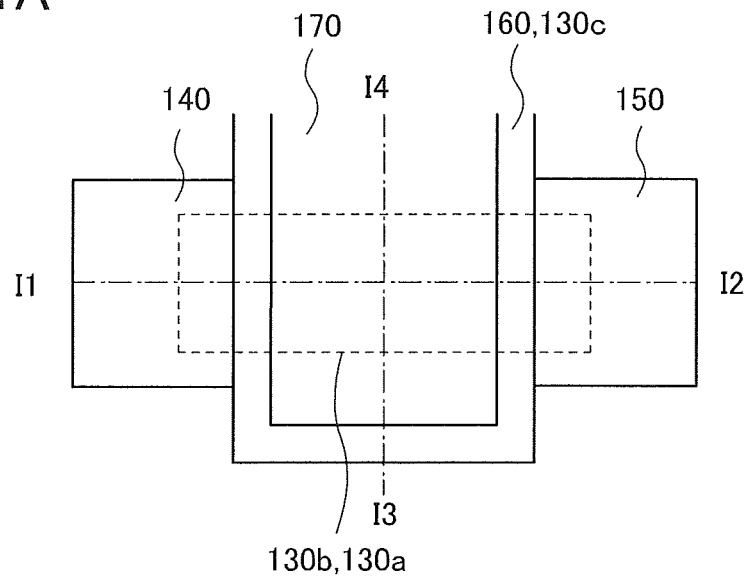
FIGS. 41A and 41B are a top view and a cross-sectional view illustrating a transistor.
Figure 41B:
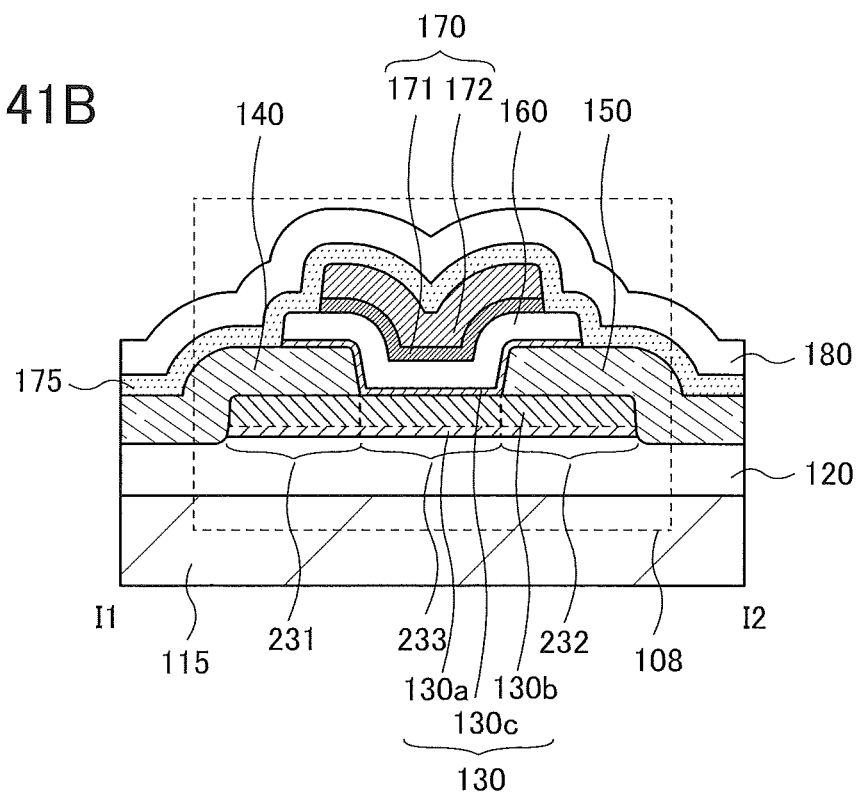
Figure 46B:
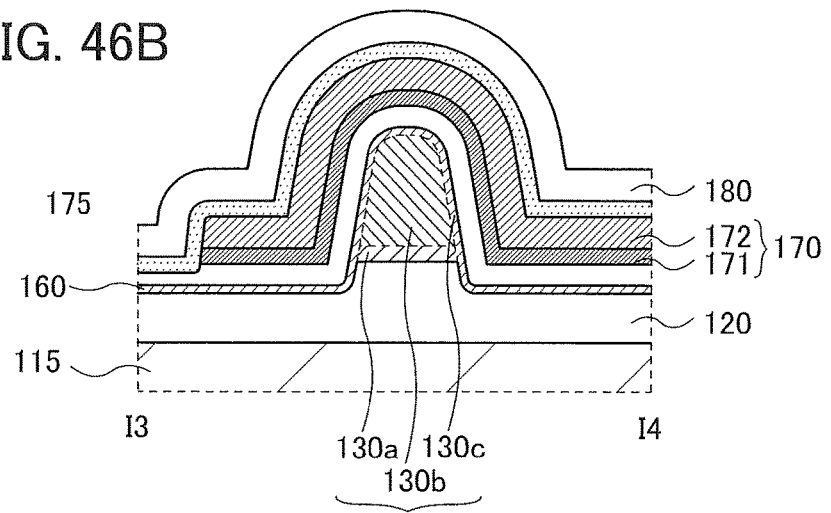

The transistor in one embodiment of the present invention may have a structure illustrated in FIGS. 41A and 41B. FIG. 41A is a top view of a transistor 108. A cross section in the direction of dashed-dotted line I1-I2 in FIG. 41A is illustrated in FIG. 41B. A cross section in the direction of dashed-dotted line I3-I4 in FIG. 41A is illustrated in FIG. 46B. The direction of dashed-dotted line I1-I2 is referred to as a channel length direction, and the direction of dashed-dotted line I3-I4 is referred to as a channel width direction.

The transistor 108 differs from the transistor 107 in that end portions of the insulating layer 160 and the oxide semiconductor layer 130c are not aligned with the end portion of the conductive layer 170.

Figure 42A:
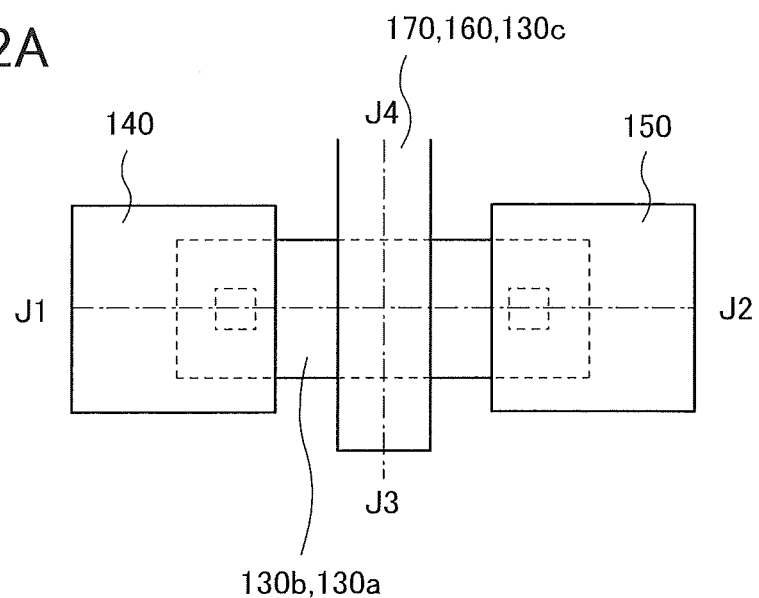
FIGS. 42A and 42B are a top view and a cross-sectional view illustrating a transistor.
Figure 42B:
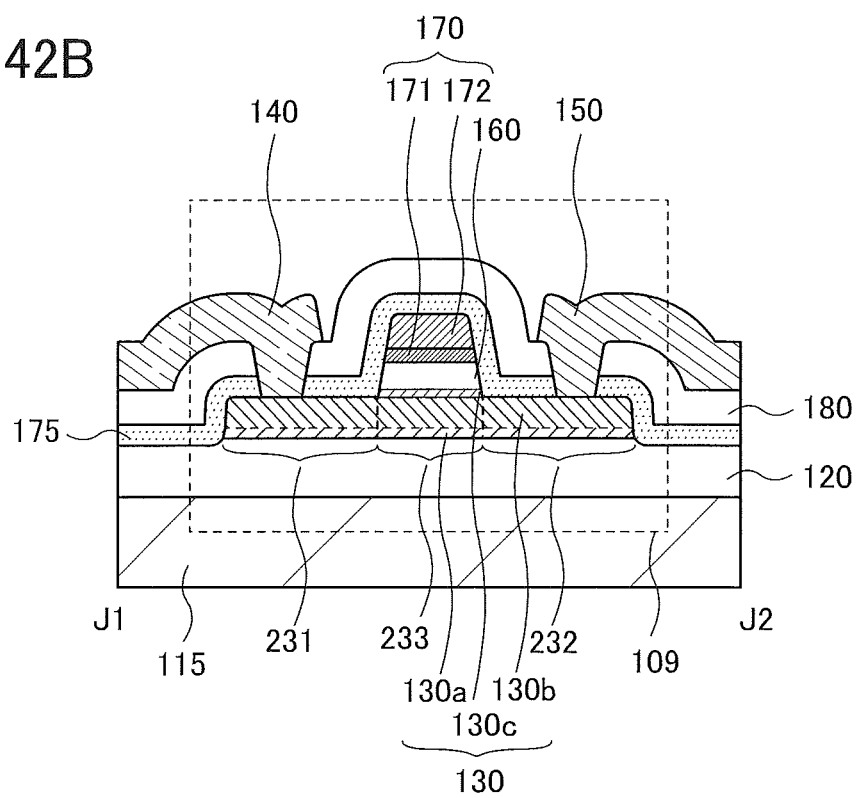

The transistor in one embodiment of the present invention may have a structure illustrated in FIGS. 42A and 42B. FIG. 42A is a top view of a transistor 109. A cross section in the direction of dashed-dotted line J1-J2 in FIG. 42A is illustrated in FIG. 42B. A cross section in the direction of dashed-dotted line J3-J4 in FIG. 42A is illustrated in FIG. 46A. The direction of dashed-dotted line J1-J2 is referred to as a channel length direction, and the direction of dashed-dotted line J3-J4 is referred to as a channel width direction.

The transistor 109 includes the insulating layer 120 in contact with the substrate 115; a stack of the oxide semiconductor layers 130a and 130b in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layers 140 and 150 electrically connected to the stack through openings provided in the insulating layers 175 and 180. The transistor 109 may further include, for example, an insulating layer (planarization film) in contact with the insulating layer 180 and the conductive layers 140 and 150 as necessary.

The transistor 109 has the same structure as the transistor 103 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 43A:
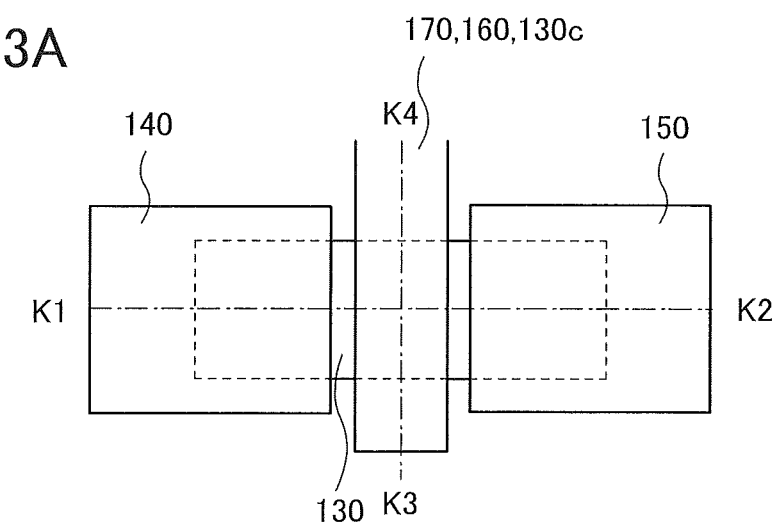
FIGS. 43A and 43B are a top view and a cross-sectional view illustrating a transistor.
Figure 43B:
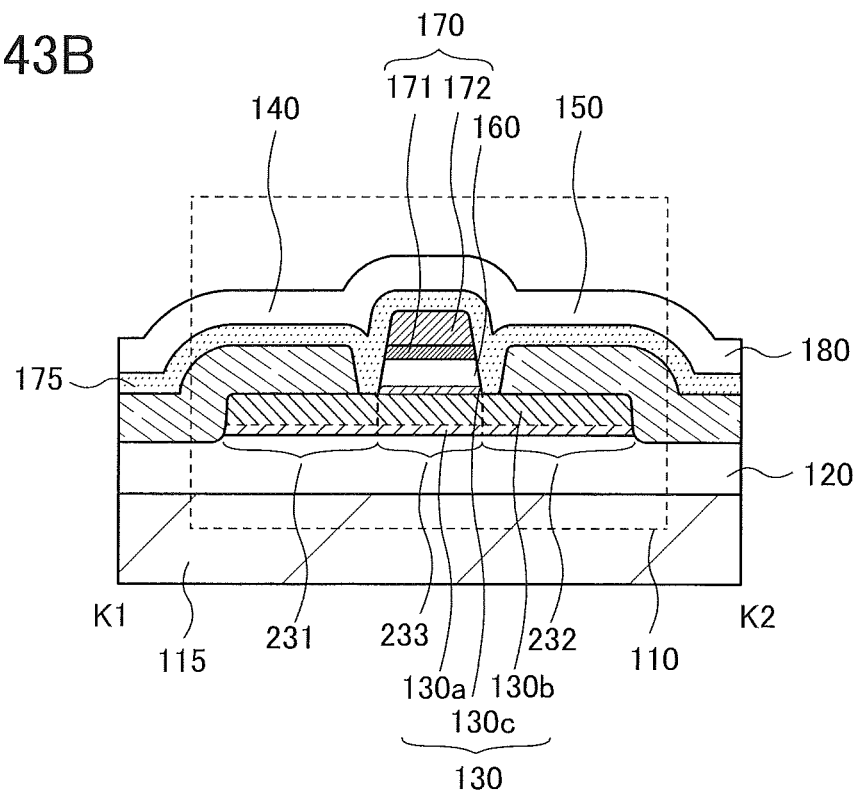

The transistor in one embodiment of the present invention may have a structure illustrated in FIGS. 43A and 43B. FIG. 43A is a top view of a transistor 110. A cross section in the direction of dashed-dotted line K1-K2 in FIG. 43A is illustrated in FIG. 43B. A cross section in the direction of dashed-dotted line K3-K4 in FIG. 43A is illustrated in FIG. 46A. The direction of dashed-dotted line K1-K2 is referred to as a channel length direction, and the direction of dashed-dotted line K3-K4 is referred to as a channel width direction.

The transistor 110 has the same structure as the transistor 104 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 44A:
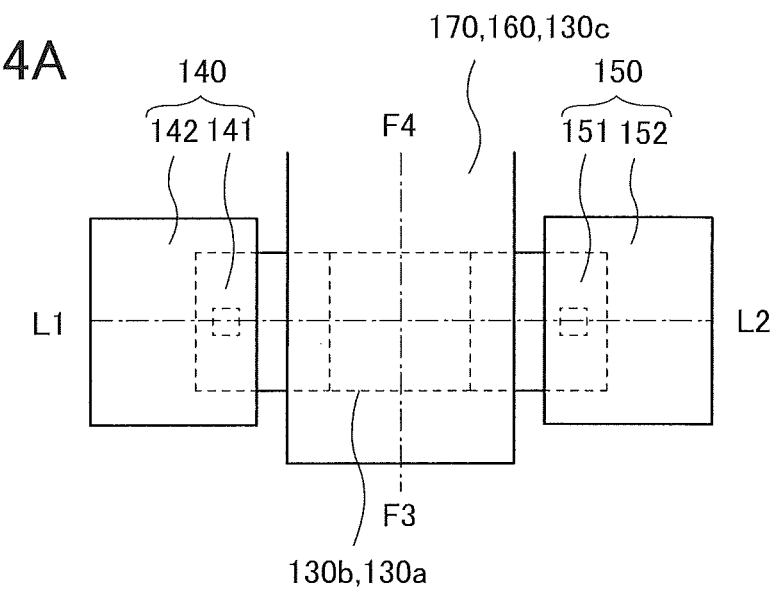
FIGS. 44A and 44B are a top view and a cross-sectional view illustrating a transistor.
Figure 44B:
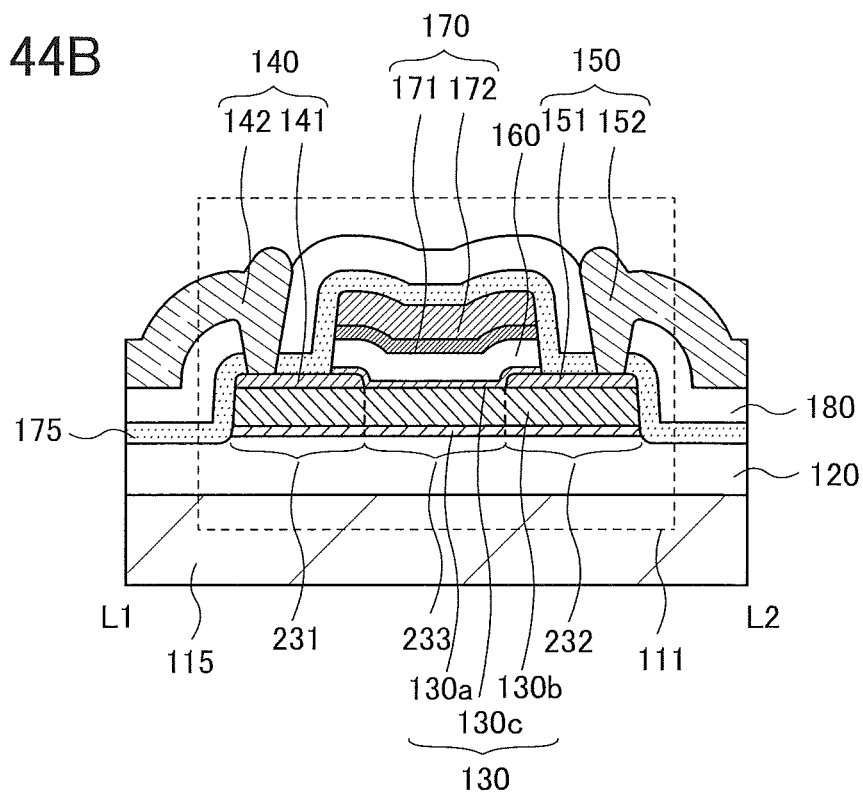

The transistor in one embodiment of the present invention may have a structure illustrated in FIGS. 44A and 44B. FIG. 44A is a top view of a transistor 111. A cross section in the direction of dashed-dotted line K1-K2 in FIG. 44A is illustrated in FIG. 44B. A cross section in the direction of dashed-dotted line K3-K4 in FIG. 44A is illustrated in FIG. 46A. The direction of dashed-dotted line K1-K2 is referred to as a channel length direction, and the direction of dashed-dotted line K3-K4 is referred to as a channel width direction.

The transistor 111 includes the insulating layer 120 in contact with the substrate 115; a stack of the oxide semiconductor layers 130a and 130b in contact with the insulating layer 120; the conductive layers 141 and 151 electrically connected to the stack; the oxide semiconductor layer 130c in contact with the stack and the conductive layers 141 and 151; the insulating layer 160 in contact with the oxide semiconductor layer 130c; the conductive layer 170 in contact with the insulating layer 160; the insulating layer 175 in contact with the stack, the conductive layers 141 and 151, the oxide semiconductor layer 130c, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 111 may further include, for example, an insulating layer (planarization film) in contact with the insulating layer 180 and the conductive layers 142 and 152 as necessary.

The transistor 111 has the same structure as the transistor 105 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 141 and 151.

Figure 45A:
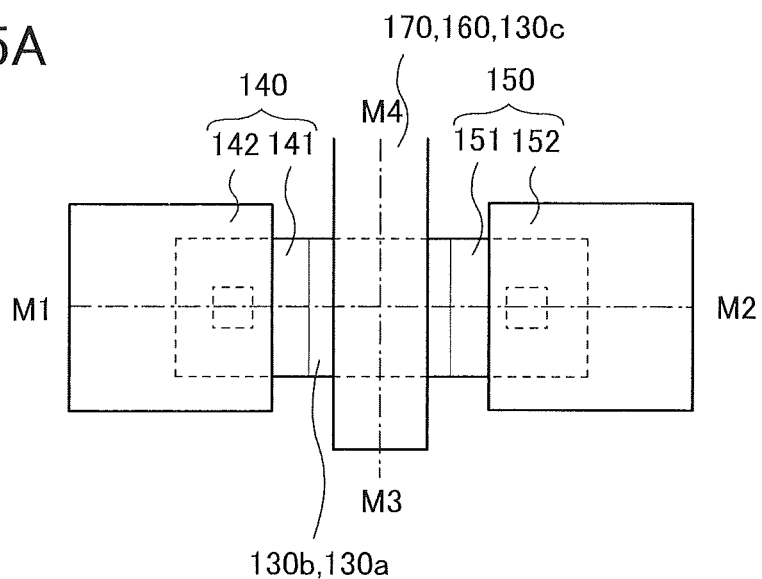
FIGS. 45A and 45B are a top view and a cross-sectional view illustrating a transistor.
Figure 45B:
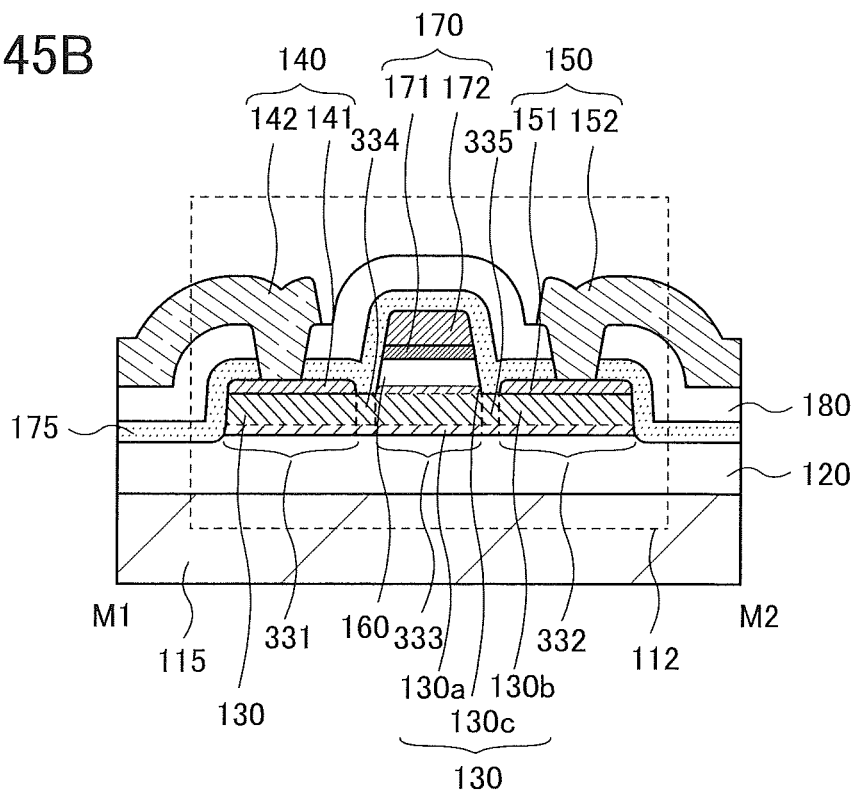

The transistor in one embodiment of the present invention may have a structure illustrated in FIGS. 45A and 45B. FIG. 45A is a top view of a transistor 112. A cross section in the direction of dashed-dotted line M1-M2 in FIG. 45A is illustrated in FIG. 45B. A cross section in the direction of dashed-dotted line M3-M4 in FIG. 45A is illustrated in FIG. 46A. The direction of dashed-dotted line M1-M2 is referred to as a channel length direction, and the direction of dashed-dotted line M3-M4 is referred to as a channel width direction.

The transistor 112 has the same structure as the transistor 106 except that the oxide semiconductor layer 130 includes two layers (the oxide semiconductor layers 130a and 130b) in the regions 331, 332, 334, and 335 and that the oxide semiconductor layer 130 includes three layers (the oxide semiconductor layers 130a to 130c) in the region 333.

Figure 46C:
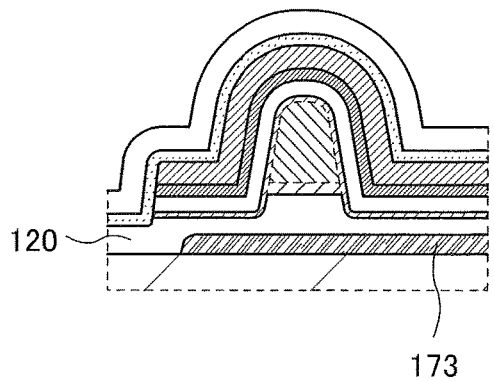
Figure 46D:
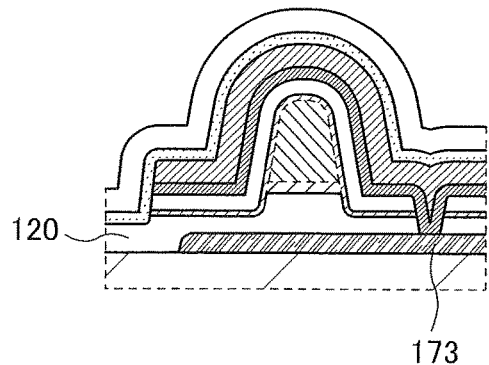
Figure 47A:
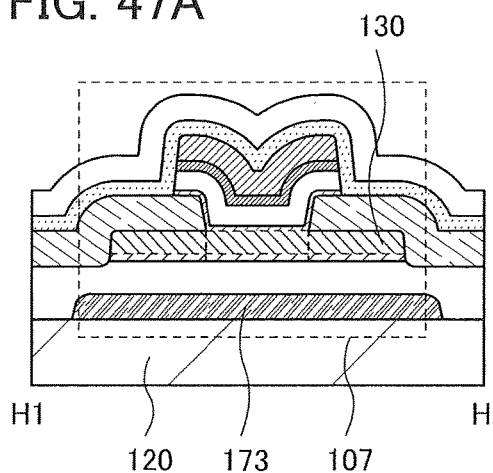
FIGS. 47A to 47F each illustrate a cross section of a transistor in a channel length direction.
Figure 47B:
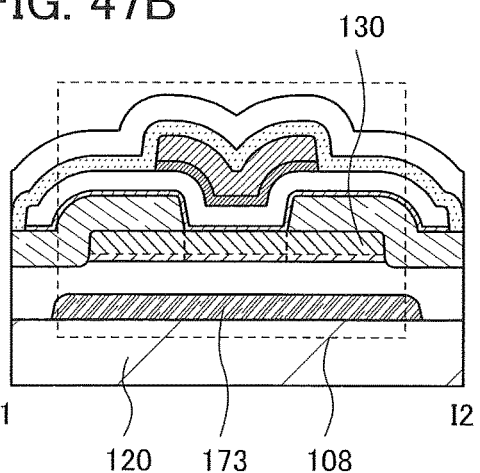
Figure 47C:
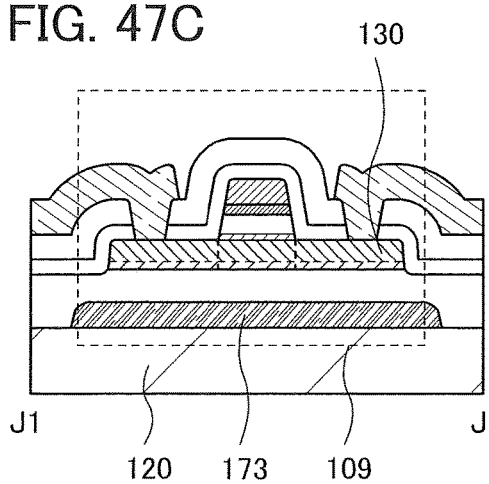
Figure 47D:
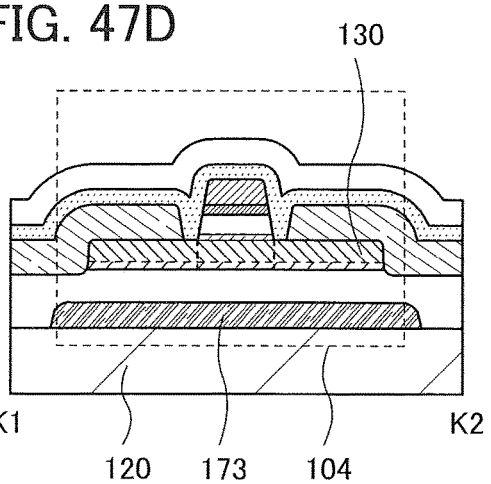
Figure 47E:
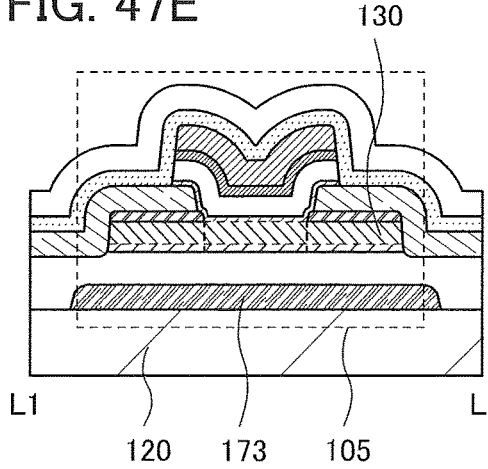
Figure 47F:
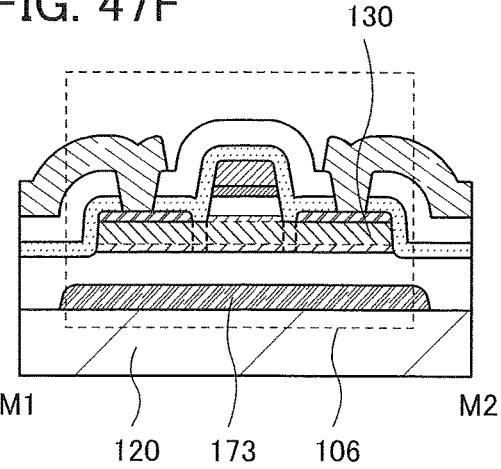

The transistor in one embodiment of the present invention may include the conductive layer 173 between the oxide semiconductor layer 130 and the substrate 115 as illustrated in cross-sectional views in the channel length direction in FIGS. 47A to 47F and cross-sectional views in the channel width direction in FIGS. 46C and 46D. When the conductive layer is used as a second gate electrode layer (back gate), the on-state current can be increased or the threshold voltage can be controlled. In the cross-sectional views in FIGS. 47A to 47F, the width of the conductive layer 173 may be shorter than that of the oxide semiconductor layer 130. Moreover, the width of the conductive layer 173 may be shorter than that of the conductive layer 170.

Figure 48A:
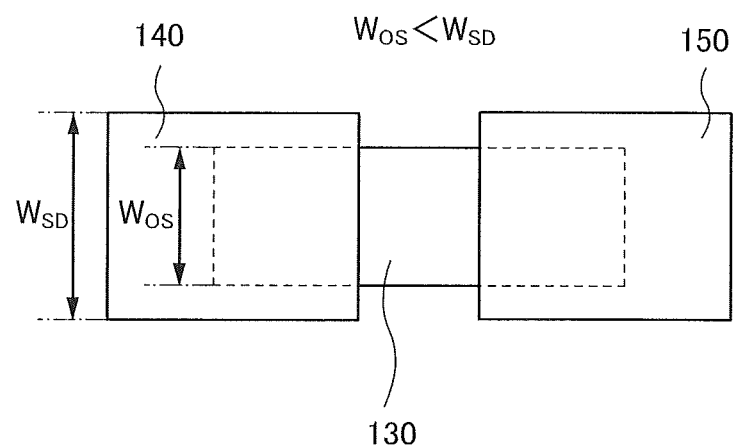
FIGS. 48A and 48B are top views each illustrating a transistor.
Figure 48B:
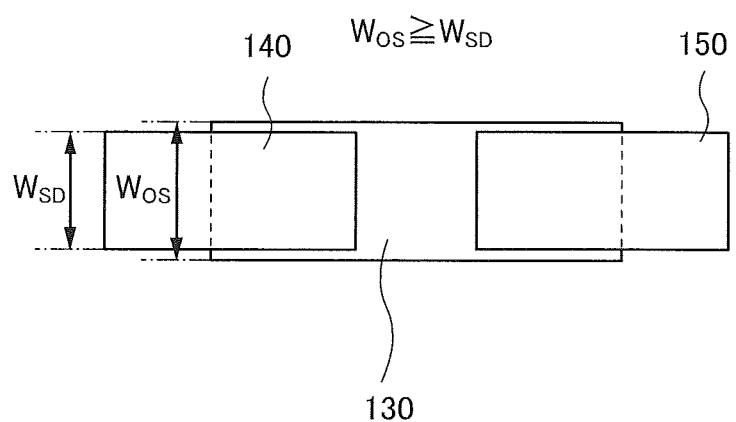

As illustrated in FIGS. 48A and 48B (illustrating only the oxide semiconductor layer 130, the conductive layer 140, and the conductive layer 150), the width ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved.

In the transistor in one embodiment of the present invention (any of the transistors 101 to 112), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layers 130a and 130b and the transistor including the oxide semiconductor layers 130a to 130c, selecting appropriate materials for the two or three layers forming the oxide semiconductor layer 130 makes current flow to the oxide semiconductor layer 130b. Since current flows to the oxide semiconductor layer 130b, the current is hardly influenced by interface scattering, leading to high on-state current. Note that increasing the thickness of the oxide semiconductor layer 130b can increase the on-state current. The thickness of the oxide semiconductor layer 130b may be, for example, 100 to 200 nm.

A semiconductor device including a transistor with any of the above structures can have favorable electrical characteristics.

The structure described above in this embodiment can be combined with any of the structures described in the other embodiments as appropriate.

Embodiment 5

In this embodiment, components of the transistors described in Embodiment 4 are described in detail.

As the substrate 115, a glass substrate, a quartz substrate, a semiconductor substrate, a ceramic substrate, a metal substrate having a surface subjected to insulation treatment, or the like can be used. The substrate 115 can be a silicon substrate provided with a transistor and/or a photodiode; and an insulating layer, a wiring, a conductor functioning as a contact plug, and the like that are provided over the silicon substrate. Note that when p-channel transistors are formed using the silicon substrate, a silicon substrate with n⁻-type conductivity is preferably used. Alternatively, an SOI substrate including an n⁻-type or i-type silicon layer may be used. In the case where a p-channel transistor is formed using the silicon substrate, a surface of the silicon substrate where the transistor is formed preferably has a (110) plane orientation. Forming a p-channel transistor with the (110) plane can increase mobility.

The insulating layer 120 can have a function of supplying oxygen to the oxide semiconductor layer 130 as well as a function of preventing diffusion of impurities from a component included in the substrate 115. For this reason, the insulating layer 120 is preferably an insulating film containing oxygen and more preferably, the insulating layer 120 is an insulating film containing oxygen in which the oxygen content is higher than that in the stoichiometric composition. The insulating layer 120 is a film in which the amount of released oxygen when converted into oxygen atoms is preferably greater than or equal to $1.0 \times 10^{19}$ atoms/cm$^3$ in TDS analysis. In the TDS analysis, the film surface temperature is higher than or equal to 100° C. and lower than or equal to 700° C., or higher than or equal to 100° C. and lower than or equal to 500° C. In the case where the substrate 115 is provided with another device, the insulating layer 120 also functions as an interlayer insulating film. In that case, the insulating layer 120 is preferably subjected to planarization treatment such as CMP so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

In this embodiment, detailed description is given mainly on the case where the oxide semiconductor layer 130 of the transistor has a three-layer structure in which the oxide semiconductor layers 130a to 130c are sequentially stacked from the insulating layer 120 side.

Note that in the case where the oxide semiconductor layer 130 is a single layer, a layer corresponding to the oxide semiconductor layer 130b described in this embodiment is used.

In the case where the oxide semiconductor layer 130 has a two-layer structure, a stack in which a layer corresponding to the oxide semiconductor layer 130a and a layer corresponding to the oxide semiconductor layer 130b are sequentially stacked from the insulating layer 120 side described in this embodiment is used. In such a case, the oxide semiconductor layers 130a and 130b can be replaced with each other.

In the case where the oxide semiconductor layer 130 has a layered structure of four or more layers, for example, a structure in which another oxide semiconductor layer is added to the three-layer stack of the oxide semiconductor layer 130 described in this embodiment can be employed.

For the oxide semiconductor layer 130b, for example, an oxide semiconductor whose electron affinity (an energy difference between a vacuum level and the conduction band minimum) is higher than those of the oxide semiconductor layers 130a and 130c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 130a and 130c each contain one or more kinds of metal elements contained in the oxide semiconductor layer 130b. For example, the oxide semiconductor layers 130a and 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 170, a channel is formed in the oxide semiconductor layer 130b whose conduction band minimum is the lowest in the oxide semiconductor layer 130.

Furthermore, since the oxide semiconductor layer 130a contains one or more kinds of metal elements contained in the oxide semiconductor layer 130b, an interface state is unlikely to be formed at the interface between the oxide semiconductor layers 130a and 130b, compared with the interface between the oxide semiconductor layer 130b and the insulating layer 120 on the assumption that the oxide semiconductor layer 130b is in contact with the insulating layer 120. The interface state sometimes forms a channel; therefore, the threshold voltage of the transistor is changed in some cases. Thus, with the oxide semiconductor layer 130a, variations in electrical characteristics of the transistor, such as a threshold voltage, can be reduced. Moreover, the reliability of the transistor can be improved.

Furthermore, since the oxide semiconductor layer 130c contains one or more kinds of metal elements contained in the oxide semiconductor layer 130b, scattering of carriers is unlikely to occur at the interface between the oxide semiconductor layers 130b and 130c, compared with the interface between the oxide semiconductor layer 130b and the gate insulating film (the insulating layer 160) on the assumption that the oxide semiconductor layer 130b is in contact with the gate insulating film. Thus, with the oxide semiconductor layer 130c, the field-effect mobility of the transistor can be increased.

For the oxide semiconductor layers 130a and 130c, for example, a material containing Al, Ti, Ga, Ge, Y, Zr, Sn, La, Ce, or Hf with a higher atomic ratio than that used for the oxide semiconductor layer 130b can be used. Specifically, the atomic ratio of any of the above metal elements in the oxide semiconductor layers 130a and 130c is 1.5 times or more, preferably 2 times or more, more preferably 3 times or more as large as that in the oxide semiconductor layer 130b. Any of the above metal elements is strongly bonded to oxygen and thus has a function of suppressing generation of an oxygen vacancy in the oxide semiconductor layers 130a and 130c. That is, an oxygen vacancy is less likely to be generated in the oxide semiconductor layers 130a and 130c than in the oxide semiconductor layer 130b.

An oxide semiconductor that can be used for each of the oxide semiconductor layers 130a to 130c preferably contains at least In or Zn. Both In and Zn are preferably contained. In order to reduce variations in electrical characteristics of the transistor including the oxide semiconductor, the oxide semiconductor preferably contains a stabilizer in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

Note that when each of the oxide semiconductor layers 130a to 130c is an In-M-Zn oxide containing at least indium, zinc, and M (M is a metal such as Al, Ti, Ga, Ge, Y, Zr, Sn, La, Ce, or Hf), in the case where the oxide semiconductor layer 130a has an atomic ratio of In to M and Zn which is $x_1:y_1:z_1$, the oxide semiconductor layer 130b has an atomic ratio of In to M and Zn which is $x_2:y_2:z_2$, and the oxide semiconductor layer 130c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, more preferably 3 times or more as large as $y_2/x_2$. At this time, when $y_2$ is greater than or equal to $x_2$ in the oxide semiconductor layer 130b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layers 130a and 130c are preferably less than 50 atomic % and greater than or equal to 50 atomic %, respectively, more preferably less than 25 atomic % and greater than or equal to 75 atomic %, respectively. Furthermore, in the case where Zn and O are not taken into consideration, the proportion of In and the proportion of M in the oxide semiconductor layer 130b are preferably greater than or equal to 25 atomic % and less than 75 atomic %, respectively, more preferably greater than or equal to 34 atomic % and less than 66 atomic %, respectively.

The indium content in the oxide semiconductor layer 130b is preferably higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is likely to be increased. Therefore, an oxide in which the proportion of In is higher than that of M has higher mobility than an oxide in which the proportion of In is equal to or lower than that of M. Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, more preferably greater than or equal to 5 nm and less than or equal to 25 nm. The thickness of the oxide semiconductor layer 130b is greater than or equal to 3 nm and less than or equal to 200 nm, preferably greater than or equal to 10 nm and less than or equal to 150 nm, more preferably greater than or equal to 15 nm and less than or equal to 100 nm. The thickness of the oxide semiconductor layer 130c is greater than or equal to 1 nm and less than or equal to 50 nm, preferably greater than or equal to 2 nm and less than or equal to 30 nm, more preferably greater than or equal to 3 nm and less than or equal to 15 nm. In addition, the oxide semiconductor layer 130b is preferably thicker than the oxide semiconductor layer 130a.

Note that in order that a transistor in which a channel is formed in an oxide semiconductor layer have stable electrical characteristics, it is effective to make the oxide semiconductor layer intrinsic or substantially intrinsic by reducing the concentration of impurities in the oxide semiconductor layer. The term "substantially intrinsic" refers to a state where an oxide semiconductor layer has a carrier density lower than $1\times10^{17}/cm^3$, preferably lower than $1\times10^{15}/cm^3$, more preferably higher than or equal to $1\times10^{-9}/cm^3$ and lower than $1\times10^{13}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer. The impurity levels serve as traps and might cause deterioration of electrical characteristics of the transistor. Therefore, it is preferable to reduce the concentration of the impurities in the oxide semiconductor layers 130a to 130c and at interfaces between the oxide semiconductor layers.

In order to make the oxide semiconductor layer intrinsic or substantially intrinsic, the oxide semiconductor layer is controlled to have a region in which the concentration of silicon estimated by secondary ion mass spectrometry (SIMS) is lower than $1\times10^{19}$ atoms/$cm^3$, preferably higher than or equal to $1\times10^{18}$ atoms/$cm^3$ and lower than $5\times10^{18}$ atoms/$cm^3$. In addition, the oxide semiconductor layer is controlled to have a region in which the concentration of hydrogen is lower than or equal to $2\times10^{20}$ atoms/$cm^3$, preferably lower than or equal to $5\times10^{19}$ atoms/$cm^3$, more preferably higher than or equal to $1\times10^{17}$ atoms/$cm^3$ and lower than or equal to $5\times10^{18}$ atoms/$cm^3$. Furthermore, the oxide semiconductor layer is controlled to have a region in which the concentration of nitrogen is lower than $5\times10^{19}$ atoms/$cm^3$, preferably lower than or equal to $5\times10^{18}$ atoms/$cm^3$, more preferably higher than or equal to $5\times10^{16}$ atoms/$cm^3$ and lower than or equal to $5\times10^{17}$ atoms/$cm^3$.

The high concentration of silicon or carbon might reduce the crystallinity of the oxide semiconductor layer. In order not to lower the crystallinity of the oxide semiconductor layer, for example, the oxide semiconductor layer is controlled to have a region in which the concentration of silicon is lower than $1\times10^{19}$ atoms/$cm^3$, preferably higher than or equal to $1\times10^{18}$ atoms/$cm^3$ and lower than $5\times10^{18}$ atoms/$cm^3$. Furthermore, the oxide semiconductor layer is controlled to have a region in which the concentration of carbon is lower than $1\times10^{19}$ atoms/$cm^3$, preferably higher than or equal to $6\times10^{17}$ atoms/$cm^3$ and lower than $5\times10^{18}$ atoms/$cm^3$.

A transistor in which a highly purified oxide semiconductor film is used for a channel formation region exhibits extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

As the gate insulating film of the transistor, an insulating film containing silicon is used in many cases; thus, it is preferable that, as in the transistor in one embodiment of the present invention, a region of the oxide semiconductor layer that serves as a channel not be in contact with the gate insulating film for the above reason. In the case where a channel is formed at the interface between the gate insulating film and the oxide semiconductor layer, scattering of carriers occurs at the interface, so that the field-effect mobility of the transistor is reduced in some cases. Also from the view of the above, it is preferable that the region of the oxide semiconductor layer that serves as a channel be separated from the gate insulating film.

Accordingly, with the oxide semiconductor layer 130 having a layered structure including the oxide semiconductor layers 130a to 130c, a channel can be formed in the oxide semiconductor layer 130b; thus, the transistor can have high field-effect mobility and stable electrical characteristics.

In a band structure, the conduction band minimums of the oxide semiconductor layers 130a to 130c are continuous. This can be understood also from the fact that the compositions of the oxide semiconductor layers 130a to 130c are close to one another and oxygen is easily diffused among the oxide semiconductor layers 130a to 130c. Thus, the oxide semiconductor layers 130a to 130c have a continuous physical property though they have different compositions and form a stack. In the drawings, interfaces between the oxide semiconductor layers of the stack are indicated by dotted lines.

The oxide semiconductor layer 130 in which layers containing the same main components are stacked is formed to have not only a simple layered structure of the layers but also a continuous energy band (here, in particular, a well structure having a U shape in which the conduction band minimums are continuous (U-shape well)). In other words, the layered structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layers 130a and 130c, and an In—Ga—Zn oxide whose atomic ratio of In to Ga and Zn is 1:1:1, 2:1:3, 5:5:6, or 3:1:2 can be used for the oxide semiconductor layer 130b. In the case where each of the oxide semiconductor layers 130a, 130b, and 130c is formed using the above oxide as a sputtering target, the atomic ratio of each sputtering target and that of each formed oxide semiconductor layer are not necessarily consistent with each other and different within a range of ±20%.

The oxide semiconductor layer 130b of the oxide semiconductor layer 130 serves as a well, so that a channel is formed in the oxide semiconductor layer 130b in a transistor including the oxide semiconductor layer 130. Note that since the conduction band minimums are continuous, the oxide semiconductor layer 130 can also be referred to as a U-shaped well. Furthermore, a channel formed to have such a structure can also be referred to as a buried channel.

Trap levels due to impurities or defects might be formed in the vicinity of the interface between an insulating layer such as a silicon oxide film and each of the oxide semiconductor layers 130a and 130c. The oxide semiconductor layer 130b can be distanced away from the trap levels owing to existence of the oxide semiconductor layers 130a and 130c.

However, when the energy differences between the conduction band minimum of the oxide semiconductor layer 130b and the conduction band minimum of each of the oxide semiconductor layers 130a and 130c are small, an electron in the oxide semiconductor layer 130b might reach the trap level by passing over the energy differences. When the electron is trapped in the trap level, negative charge is generated at the interface with the insulating layer, so that the threshold voltage of the transistor is shifted in a positive direction.

The oxide semiconductor layers 130a to 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus makes subsequent process temperatures comparatively high. It is also possible to use a stack of any of the above materials and Cu or an alloy such as Cu—Mn, which has low resistance. In the transistors 105, 106, 111, and 112, for example, it is possible to use W for the conductive layers 141 and 151 and use a stack of Ti and Al for the conductive layers 142 and 152.

The above materials are capable of extracting oxygen from an oxide semiconductor film. Therefore, in a region of the oxide semiconductor layer that is in contact with any of the above materials, oxygen is released from the oxide semiconductor film and an oxygen vacancy is formed. Hydrogen slightly contained in the film and the oxygen vacancy are bonded to each other, so that the region is markedly changed to an n-type region. Accordingly, the n-type region can serve as a source or a drain of the transistor.

In the case where W is used for the conductive layers 140 and 150, the conductive layers 140 and 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 140 and 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, gelmanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain La, N, Zr, or the like as an impurity.

An example of a layered structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, the insulating layer 160 using hafnium oxide or aluminum oxide can have larger thickness than the insulating layer 160 using silicon oxide, so that leakage current due to tunnel current can be reduced. That is, a transistor with low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with low off-state current. Examples of the crystal structure include a monoclinic crystal structure and a cubic crystal structure. Note that one embodiment of the present invention is not limited to the above examples.

For the insulating layers 120 and 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide becomes high in some cases. For the insulating layers 120 and 160, for example, an oxide insulating layer such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typically greater than or equal to $1 \times 10^{18}$ molecules/cm$^3$ and less than or equal to $5 \times 10^{19}$ molecules/cm$^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer for the insulating layers 120 and 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, W, or the like can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 171 and tungsten is used for the conductive layer 172 to four the conductive layer 170.

As the insulating layer 175, a silicon nitride film, an aluminum nitride film, or the like containing hydrogen can be used. In the transistors 103, 104, 106, 109, 110, and 112 described in Embodiment 4, when an insulating film containing hydrogen is used as the insulating layer 175, part of the oxide semiconductor layer can have n-type conductivity. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 4. The aluminum oxide an has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120. Furthermore, oxygen contained in the aluminum oxide film can be diffused into the oxide semiconductor layer.

Furthermore, the insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 107 to 112 in one embodiment of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and effective channel width is increased, leading to a further increase in the on-state current.

Furthermore, in the transistor in one embodiment of the present invention in which the oxide semiconductor layer 130 has a two-layer structure or a three-layer structure, since the oxide semiconductor layer 130b where a channel is formed is provided over the oxide semiconductor layer 130a, an effect of making an interface state less likely to be formed is obtained. In the transistor in one embodiment of the present invention in which the oxide semiconductor layer 130 has a three-layer structure, since the oxide semiconductor layer 130b is positioned at the middle of the three-layer structure, an effect of eliminating the influence of an impurity that enters from upper and lower layers on the oxide semiconductor layer 130b is obtained as well. Therefore, the transistor can achieve not only the increase in the on-state current of the transistor but also stabilization of the threshold voltage and a reduction in the S value (subthreshold value). Thus, current when gate voltage VG is 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films that are described in this embodiment typically can be formed by sputtering or plasma-enhanced CVD, such films may be formed by another method such as thermal CVD. Examples of thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is absorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed by a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide) hafnium) are used.

For example, in the case where an aluminum oxide film is formed by a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor film, e.g., an In—Ga—Zn—O film is formed by a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas which is obtained by bubbling with an inert gas such as Ar may be used instead of an $O_3$ gas, it is preferable to use an $O_3$ gas, which does not contain H.

The structure described above in this embodiment can be combined with any of the structures described in the other embodiments as appropriate.

Embodiment 6

The structure of an oxide semiconductor film that can be used for one embodiment of the present invention is described below.

In this specification, the term "parallel" indicates that the angle formed between two straight lines is greater than or equal to $-10°$ and less than or equal to $10°$, and accordingly includes the case where the angle is greater than or equal to $-5°$ and less than or equal to $5°$. The term "perpendicular" indicates that an angle formed between two straight lines is greater than or equal to $80°$ and less than or equal to $100°$, and accordingly includes the case where the angle is greater than or equal to $85°$ and less than or equal to $95°$.

In this specification, the trigonal and rhombohedral crystal systems are included in the hexagonal crystal system.

An oxide semiconductor film is roughly classified into a non-single-crystal oxide semiconductor film and a single-crystal oxide semiconductor film. The non-single-crystal oxide semiconductor film means any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface (cross-sectional TEM image), metal atoms are arranged in a layered manner in the crystal parts. Each metal atom layer has a morphology that reflects a surface over which the CAAC-OS film is formed (also referred to as a formation surface) or a top surface of the CAAC-OS film, and is provided parallel to the formation surface or the top surface of the CAAC-OS film.

On the other hand, according to the high-resolution planar TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

The CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around $31°$. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of 2θ may also be observed at around $36°$, in addition to the peak of 2θ at around $31°$. The peak of 2θ at around $36°$ indicates that a crystal having no c-axis alignment is included in part of the CAAC-OS film. It is preferable that in the CAAC-OS film, a peak of 2θ appear at around $31°$ and a peak of 2θ not appear at around $36°$.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources, and thus can have low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has few variations in electrical characteristics and high reliability. Charge trapped by the carrier traps in the oxide semiconductor film takes a long time to be released and may behave like fixed charge. Thus, the transistor that includes the oxide semiconductor film having high impurity concentration and high density of defect states has unstable electrical characteristics in some cases.

In a transistor including the CAAC-OS film, changes in electrical characteristics of the transistor due to irradiation with visible light or ultraviolet light are small.

Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image, a grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity than an amorphous oxide semiconductor film. Thus, the nc-OS film has a lower density of defect states than the amorphous oxide semiconductor film. Note that there is no regularity of crystal orientation between different crystal parts in the nc-OS film; thus, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the amorphous-like OS film, a void may be seen. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the amorphous-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as a d value). The value is calculated to be 0.29 nm from crystal structure analysis. Thus, each of the lattice fringes in which the spacing therebetween is from 0.28 nm to 0.30 nm corresponds to the a-b plane of the InGaZnO$_4$ crystal, focusing on the lattice fringes in the high-resolution TEM image.

Note that an oxide semiconductor film may be a stacked film including two or more films of an amorphous oxide semiconductor film, an amorphous-like OS film, a microcrystalline oxide semiconductor film, and a CAAC-OS film, for example.

The structure described above in this embodiment can be combined with any of the structures described in the other embodiments as appropriate.

Embodiment 7

An imaging device in one embodiment of the present invention and a semiconductor device including the imaging device can be used for display devices, personal computers, or image reproducing devices provided with recording media (typically, devices that reproduce the content of recording media such as digital versatile discs (DVD) and have displays for displaying the reproduced images). Furthermore, as electronic devices that can include the imaging device in one embodiment of the present invention and the semiconductor device including the imaging device, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 49A to 49E illustrate specific examples of these electronic devices.

Figure 49A:
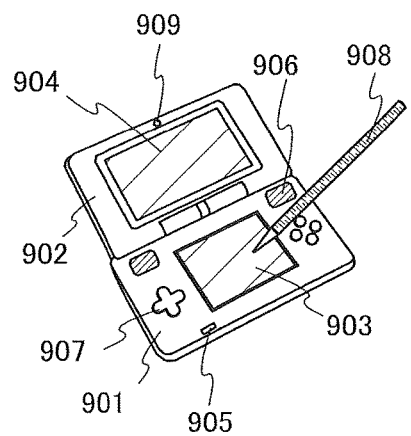
FIGS. 49A to 49E illustrate electronic devices.

FIG. 49A illustrates a portable game machine, which includes housings 901 and 902, display portions 903 and 904, a microphone 905, speakers 906, an operation key 907, a stylus 908, a camera 909, and the like. Although the portable game machine in FIG. 49A has the two display portions 903 and 904, the number of display portions included in the portable game machine is not limited to this. The lensless imaging device in one embodiment of the present invention can be used for the camera 909.

Figure 49B:
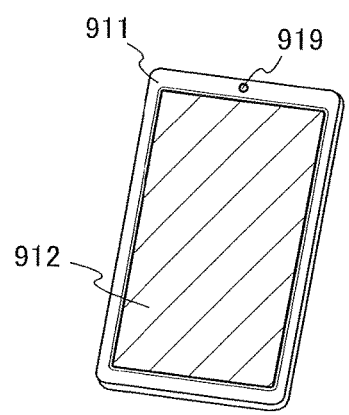

FIG. 49B illustrates a portable data terminal, which includes a first housing 911, a display portion 912, a camera 919, and the like. The touch panel function of the display portion 912 enables input and output of information. The lensless imaging device in one embodiment of the present invention can be used for the camera 919.

Figure 49C:
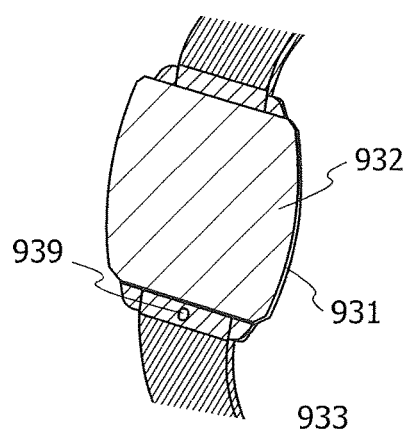

FIG. 49C illustrates a wrist-watch-type information terminal, which includes a housing 931, a display portion 932, a wristband 933, a camera 939, and the like. The display portion 932 may be a touch panel. The lensless imaging device in one embodiment of the present invention can be used for the camera 939.

Figure 49D:
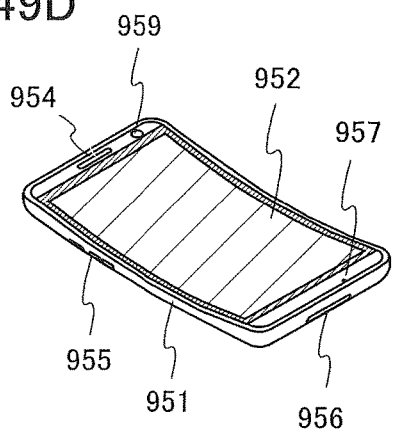

FIG. 49D illustrates a cellular phone, which includes a display portion 952, a microphone 957, a speaker 954, a camera 959, an input/output terminal 956, an operation button 955, and the like in a housing 951. The lensless imaging device in one embodiment of the present invention can be used for the camera 959.

Figure 49E:
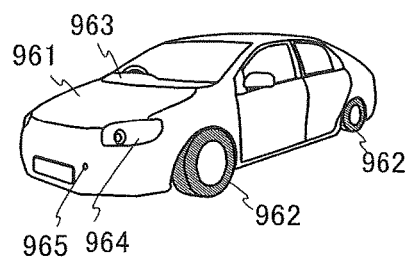

FIG. 49E illustrates an automobile, which includes a car body 961, wheels 962, a dashboard 963, lights 964, a camera 965, and the like. The camera 965 has a function of detecting the position of an adjacent object. The lensless imaging device in one embodiment of the present invention can be used for the camera 965.

This embodiment can be combined with any of the other embodiments described in this specification as appropriate.

This application is based on Japanese Patent Application serial No. 2014-219832 filed with Japan Patent Office on Oct. 29, 2014, the entire contents of which are hereby incorporated by reference.

What is claimed is:

1. An imaging device comprising:
a first layer;
a second layer; and
a third layer,
wherein the second layer is positioned between the first layer and the third layer,
wherein the first layer comprises a diffraction grating,
wherein the second layer comprises a photoelectric conversion element, and
wherein the third layer comprises a first transistor comprising an active layer comprising an oxide semiconductor.

2. The imaging device according to claim 1,
wherein the third layer further comprises a second transistor, a third transistor, and a fourth transistor,
wherein one of a source electrode and a drain electrode of the first transistor is electrically connected to one electrode of the photoelectric conversion element,
wherein the other of the source electrode and the drain electrode of the first transistor is electrically connected to a gate electrode of the second transistor,
wherein the other of the source electrode and the drain electrode of the first transistor is electrically connected to one of a source electrode and a drain electrode of the third transistor, and
wherein one of a source electrode and a drain electrode of the second transistor is electrically connected to one of a source electrode and a drain electrode of the fourth transistor.

3. The imaging device according to claim 2, wherein the other of the source electrode and the drain electrode of the first transistor is electrically connected to one electrode of a capacitor.

4. The imaging device according to claim 1, wherein the oxide semiconductor comprises In, Zn, and M, where M is Al, Ti, Ga, Sn, Y, Zr, La, Ce, Nd, or Hf.

5. The imaging device according to claim 1, wherein photoelectric conversion element comprises selenium or a compound containing selenium in a photoelectric conversion layer.

6. An electronic device comprising:
the imaging device according to claim 1; and
a display device.

7. An imaging device comprising:
a first layer;
a second layer;
a third layer; and
a fourth layer,
wherein the first layer is over the second layer, the second layer is over the third layer, and the third layer is over the fourth layer,
wherein the first layer comprises a diffraction grating,
wherein the second layer comprises a photoelectric conversion element,
wherein the third layer comprises a first transistor comprising an active layer comprising an oxide semiconductor, and
wherein the fourth layer comprises a second transistor comprising an active layer comprising silicon.

8. The imaging device according to claim 7,
wherein the third layer further comprises further a third transistor, and a fourth transistor, and a fifth transistor
wherein one of a source electrode and a drain electrode of the first transistor is electrically connected to one electrode of the photoelectric conversion element,
wherein the other of the source electrode and the drain electrode of the first transistor is electrically connected to a gate electrode of the third transistor,
wherein the other of the source electrode and the drain electrode of the first transistor is electrically connected to one of a source electrode and a drain electrode of the fourth transistor, and
wherein one of a source electrode and a drain electrode of the third transistor is electrically connected to one of a source electrode and a drain electrode of the fifth transistor.

9. The imaging device according to claim 8, wherein the other of the source electrode and the drain electrode of the first transistor is electrically connected to one electrode of a capacitor.

10. The imaging device according to claim 7, wherein the oxide semiconductor comprises In, Zn, and M, where M is Al, Ti, Ga, Sn, Y, Zr, La, Ce, Nd, or Hf.

11. The imaging device according to claim 7, wherein the photoelectric conversion element comprises selenium or a compound containing selenium in a photoelectric conversion layer.

12. An electronic device comprising:
the imaging device according to claim 7; and
a display device.

13. The imaging device according to claim 7,
wherein the active layer is over a glass substrate.

14. The imaging device according to claim 7,
wherein the first layer, the second layer, and the third layer are provided on a chip, and
wherein the imaging device is configured to perform imaging without a lens provided outside of the chip.

15. The imaging device according to claim 7,
wherein the first layer, the second layer, the third layer, and the fourth layer are provided on a chip, and
wherein the imaging device is configured to perform imaging without a lens provided outside of the chip.

16. An imaging device comprising:
a first layer;
a second layer;
a third layer; and
a fourth layer,
wherein the first layer is over the second layer, the second layer is over the third layer, and the third layer is over the fourth layer,
wherein the first layer comprises a diffraction grating,
wherein the second layer comprises a photoelectric conversion element,
wherein the third layer comprises a first transistor comprising an active layer comprising an oxide semiconductor, and
wherein the fourth layer comprises a second transistor comprising an active region comprising silicon.

17. The imaging device according to claim 16,
wherein the third layer further comprises a third transistor, and a fourth transistor and a fifth transistor,
wherein one of a source electrode and a drain electrode of the first transistor is electrically connected to one electrode of the photoelectric conversion element,
wherein the other of the source electrode and the drain electrode of the first transistor is electrically connected to a gate electrode of the third transistor,
wherein the other of the source electrode and the drain electrode of the first transistor is electrically connected to one of a source electrode and a drain electrode of the fourth transistor, and
wherein one of a source electrode and a drain electrode of the third transistor is electrically connected to one of a source electrode and a drain electrode of the fifth transistor.

18. The imaging device according to claim 17, wherein the other of the source electrode and the drain electrode of the first transistor is electrically connected to one electrode of a capacitor.

19. The imaging device according to claim 16, wherein the oxide semiconductor comprises In, Zn, and M, where M is Al, Ti, Ga, Sn, Y, Zr, La, Ce, Nd, or Hf.

20. The imaging device according to claim 16, wherein the photoelectric conversion element comprises selenium or a compound containing selenium in a photoelectric conversion layer.

21. An electronic device comprising:
the imaging device according to claim 16; and a display device.

22. The imaging device according to claim 16, wherein the active region is in a silicon substrate.

23. The imaging device according to claim 16,
wherein the first layer, the second layer, the third layer, and the fourth layer are provided on a chip, and
wherein the imaging device is configured to perform imaging without a lens provided outside of the chip.

* * * * *